United States Patent
Yoneda et al.

(10) Patent No.: US 10,200,573 B2
(45) Date of Patent: Feb. 5, 2019

(54) IMAGING DEVICE, OPERATION METHOD THEREOF, AND ELECTRONIC DEVICE

(71) Applicant: Semiconductor Energy Laboratory Co., Ltd., Atsugi-shi, Kanagawa-ken (JP)

(72) Inventors: Seiichi Yoneda, Kanagawa (JP); Shuhei Maeda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 39 days.

(21) Appl. No.: 15/173,893

(22) Filed: Jun. 6, 2016

(65) Prior Publication Data

US 2016/0356645 A1 Dec. 8, 2016

(30) Foreign Application Priority Data

Jun. 8, 2015 (JP) ................................ 2015-115604
May 20, 2016 (JP) ................................ 2016-101666

(51) Int. Cl.
*G01J 1/44* (2006.01)
*G01J 1/42* (2006.01)
(Continued)

(52) U.S. Cl.
CPC ........... *H04N 5/144* (2013.01); *H04N 5/3454* (2013.01); *H04N 5/374* (2013.01); *H01L 2224/48091* (2013.01); *H01L 2224/73265* (2013.01)

(58) Field of Classification Search
CPC ........ H04N 5/144; H04N 5/145; H04N 5/335; H04N 5/341; H04N 5/345; H04N 5/3452; H04N 5/3454; H04N 5/3456; H04N 5/3458; H04N 5/374; H04N 5/3742; H04N 5/376; H04N 5/378; G09G 2320/103; G09G 2340/16; G09G 3/3225; G09G 3/3648; G09G 2330/021; H01L 2224/48091; H01L 2224/73265
See application file for complete search history.

(56) References Cited

U.S. PATENT DOCUMENTS 8,502,724 B2 8/2013 Kurokawa
8,502,772 B2 8/2013 Kozuma et al.
(Continued)

FOREIGN PATENT DOCUMENTS

JP 2008-033066 A 2/2008

*Primary Examiner* — John Lee
(74) *Attorney, Agent, or Firm* — Fish & Richardson P.C.

(57) ABSTRACT

The imaging device includes a pixel array and first to seventh circuits. The first and second circuits select a pixel in the pixel array. The third circuit performs difference calculation between imaging data of the first frame and the second frame in the selected pixels. The fourth and the fifth circuits output addresses of the row and column of the pixels which has been subjected to the difference calculation. A row address and a column address for determining a specific region of the pixel array are stored in the sixth circuit. The seventh circuit compares coordinates included in the specific region with coordinates of pixels where a difference is detected. If the coordinates of the pixels where a difference is detected are included in the specific region which has been stored in the sixth circuit, imaging data is obtained again and is output to the external devices.

11 Claims, 60 Drawing Sheets

(51) Int. Cl.
  *H04N 5/14*   (2006.01)
  *H04N 5/345*  (2011.01)
  *H04N 5/374*  (2011.01)

(56) References Cited

U.S. PATENT DOCUMENTS

| | | |
|---|---|---|
| 8,605,059 B2 | 12/2013 | Kurokawa et al. |
| 8,610,696 B2 | 12/2013 | Kurokawa |
| 9,055,245 B2 | 6/2015 | Kozuma |
| 9,131,171 B2 | 9/2015 | Aoki et al. |
| 9,204,849 B2 | 12/2015 | Kurokawa et al. |
| 9,525,865 B2 * | 12/2016 | Sagar ................ H04N 5/23222 |
| 2002/0093473 A1 | 7/2002 | Tanaka et al. |
| 2003/0063078 A1 | 4/2003 | Hanari et al. |
| 2003/0098860 A1 | 5/2003 | Nakamura et al. |
| 2007/0247529 A1 * | 10/2007 | Toma ................... G06T 3/4053 |
| | | 348/222.1 |
| 2011/0090204 A1 | 4/2011 | Yamazaki et al. |
| 2011/0115839 A1 | 5/2011 | Takahashi et al. |
| 2012/0044223 A1 | 2/2012 | Tamura |
| 2015/0332568 A1 | 11/2015 | Kurokawa |
| 2015/0334321 A1 | 11/2015 | Kozuma |
| 2015/0380451 A1 | 12/2015 | Kurokawa |
| 2016/0021314 A1 | 1/2016 | Kurokawa et al. |
| 2016/0037106 A1 | 2/2016 | Ohmaru |
| 2016/0064443 A1 | 3/2016 | Inoue et al. |
| 2016/0064444 A1 | 3/2016 | Inoue et al. |
| 2016/0133660 A1 | 5/2016 | Inoue et al. |
| 2016/0134789 A1 | 5/2016 | Inoue et al. |
| 2016/0316159 A1 * | 10/2016 | Yoneda ................ H04N 5/3698 |
| 2016/0329024 A1 * | 11/2016 | Maeda ................. G09G 3/3648 |
| 2016/0356645 A1 * | 12/2016 | Yoneda ................... H04N 5/144 |
| 2016/0366360 A1 * | 12/2016 | Okamoto .......... H01L 27/14632 |

\* cited by examiner

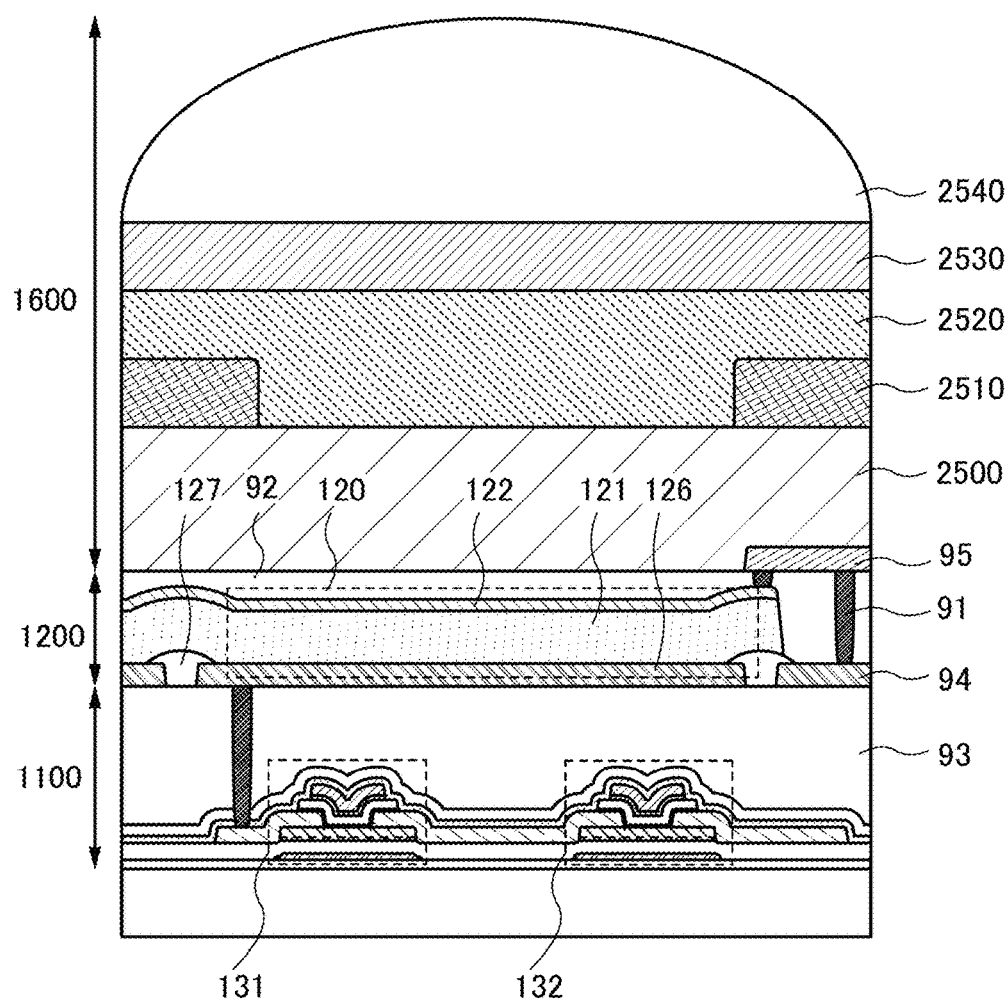

FIG. 34A1
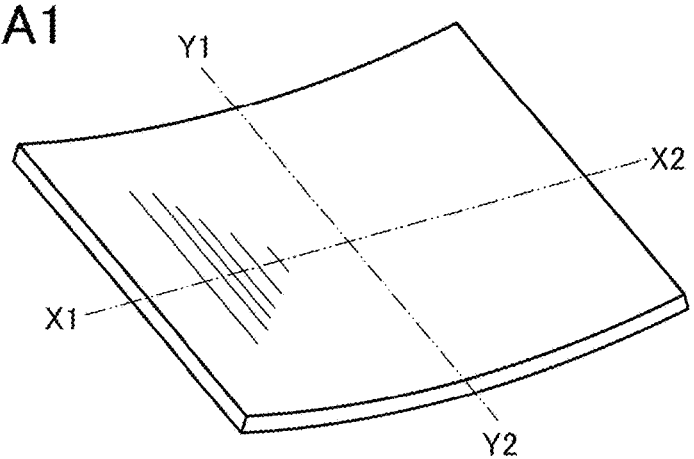
FIG. 34A2
FIG. 34A3
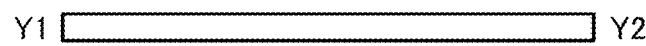
FIG. 34B1
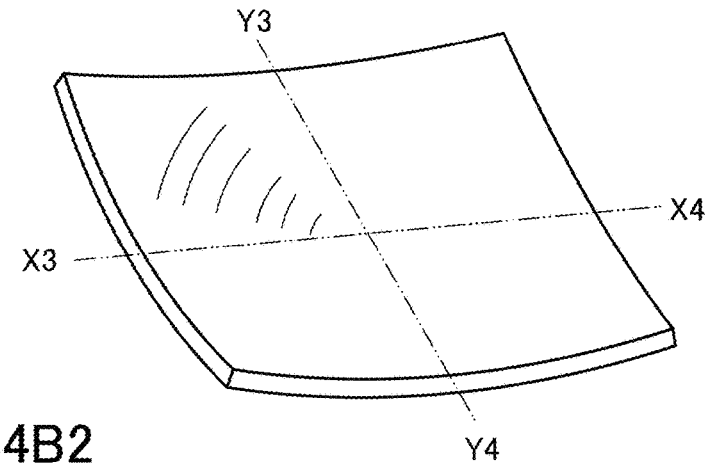
FIG. 34B2
FIG. 34B3

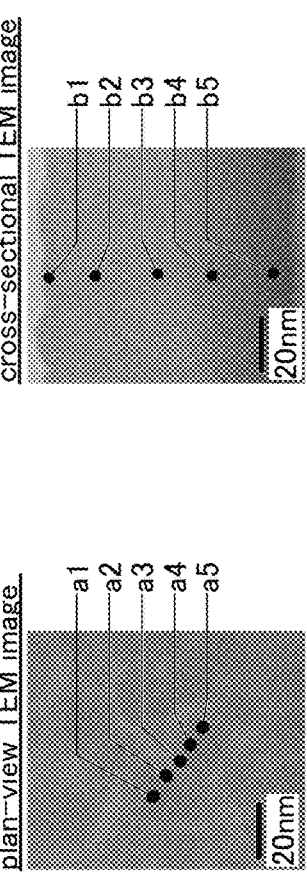
FIG. 59A plan-view TEM image
FIG. 59B cross-sectional TEM image
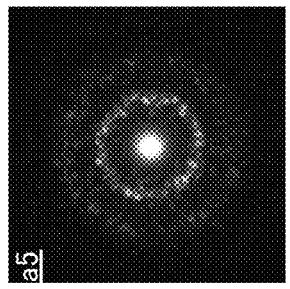
FIG. 59C
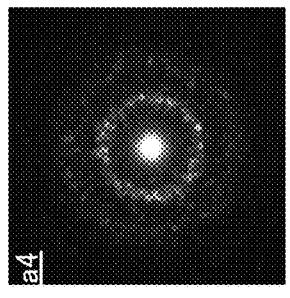
FIG. 59D
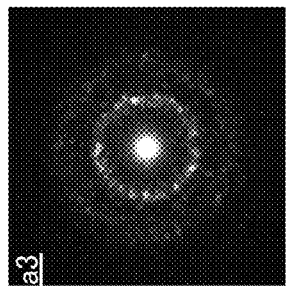
FIG. 59E
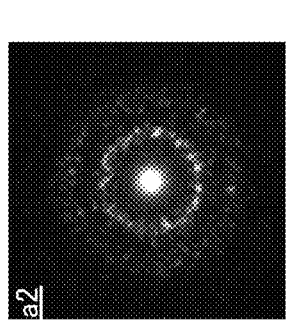
FIG. 59F
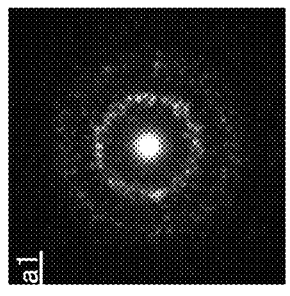
FIG. 59G
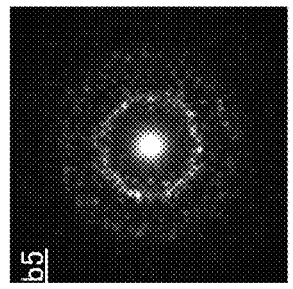
FIG. 59H
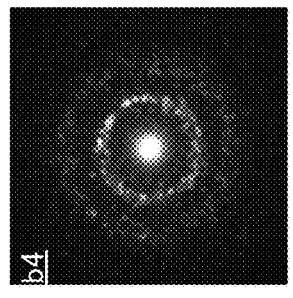
FIG. 59I
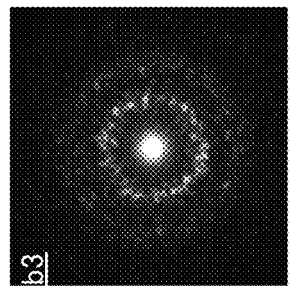
FIG. 59J
FIG. 59K
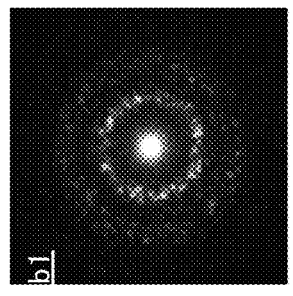
FIG. 59L

IMAGING DEVICE, OPERATION METHOD THEREOF, AND ELECTRONIC DEVICE

BACKGROUND OF THE INVENTION

1. Field of the Invention

One embodiment of the present invention relates to an imaging device, a driving method thereof, and an electronic device.

Note that one embodiment of the present invention should not limited to the technical field. The technical field of the invention disclosed in this specification and the like relates to an object, a method, or a manufacturing method. Another embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, an imaging device, a memory device, a method for driving any of them, and a method for manufacturing any of them.

2. Description of the Related Art

A display device in which a transistor with a small amount of leakage current is used in a pixel so as to reduce a frequency of rewriting image data has been proposed (e.g., Patent Document 1). The necessity of rewriting of image data is determined on the basis of the result of digital difference processing where image data of a difference detection frame and image data of a reference frame are compared. A reduction in power consumption of the display device is attempted by a reduction in frequency of rewriting image data.

REFERENCE

Patent Document

[Patent Document 1] United States Patent Application Publication No. 2011/0090204

SUMMARY OF THE INVENTION

In order to further reduce power consumption of the imaging device, a further reduction in the frequency of rewriting imaging data is necessary. As a result, the storage capacitance in storing the imaging data in a storage device can be saved.

An object of one embodiment of the present invention is to provide a novel imaging device, a driving method of the imaging device, a novel electronic device, or the like.

Another object of one embodiment of the present invention is to provide an imaging device or the like with a novel structure and low power consumption. Another object of one embodiment of the present invention is to provide an imaging device or the like with a novel structure which can determine the necessity of rewriting image data while image data that has been written to a pixel is saved. Another object of one embodiment of the present invention is to provide an imaging device or the like with a novel structure for saving the storage capacitance of a storage device where imaging data is stored.

Another object of one embodiment of the present invention is to provide an operation method or the like of a novel imaging device with low power consumption. Another object of one embodiment of the present invention is to provide an operation method or the like of a novel imaging device which can determine the necessity of rewriting image data while imaging data that has been written to a pixel is saved. Another object of one embodiment of the present invention is to provide an operation method or the like of a novel imaging device for saving the storage capacitance of a storage device where imaging data is stored.

Note that the objects of the present invention are not limited to these objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention solves at least one of the above objects and the other objects.

One embodiment of the present invention is an imaging device including pixels, a first circuit, a second circuit, a third circuit, a fourth circuit, a fifth circuit, a sixth circuit, and a seventh circuit. A pixel array includes the pixels arranged in matrix. The first circuit is configured to select a row of the pixel array. The second circuit is configured to select a column of the pixel array. The third circuit is configured to perform difference calculation between imaging data of a first frame and imaging data of a second frame in the pixels selected by the first circuit and the second circuit. The fourth circuit is configured to output a row address of the pixels subjected to the difference calculation. The fifth circuit is configured to output a column address of the pixels subjected to the difference calculation. The sixth circuit is configured to store the row address and the column address by which a region of the pixel array is determined. The seventh circuit is configured to compare coordinates included in the region which is specified by the row address and the column address stored in the sixth circuit with coordinates consisting of the row address and the column address of the pixels where a difference is detected.

The imaging device of one embodiment of the present invention may be configured to obtain imaging data of a third frame and output the imaging data to the external device, when the coordinates consisting of the row address and the column address of the pixels where a difference is detected are included in the region which is stored in the sixth circuit.

In the imaging device of one embodiment of the present invention, the sixth circuit may be configured to store two row addresses and two column addresses of the pixel array for determining four coordinates. The imaging device may be configured to obtain the imaging data of the third frame and output the imaging data to the external device, when the coordinates consisting of the row address and the column address of the pixels where a difference is detected are included in a quadrangle formed by linking the four coordinates stored in the sixth circuit.

The imaging device of one embodiment of the present invention may include a pixel, a transistor, and a photoelectric conversion element. Each of the transistors may include an oxide semiconductor in an active layer, and the oxide semiconductor preferably includes In, Zn, and M (M is Al, Ti, Ga, Sn, Y, Zr, La, Ce, Nd, or Hf).

The photoelectric conversion element may include a photoelectric conversion layer containing selenium or a compound containing selenium.

Another embodiment of the present invention is an operation method of an imaging device. A first step is for obtaining imaging data of a first frame. A second step is for outputting the imaging data of the first frame to an external device. A third step is for determining whether to return to the first step. If it is determined not to return to the first step, imaging data of a second frame is obtained and then the operation goes to a fourth step. The fourth step is for obtaining imaging data of a third frame and for performing difference calculation between the imaging data of the second frame and the imaging data of the third frame in each pixel, thereby obtaining a row address and a column address of a pixel subjected to the difference calculation. If no difference is detected, the fourth step is performed again, whereas if a difference is detected, the operation goes to a fifth step. A fifth step is for determining whether to output the imaging data to the external device: if it is determined to output the imaging data to the external device, the operation goes to a sixth step. A sixth step is for obtaining imaging data of a fourth frame. A seventh step is for outputting the imaging data of the fourth frame to the external device. After the seventh step, the operation returns to the fourth step.

In the operation method of an imaging device, which is one embodiment of the present invention, if no difference is detected in the difference calculation in the fourth step and/or if it is determined not to output the imaging data to the external device in the fifth step, the operation may return to the fourth step after the imaging data of the second frame is obtained.

In the operation method of an imaging device, a region of a pixel array where a plurality of pixels are arranged may be specified: if coordinates consisting of a row address and a column address of each pixel where a difference is detected are included in the region of the pixel array, the imaging data of the fourth frame is obtained in the sixth step and is output to the external device in the seventh step.

In the operation method of an imaging device, two row addresses and two column addresses of the pixel array are selected to determine four coordinates, and the inside of a quadrangle formed by linking the four coordinates may serve as the region of the pixel array.

Note that the external device may be a display device or a storage device.

Another embodiment of the present invention is an electronic device including the imaging device and a display device.

One embodiment of the present invention can provide a novel imaging device, an operation method of the novel imaging device, a novel electronic device, or the like.

One embodiment of the present invention provides an imaging device or the like with a novel structure and low power consumption. One embodiment of the present invention provides an imaging device or the like with a novel structure which determines the necessity of rewriting image data while image data that has been written to a pixel is saved. One embodiment of the present invention provides an imaging device or the like with a novel structure for saving the storage capacitance of a storage device where imaging data is stored.

One embodiment of the present invention provides an operation method or the like of a novel imaging device with low power consumption. One embodiment of the present invention provides an operation method or the like of a novel imaging device which determines the necessity of rewriting image data while imaging data that has been written to a pixel is saved. One embodiment of the present invention provides an operation method or the like of a novel imaging device for saving the storage capacitance of a storage device where imaging data is stored.

Note that the effects of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

FIG. 30 is a cross-sectional view illustrating a structure of an imaging device.

FIGS. 34A1 to 34A3 and 34B1 to 34B3 illustrate curved imaging device.

FIGS. 59A and 59B are TEM images of samples and FIGS. 59C to 59L are electron diffraction patterns thereof.

DETAILED DESCRIPTION OF THE INVENTION

Figure 1:
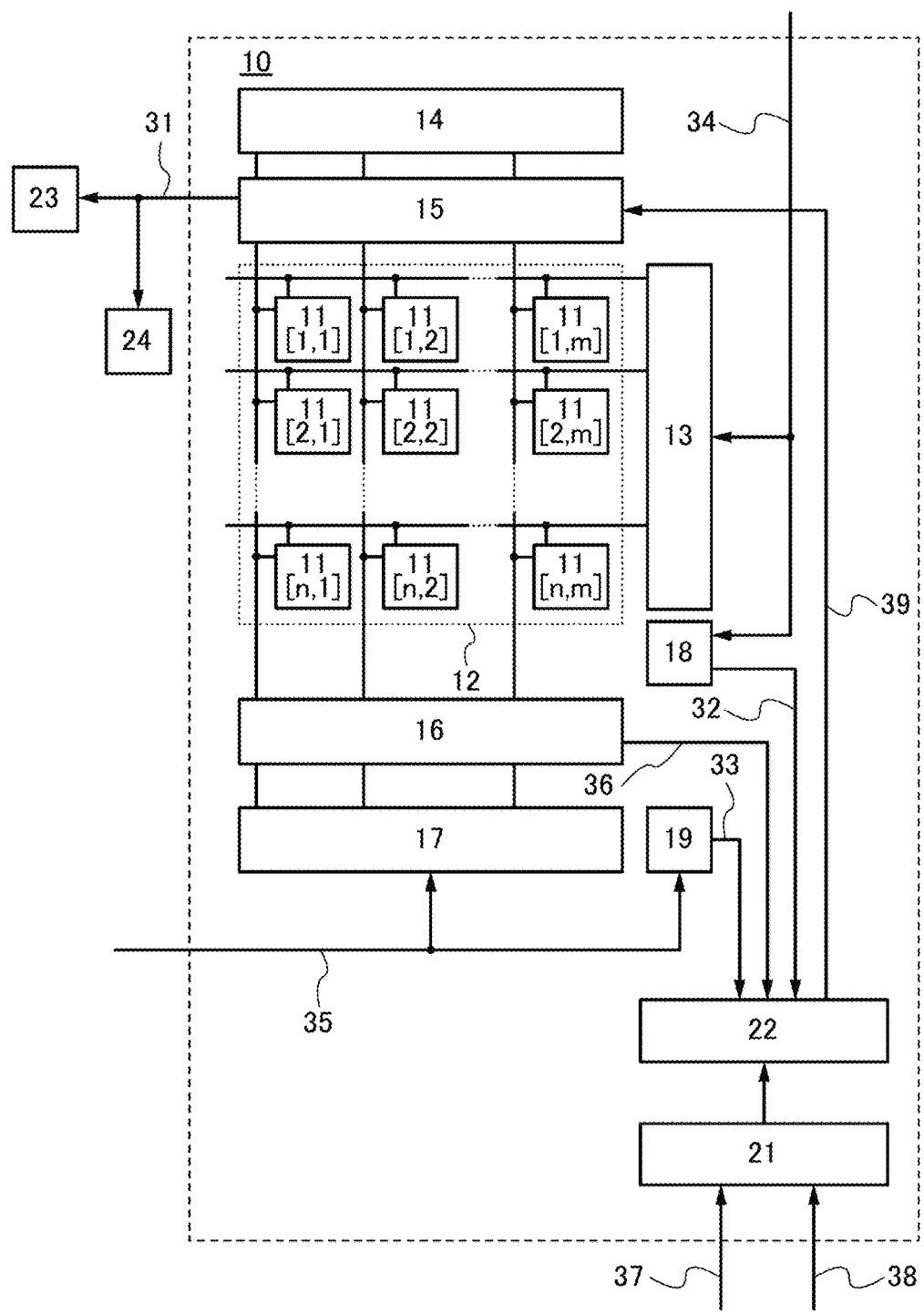
FIG. 1 is a block diagram illustrating an imaging device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of Embodiments below. Note that in structures of the present invention described below, the same portions or portions having similar functions are denoted by the same reference numerals in different drawings, and description thereof is not repeated in some cases. The same components are denoted by different hatching patterns in different drawings, or the hatching patterns are omitted in some cases.

In the drawings, the size, the layer thickness, or the region is exaggerated for clarity in some cases. Therefore, embodiments of the present invention are not limited to such a scale. Note that drawings are schematic views of ideal examples, and the embodiments of the present invention are not limited to the shape or the value illustrated in the drawings. For example, variation in signal, voltage, or current due to noise or a difference in timing can be included.

In this specification and the like, a transistor is an element having at least three terminals: a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region.

Here, since the source and the drain of the transistor may change depending on a structure, operating conditions, and the like of the transistor, it is difficult to define which is a source or a drain. In this specification and the like, the terms "source" and "drain" can be interchanged with each other depending on the case or circumstances.

Note that in this specification, ordinal numbers such as "first", "second", and "third" are used in order to avoid confusion among components, and thus do not limit the number of the components.

In this specification and the like, when it is explicitly described that X and Y are connected, the case where X and Y are electrically connected, the case where X and Y are functionally connected, and the case where X and Y are directly connected are included therein. Accordingly, another element may be provided between elements having a connection relation illustrated in drawings and texts, without limitation on a predetermined connection relation, for example, the connection relation illustrated in the drawings and the texts.

Here, each of X and Y denotes an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. When a signal output from X is transmitted to Y, it can be said that X and Y are functionally connected even if another circuit is provided between X and Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expression include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X through at least Z1 on a first connection path, the first connection path does not include a second connection path, the second connection path includes a connection path on which the transistor is provided, a drain (or a second terminal or the like) of the transistor is electrically connected to Y at least through Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive layer, and a layer).

Even when independent components are electrically connected to each other in a circuit diagram, one component has functions of a plurality of components in some cases. For example, when part of a wiring has a function as an electrode, one conductive layer functions as the wiring and the electrode. Thus, "electrical connection" in this specification includes in its category such a case where one conductive layer has functions of a plurality of components.

Note that in this specification, terms for describing arrangement, such as "over" and "under", are used for convenience for describing the positional relation between components with reference to drawings. Furthermore, the positional relation between components is changed as appropriate in accordance with a direction in which each component is described. Thus, there is no limitation on terms used in this specification, and description can be made appropriately depending on the situation.

Note that the layout of circuit blocks in a block diagram in a drawing specifies the positional relation for description.

Thus, even when a drawing shows that different functions are achieved in different circuit blocks, an actual circuit block may be configured so that the different functions are achieved in the same circuit block. The functions of circuit blocks in diagrams are specified for description, and even in the case where one circuit block is illustrated, blocks might be provided in an actual circuit block so that processing performed by one circuit block is performed by a plurality of circuit blocks.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

The structure of an imaging device which is one embodiment of the present invention is described with reference to drawings.

In this specification and the like, an imaging device refers to any device that has an imaging function, a circuit that has an imaging function, or the whole of a system that includes the circuit.

In this specification and the like, a display device refers to any device that has a display function. The display device includes a plurality of pixels, a circuit for driving the pixels, and the like. The display device also includes a control circuit, a power supply circuit, a signal generation circuit, and the like in some cases.

FIG. 1 is a block diagram illustrating the configuration of an imaging device which is one embodiment of the present invention. An imaging device 10 includes a pixel 11, a circuit 13, a circuit 14, a circuit 15, a circuit 16, a circuit 17, a circuit 18, a circuit 19, a circuit 21, and a circuit 22. A pixel array 12 includes the pixels 11 arranged in matrix consisting of n rows and m columns (n and m are natural numbers).

External devices, such as a display device 23 and a memory device 24, can be provided outside the imaging device 10. As the memory device 24, a non-volatile memory such as a hard disk, a magnetic disk, magneto-optical disk (MO disk), or a flash memory can be used.

The circuit 13 can serve as a row driver selecting a row of the pixel array 12. The circuit 14 can serve as a first column driver selecting a column of the pixel array 12. The circuit 15 can serve as an A/D converter circuit.

The circuit 16 can perform data processing on analog imaging data output from each pixel 11. The circuit 17 can serve as a second column driver for selecting a column of the pixels 11 subjected to the data processing by the circuit 16.

The circuit 18 can calculate a row address of the pixels 11 in the row selected by the circuit 13. The circuit 19 can calculate a column address of the pixels 11 in the column selected by the circuit 17. The circuit 21 can store a specified row address and column address by which a region of the pixel array 12 is determined. The circuit 22 can decide whether to output the imaging data to the external device based on the signal output from the circuit 16, the row address output from the circuit 18, the column address output from the circuit 19, and the row address and the column address which are stored in the circuit 21.

The region of the pixel array 12 means a group of coordinates of the pixels 11. The coordinate is a set of values indicating the row number and the column number of a pixel in the pixel array 12 and is specified by a row address and a column address. For example, a pixel 11[1,1] means a pixel 11 in the first row and the first column, and a pixel 11[$n,m$] means a pixel in the nth row and the mth column.

A variety of circuits, such as a decoder and a shift register, are used for the circuit 13, the circuit 14, and the circuit 17.

Figure 2:
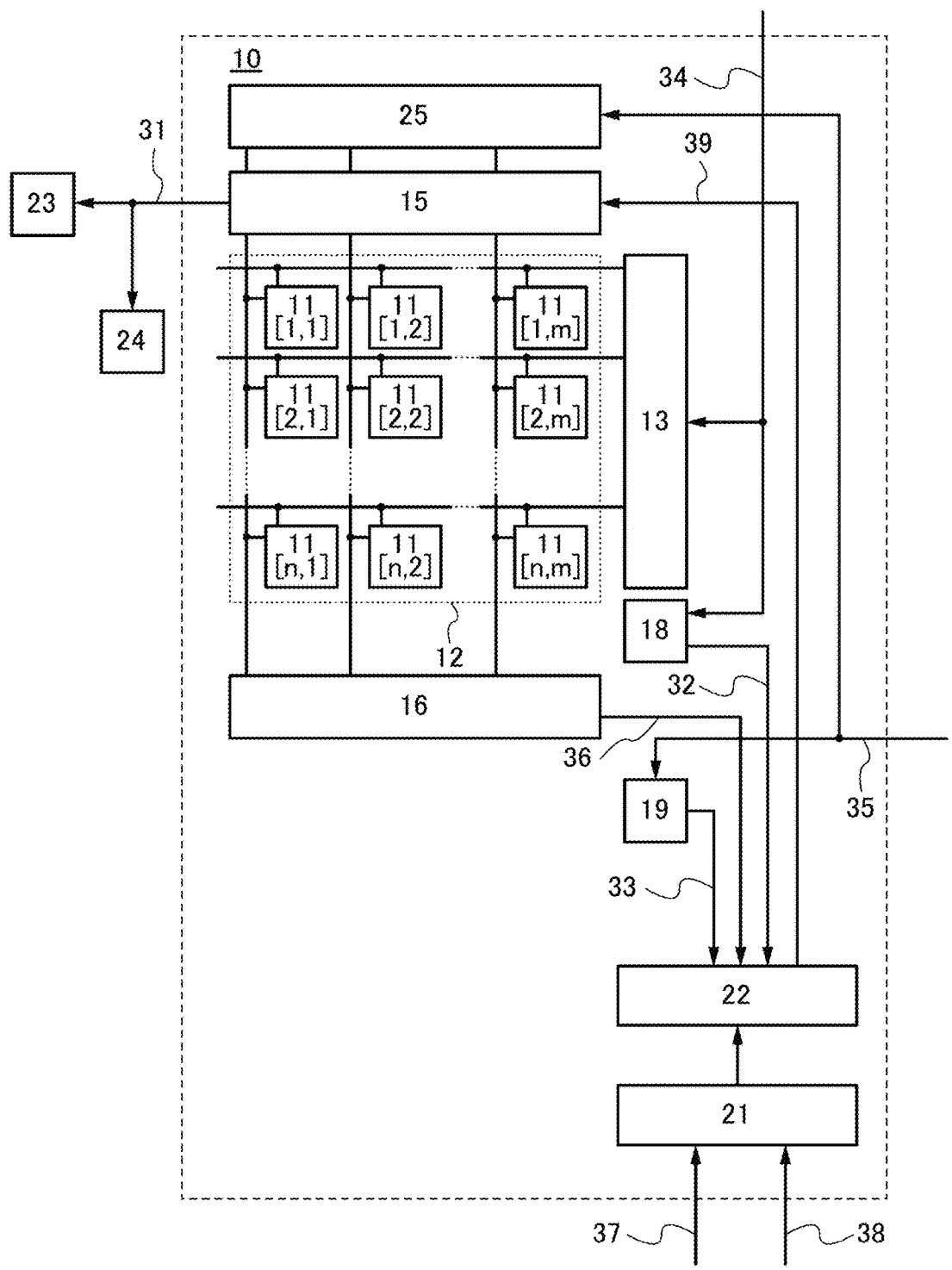
FIG. 2 is a block diagram illustrating an imaging device.

Note that the configuration of the circuit 14 and the configuration of the circuit 17 may be the same or different from each other. As shown in FIG. 2, the circuit 14 and the circuit 17 may be combined as a circuit 25.

Next, the operation of the imaging device 10 illustrated in FIG. 1 will be described using a flowchart of FIG. 3. Note that the imaging device 10 can be driven in a first mode or a second mode.

Figure 3:
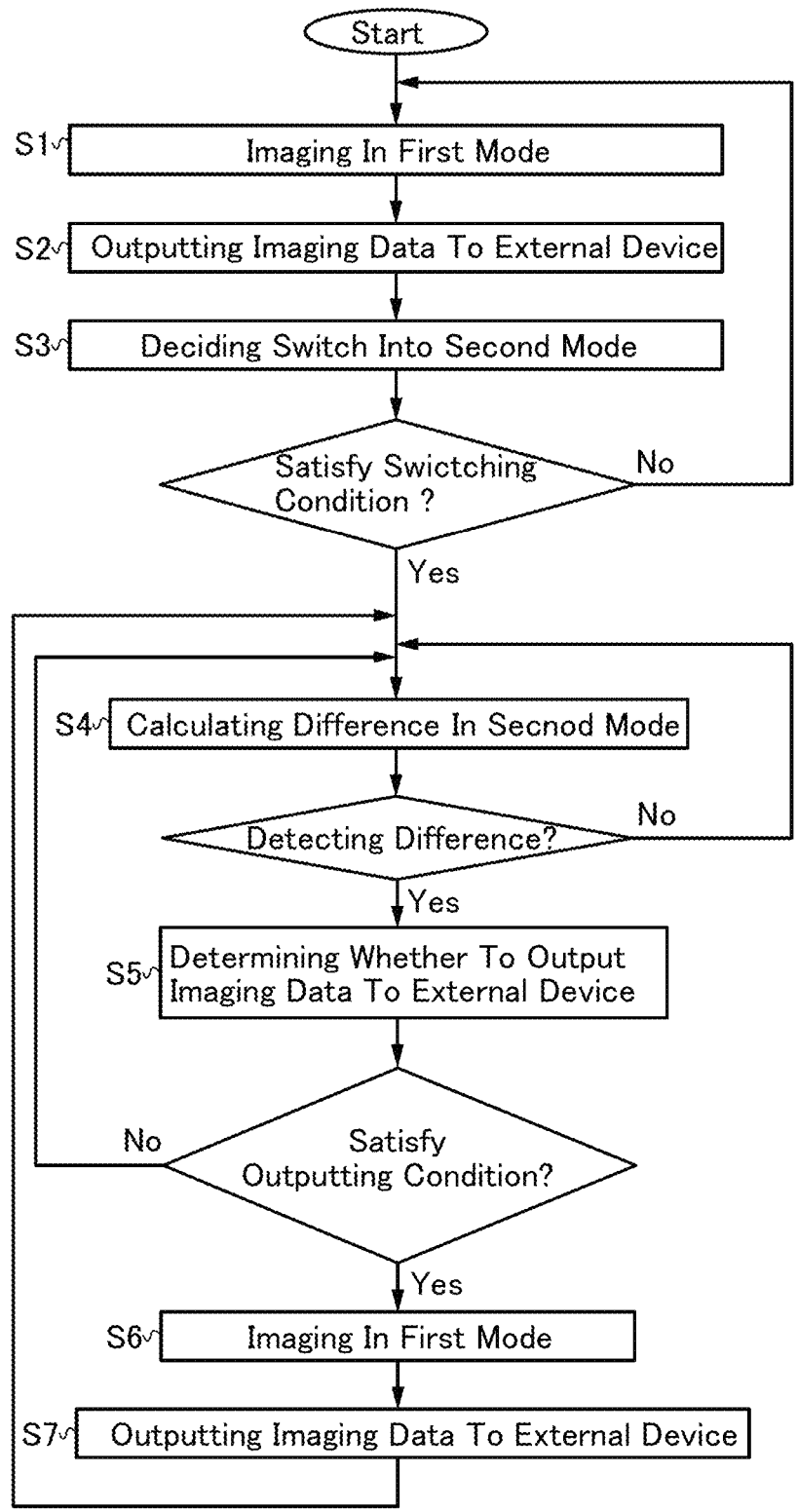
FIG. 3 is a flow chart of operation of an imaging device.

First of all, imaging is performed in the first mode (see S1 in FIG. 3). In the first mode, imaging data 31 is obtained from each of the pixels 11. The obtained imaging data 31 is converted into digital data by the circuit 15 and is output to the external device (see S2).

In other words, the first mode is an imaging mode for obtaining imaging data and outputting it to the external device.

The next step is for deciding whether to switch into the second mode (see S3). When predetermined switching conditions are not satisfied, S1 to S3 are performed again. Examples of the switching conditions include a lapse of predetermined time and input of a signal for switching into the second mode.

When the predetermined switching conditions are satisfied, the second mode is established to obtain imaging data of a reference frame and obtain imaging data of a difference detection frame. In the second mode, the pixels 11 are selected as follows: while the circuit 13 selects a row of the pixel array 12, the circuit 17 selects a column of the pixel array 12. Next, the selected pixel 11 obtains the imaging data of the reference frame and outputs it to the circuit 16, and then, obtains the imaging data of the difference detection frame and outputs it to the circuit 16. Then, difference calculation is performed between the imaging data of the reference frame and the imaging data of the difference detection frame (see S4). The circuit 16 generates a signal 36. When a difference is detected, the signal 36 is made active; whereas when a difference is not detected, the signal 36 is made in active. Note that difference data showing the result of the difference calculation can be stored in the pixel 11.

In other words, the second mode is a mode for detecting a difference between imaging data of a reference frame and imaging data of a difference detection frame.

The description that the signal 36 is made active means, for example, a signal "H" (also referred to as "a signal at a high potential") is output. The description that the signal 36 is made inactive means, for example, a signal "L" (also referred to as "a signal at a low potential") is output. The logic of the signal 36 may be inverted.

Note that in this specification, "L" can be a ground potential, for example.

The difference calculation in the circuit 16 can be performed in the following manner: the presence of a difference is determined by a difference between a current value resulting from imaging data of the reference frame that is output from each of the pixels 11 and a current value resulting from imaging data of the difference detection frame, and it is determined that a difference is present if there is a difference between the current values while it is determined that no difference is present if there is no difference between the current values. The specific configuration and operation of the circuit 16 which can employ that method is described later.

The row address 32 and the column address 33 of the coordinate of the pixel 11 which has been subjected to the difference calculation are calculated by the circuit 18 and the circuit 19, respectively. Then, the row address 32 and the column address 33 are output as address signals to the circuit 22. Note that the row selection of the pixel array 12 by the circuit 13 can be synchronized with the calculation of the row address 32 by the circuit 18 by supplying a clock signal 34 to the circuit 13 and the circuit 18. The row selection of the pixel array 12 by the circuit 17 can be synchronized with the calculation of the column address 33 by the circuit 19 by supplying a clock signal 35 to the circuit 17 and the circuit 19.

In one embodiment of the present invention, the calculation of the row address 32 by the circuit 18 and the calculation of the column address 33 by the circuit 19 are performed in all the pixels 11 performing calculations regardless of the presence of a difference. Note that in one embodiment of the present invention, calculations of the row address 32 and the column address 33 may be performed only in the pixel 11 where a difference is detected.

In the case where no difference is detected and the signal 36 is made inactive, S4 is carried out: the imaging data of the difference detection frame is obtained again and the difference calculation is performed between the reference frame and the difference detection frame.

In the second mode, difference calculation is performed as follows, for example: a pixel 11 in the first row and the first column is selected and subjected to difference calculation, a pixel 11 in the first row and the second column is selected and subjected to difference calculation, and finally, a pixel 11 in the first row and the mth column is selected and subjected to difference calculation. The same applies to the pixels 11 in remaining rows: the pixels 11 in the first column to the mth column are sequentially subjected to difference calculation. When difference calculation in the pixel 11 in the nth row and the mth column is done, difference calculation is sequentially performed again from the pixel 11 in the first row and the first column to the pixel 11 in the nth row and the mth column. When a difference between imaging data of the reference frame and imaging data of the difference detection frame is detected in any one of the pixels 11, the signal 36 is made active.

Note that the imaging data of the reference frame can be stored in the circuit 16; thus, the imaging data of the reference frame is not necessarily obtained in the case where no difference is detected by the difference calculation and the operation in the second mode is performed again. When the imaging data of the reference frame is obtained, the difference calculation can be performed at high accuracy even if the stored imaging data changes over time. In contrast, when the step of obtaining imaging data of the reference frame is omitted, power consumption can be reduced and the operation speed can be increased.

When a difference is detected and the signal 36 is made active, the circuit 22 determines whether to output the imaging data to the external device (see S5). Details of an operation example in S5 will be described.

Before the imaging device 10 is operated, a row address 37 and a column address 38 by which a region 41 in the pixel array 12 (see FIG. 4) is determined are stored in the circuit 21. Note that the row address 37 and the column address 38 may be stored in the circuit 21 during operation of the imaging device 10.

When a difference between the imaging data of the reference frame and the imaging data of the difference detection frame is detected in the region 41, another imaging data is obtained in the first mode and is output to the external device. Note that the region may be determined by a plurality of row addresses 37 and a plurality of column addresses 38. For example, the region 41 can be determined as a region surrounded by a line linking coordinates specified by the addresses. Alternatively, the region 41 may be determined on a straight line or a line segment formed by linking coordinates specified by the addresses. Alternatively, the region 41 may be determined by coordinates specified by the addresses.

When a difference is detected in S4 and the signal 36 is made active, the circuit 22 compares coordinates included in the region 41 and the coordinate 42 including the row address 32 and the column address 33 of the pixel 11 where a difference is detected (i.e., the pixel 11 subjected to the difference calculation by the circuit 16 immediately before the signal 36 is made active). Note that the region 41 and the coordinate 42 are not shown in FIG. 1. Then, the circuit 22 generates a signal 39. When the coordinate 42 is included in the region 41, the signal 39 is made active in response to a decision that the conditions for outputting imaging data to the external device are not satisfied. When the coordinate 42 is not included in the region 41, the signal 39 is made inactive in response to a decision that the conditions for outputting imaging data to the external device are not satisfied.

The description that the coordinate 42 is included in the region 41 means that the coordinate 42 corresponds to any one of the coordinates of the region 41. The description that the coordinate 42 is not included in the region 41 means that the coordinate 42 does not correspond to any of the coordinates of the region 41.

Like the signal 36, when the signal 39 is made active, a signal "H" is output, for example; when the signal 39 is made inactive, a signal "L" is output, for example. The logic of the signal 39 may be inverted.

Note that the imaging device 10 does not necessarily include the circuit 21, in which case the row address 37 and the column address 38 are supplied directly to the circuit 22.

Next, a specific example of the decision whether to output imaging data to the external device is described with reference to FIG. 4.

In the pixel array 12, the coordinate of the pixel 11 on the upper left is [1,1] and that on the lower right is [n,m]. The row addresses 37 "xmin" and "xmax" and the column addresses 38 "ymin" and "ymax" are stored in the circuit 21, where $1 \leq xmin \leq xmax \leq n$ (xmin is greater than or equal to 1 and smaller than or equal to xmax, and xmax is greater than or equal to xmin and smaller than or equal to n) and $1 \leq ymin \leq ymax \leq m$ (ymin is greater than or equal to 1 and smaller than or equal to ymax, and ymax is greater than or equal to ymin and smaller than or equal to m). Note that xmin, xmax, ymin, and ymax are natural numbers.

Figure 4:
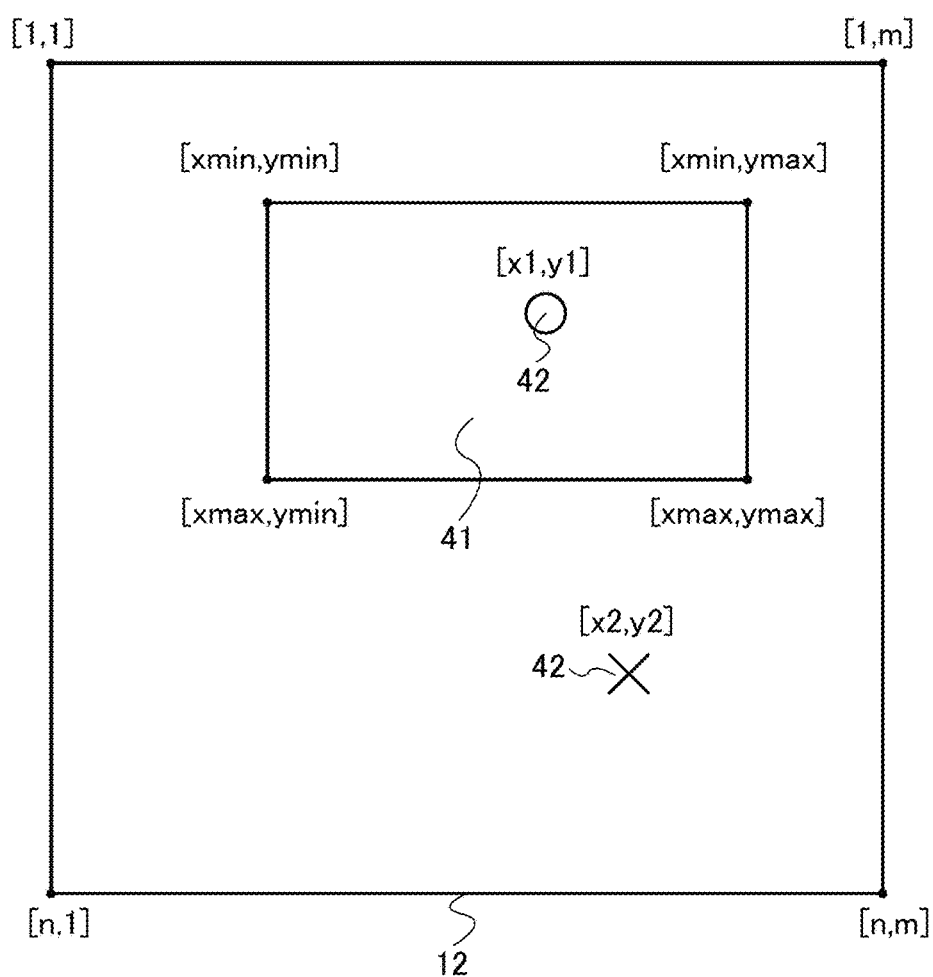
FIG. 4 illustrates determination whether to output imaging data to an output device.

In that case, the region 41 is the inside of a quadrangle formed by linking four coordinates [xmin, ymin], [xmin, ymax], [xmax, ymin], and [xmax, ymax] as shown in FIG. 4, for example. When the coordinate 42 is [x1, y1] (x1 is a natural number greater than or equal to xmin and smaller than or equal to xmax, and y1 is a natural number greater than or equal to ymin and smaller than or equal to ymax), the coordinate 42 is included in the region 41, and the signal 39 is made active. For example, when the coordinate 42 is [x2, y2] (x2 is a natural number greater than or equal to xmax and smaller than or equal to n, and y2 is a natural number greater than or equal to ymin and smaller than or equal to ymax), the coordinate 42 is not included in the region 41, and the signal 39 can be made inactive. For example, when the coordinate 42 is [x,y] (x and y are natural numbers) and any one of the followings are satisfied: x is smaller than or equal to xmin, x is greater than or equal to xmax, y is smaller than or equal to ymin, and y is greater than or equal to ymax, the coordinate 42 is not included in the region 41, and the signal 39 can be made inactive.

Note that the region 41 can be outside the quadrangle formed by linking the four coordinates [xmin, ymin], [xmin, ymax], [xmax, ymin], and [xmax, ymax]. In that case, when the coordinate 42 is [x2, y2] or [x,y], the coordinate 42 is included in the region 41, and the signal 39 is made active; when the coordinate 42 is [x1, y1], the coordinate 42 is not included in the region 41, and the signal 39 can be made inactive.

Although the region 41 in FIG. 4 is a quadrangle, the region 41 can be any shape. For example, three row addresses 37 and three column addresses 38 for specifying three coordinates are stored in the circuit 21 and the three coordinates are linked by a straight line to form a triangle. The inside or outside of the triangle can serve as the region 41. Alternatively, the inside or outside of a circle specified by the row address 37 and the column address 38 can serve as the region 41. Alternatively, the inside or outside of a polygon specified by the row address 37 and the column address 38 can serve as the region 41.

Note that coordinates on the boundary between the inside and the outside of the region 41 can be included in either the inside or the outside of the region 41.

The region 41 is regarded as a plane in the description so far; however, the region 41 can be regarded as a line or a point. In the case where the region 41 is a line, the circuit 21 stores two row addresses 37 and two column addresses 38 to specify two coordinates, and the two coordinates are linked by a straight line or a line segment. When the coordinate 42 lies on the straight line or the line segment, the signal 39 can be made active; whereas when the coordinate 42 does not lie on the straight line or the line segment, the signal 39 can be made inactive. In another case, when the coordinate 42 does not lie on the straight line or the line segment, the signal 39 can be made active; whereas when the coordinate 42 lies on the straight line or the line segment, the signal 39 can be made inactive.

In the case where the region 41 is point(s), the circuit 21 stores one or more row addresses 37 and one or more column addresses 38 to specify one or more coordinates. When the coordinate 42 is the same as the specified coordinate (i.e., the region 41), the signal 39 can be made active; whereas when the coordinate 42 is different from the specified coordinate, the signal 39 can be made inactive. In another case, when the coordinate 42 is different from the coordinate (i.e., the region 41) of the row address 37 and the column address 38, which are specified by the circuit 21, the signal 39 can be made active; whereas when the coordinate 42 is the same as the specified coordinate (i.e., the region 41), the signal 39 can be made inactive.

In another case, the circuit 21 stores one or more row addresses 37 and/or column addresses 38. When the coordinate 42 includes one or both of the row address 37 and the column address 38, the signal 39 can be made active; whereas when the coordinate 42 includes neither the row address 37 nor the column address 38, the signal 39 can be made inactive. In another case, the circuit 21 stores one or more row addresses 37 and/or column addresses 38. When the coordinate 42 includes neither the row address 37 nor the column address 38, the signal 39 can be made active; whereas when the coordinate 42 includes one or both of the row address 37 and the column address 38, the signal 39 can be made inactive.

All of the row addresses and the column addresses stored in the circuit 21 may be used for specifying the region 41, or some of them may be used. In the case where some of them are used for specifying the region 41, for example, a signal is supplied to the circuit 21 for selecting the row address 37 and/or the column address 38 used for specifying the region 41 from the row addresses and the column addresses stored in the circuit 21.

The above-described methods for specifying the region 41 can be combined as appropriate.

When the signal 39 is made inactive in S5, the operation returns to S4: imaging data of the reference frame and imaging data of the difference detection frame are obtained in the second mode, and difference calculation is performed using the obtained imaging data. Note that as described above, in the case where the circuit 16 or the like stores imaging data of the reference frame, the step of obtaining the imaging data of the reference frame can be omitted.

When the signal 39 is made active, the imaging data 31 is obtained in the first mode as in S1 (see S6). Then, the imaging data 31 is output to the external device as in S2 (see S7).

After S7 is finished, the operation returns to S4 and is switched into the second mode: imaging data of the difference detection frame is obtained again and the difference calculation is performed between the reference frame and the difference detection frame. Note that decision whether to return to S4 for the operation in the second mode or to return to S6 and continue imaging in the first mode may be performed after S7. In addition, decision whether to return to S1 may be performed. As in S3, examples of the decision conditions include a lapse of predetermined time and an input of a signal for switching into the second mode. That is all for the operation of the imaging device which is one embodiment of the present invention.

As described above, the imaging device 10 in the second mode shown in FIG. 1 does not carry out high power-consuming processing, such as A/D conversion. In addition, only processing needed is one for generating the signal 36 that has a function of transmitting whether or not a difference is detected to circuits. Thus, power consumption can be lower than that in a structure for detecting a difference between the reference frame and the difference detection frame with carrying out A/D conversion or the like.

Even when a difference is detected in the second mode, decision whether to output imaging data to the external device is performed. If the output conditions are satisfied, the imaging data 31 is captured in the first mode and output to the external devices. Such a structure can reduce the frequency of outputting the imaging data 31 as compared to the case where a difference is detected and the imaging data 31 is unconditionally imaged and output to the external devices. When the display device 23 is connected to the imaging device 10 as the external device, the frequency of rewriting imaging data in the display device 23 can be reduced. In a period during which imaging data is not rewritten, the display device 23 with, especially, a structure shown in Embodiment 6 can deactivate a circuit included in the display device 23 and can reduce power consumption. When the memory device 24 is connected to the imaging device 10 as the external device, the amount of stored data can be reduced and accordingly the storage capacitance of the memory device 24 can be saved. This allows imaging for a longer time and makes it easier to find required data from stored data.

This embodiment can be implemented in an appropriate combination with any of the structures described in the other embodiments.

Embodiment 2

In this embodiment, an example of the pixel 11 included in the imaging device 10 and operation examples of the pixel 11 will be described with reference to drawings.

Figure 5:
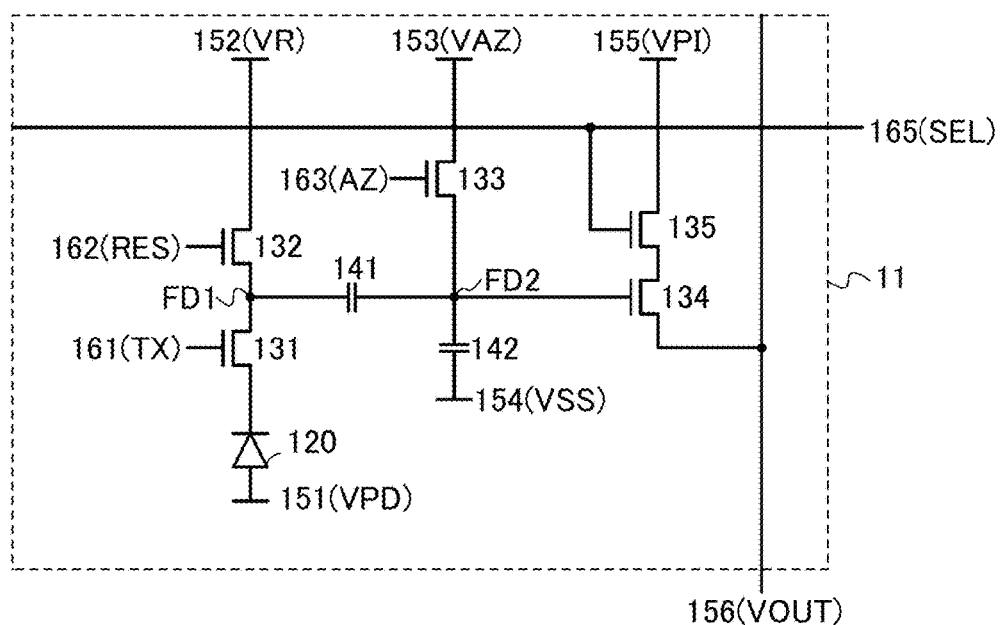
FIG. 5 illustrates a pixel circuit of an imaging device.

FIG. 5 is a circuit diagram of the pixel 11. The pixel 11 includes a photoelectric conversion element 120, a transistor 131, a transistor 132, a transistor 133, a transistor 134, a transistor 135, a capacitor 141, and a capacitor 142. In FIG. 5, the transistors 131 to 135 are all n-channel transistors.

In the pixel 11 in FIG. 5, one terminal of the photoelectric conversion element 120 is electrically connected to one of a source and a drain of the transistor 131. The other of the source and the drain of the transistor 131 is electrically connected to one of a source and a drain of the transistor 132 and one terminal of the capacitor 141. One of a source and a drain of the transistor 133 is electrically connected to the other terminal of the capacitor 141, one terminal of the capacitor 142, and a gate of the transistor 134. One of a source and a drain of the transistor 134 is electrically connected to one of a source and a drain of the transistor 135.

The other terminal of the photoelectric conversion element 120 is electrically connected to a wiring 151 (VPD). The other of the source and the drain of the transistor 132 is electrically connected to a wiring 152 (VR). The other of the source and the drain of the transistor 133 is electrically connected to a wiring 153 (VAZ). The other terminal of the capacitor 142 is electrically connected to a wiring 154 (VSS). The other terminal of the transistor 135 is electrically connected to a wiring 155 (VPI). The other of the source and the drain of the transistor 134 is electrically connected to a wiring 156 (VOUT). A gate of the transistor 131 is electrically connected to a wiring 161 (TX). A gate of the transistor 132 is electrically connected to a wiring 162 (RES). A gate of the transistor 133 is electrically connected to the wiring 163 (AZ). A gate of the transistor 135 is electrically connected to a wiring 165 (SEL).

The wirings 151 (VPD), 152 (VR), 153 (VAZ), 154 (VSS), and 155 (VPI) can function as power lines. The wirings 161 (TX), 162 (RES), 163 (AZ), and 165 (SEL) can function as signal lines.

In the above configuration, a node to which the other of the source and the drain of the transistor 131, the one of the source and the drain of the transistor 132, and the one terminal of the capacitor 141 are connected is a node FD1. A node to which the one of the source and the drain of the transistor 133, the gate of the transistor 134, the other terminal of the capacitor 141, and the one terminal of the capacitor 142 are connected is a node FD2.

In the pixel 11, the photoelectric conversion element 120 is a light-receiving element that can have a function of generating current based on light incident on the pixel 11. The transistor 131 can have a function of controlling accumulation/release of charge from the photoelectric conversion element 120 into the node FD1. The transistor 132 can have a function of resetting the potential of the node FD1. The transistor 133 can have a function of resetting the potential of the node FD2. The transistor 134 can function as an amplifier transistor that outputs a signal based on the potential of the node FD2. The transistor 135 can function as a selection transistor that controls selection of the pixel 11 in reading. The wiring 156 (VOUT) can have a function of outputting imaging data captured by the pixel 11 as a signal.

Figure 6:
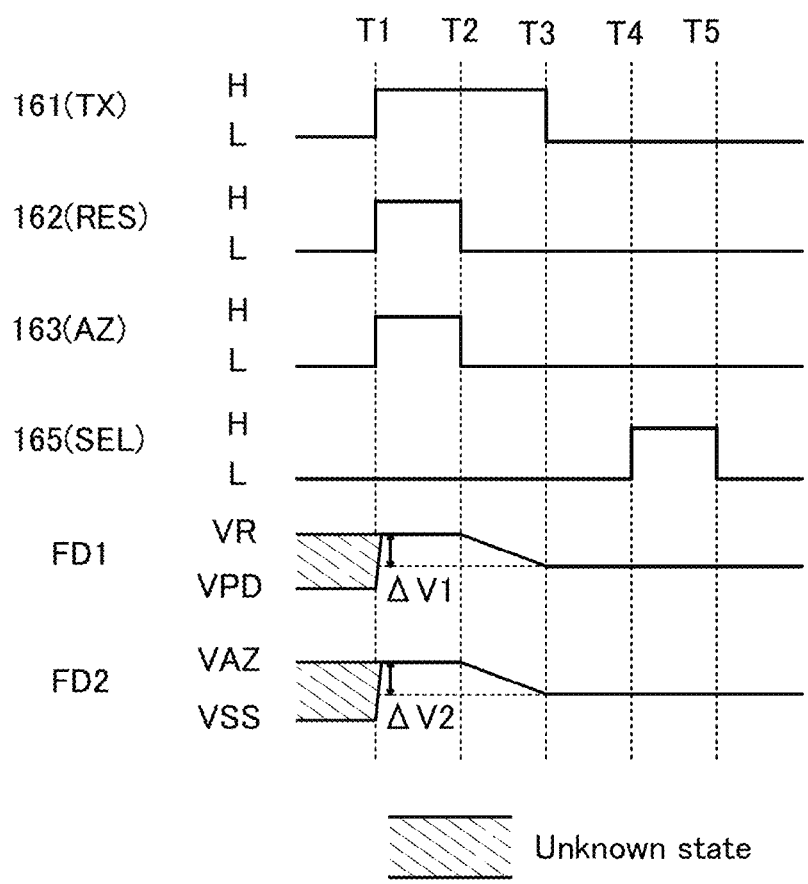
FIG. 6 is a timing chart illustrating imaging operation.

The operation of the pixel 11 in the first imaging mode is described in detail with reference to a timing chart illustrated in FIG. 6. The timing chart illustrated in FIG. 6 shows the potentials of the wirings 161 (TX), 162 (RES), 163 (AZ), and 165 (SEL) and the nodes FD1 and FD2. Note that each transistor is turned on/off when a potential for turning on/off the transistor is supplied to a wiring electrically connected to a gate of the transistor.

The wiring 151 (VPD) is set to "L," the wiring 152 (VR) is set to "H," the wiring 153 (VAZ) is set to "H," the wiring 154 (VSS) is set to "L," and the wiring 155 (VPI) is set to "H." Note that the wirings can be supplied with a different potential for operation.

The wiring 161 (TX), the wiring 162 (RES), and the wiring 163 (AZ) are set to "H" at Time T1, whereby the transistor 131, the transistor 132, and the transistor 133 are turned on. In addition, the wiring 165 (SEL) is set to "L," whereby the transistor 135 is turned off. Accordingly, the potential of the node FD1 is set to a potential "VR" of the wiring 152 (VR), and the potential of the node FD2 is set to a potential "VAZ" of the wiring 153 (VAZ).

The wiring 162 (RES) and the wiring 163 (AZ) are set to "L" at Time T2, whereby the transistor 132 and the transistor 133 are turned off. Accordingly, the potential of the node FD1 is decreased.

When a potential decrease at the node FD1 is represented by "$\Delta V1$," the potential of the node FD1 is "VR$-\Delta V1$." The potential of the node FD2 is also decreased because of capacitive coupling between the capacitor 141 (capacitance "C1") and the combined capacitance of the capacitor 142 (capacitance "C2") and the gate capacitance (capacitance "Cg") of the transistor 134. When a potential decrease at the node FD2 is represented by "$\Delta V2$," "$\Delta V2 = \Delta V1 \cdot C1/(C1+C2+Cg) = \Delta V1 \cdot \alpha$" is satisfied, and the potential of the node FD2 is "VAZ$-\Delta V2$." Note that $\alpha$ is "$C1/(C1+C2+Cg)$."

To make "$\Delta V1$" and "$\Delta V2$" equal as much as possible, the capacitance of the capacitor 141 is preferably larger than the sum of the capacitance of the capacitor 142 and the gate capacitance of the transistor 134.

The higher the illuminance of light irradiating the photoelectric conversion element 120 is, the larger the potential decrease at the node FD1 and the potential decrease at the node FD2 are.

The wiring 161 (TX) is set to "L" at Time T3, whereby the transistor 131 is turned off. Accordingly, the potentials of the nodes FD1 and FD2 are retained.

The wiring 165 (SEL) is set to "H" at Time T4, whereby the transistor 135 is turned on. Thus, a signal that corresponds to imaging data is outputted to the wiring 156 (VOUT) in accordance with the potential of the node FD2. Note that the lower the potential of the node FD2 is, the lower the potential of the signal outputted from the wiring 156 (VOUT) is. That is, the higher the illuminance of light irradiating the photoelectric conversion element 120 is, the lower the potential of the wiring 156 (VOUT).

The wiring 165 (SEL) is set to "L" at Time T5, whereby the transistor 135 is turned off. The above is an operation example of the pixel 11 in the first mode.

Figure 7:
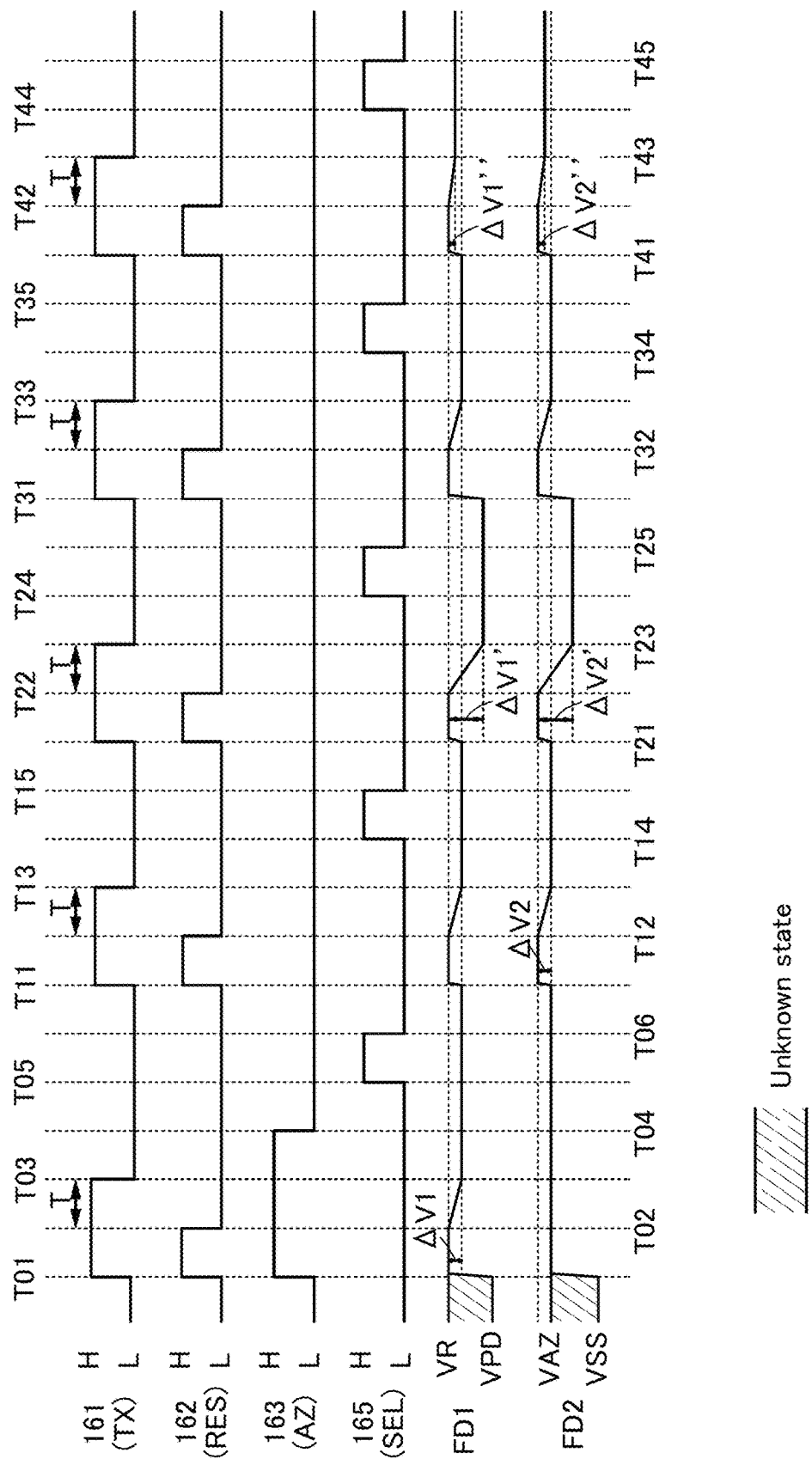
FIG. 7 is a timing chart illustrating imaging operation.

Next, an operation in the second mode will be described with reference to FIG. 7.

A period between Time T01 and Time T06 corresponds to a period during which the imaging data of the reference frame is captured and outputted. The wiring 161 (TX), the wiring 162 (RES), and the wiring 163 (AZ) are set to "H" at Time T01, whereby the transistor 131, the transistor 132, and the transistor 133 are turned on. In addition, the wiring 165 (SEL) is set to "L," whereby the transistor 135 is turned off. Accordingly, the potential of the node FD1 is reset to a potential "VR" of the wiring 152 (VR), and the potential of the node FD2 is reset to a potential "VAZ" of the wiring 153 (VAZ).

The wiring 162 (RES) is set to "L" at Time T02, whereby the transistor 132 is turned off. Accordingly, the potential of the node FD1 is decreased. The wiring 161 (TX) is set to "L" at Time T03, whereby the transistor 131 is turned off. Accordingly, the potential of the node FD1 is retained. Note that the interval between Time T02 and Time T03 is represented by T.

When a potential decrease at the node FD1 from Time T02 to Time T03 is represented by "$\Delta V1$," the potential of the node FD1 is "VR−$\Delta V1$." The higher the illuminance of light irradiating the photoelectric conversion element 120 is, the larger the potential decrease at the node FD1. Note that the potential of the node FD2 does not change.

Then, the wiring 163 (AZ) is set to "L" at Time T04, whereby the transistor 133 is turned off. Accordingly, the imaging data of the reference frame is captured.

The wiring 165 (SEL) is set to "H" at Time T05, whereby the transistor 135 is turned on. Thus, a signal that corresponds to imaging data is outputted to the wiring 156 (VOUT) in accordance with the potential of the node FD2.

The wiring 165 (SEL) is set to "L" at Time T06, whereby the transistor 135 is turned off. The above is the capturing and outputting operations of image data of the reference frame.

A period between Time T11 and Time T15 corresponds to a period during which the imaging data of the difference detection frame is captured and outputted in order to capture differential data in the case where there is no difference between the imaging data of the reference frame and the imaging data of the difference detection frame. The case where there is no difference corresponds to the case where the illuminance of light irradiating the photoelectric conversion element 120 is the same in a period between Time T12 and Time T13 described later and in a period between Time T02 and Time T03.

The wiring 161 (TX) and the wiring 162 (RES) are set to "H" at Time T11, whereby the transistor 131 and the transistor 132 are turned on. Accordingly, the potential of the node FD1 changes from "VR−$\Delta V1$" to "VR." In other words, the potential is increased by "$\Delta V1$," which is the potential decrease from Time T02 to Time T03. The potential of the node FD2 is also increased. When the potential increase at the node FD2 is represented by "$\Delta V2$," "$\Delta V2 = \Delta V1 \cdot \alpha$" is satisfied. The potential of the node FD2 changes from "VAZ" to "VAZ+$\Delta V2$."

The wiring 162 (RES) is set to "L" at Time T12, whereby the transistor 132 is turned off. Accordingly, the potential of the node FD1 is decreased, and the potential of the node FD2 is also decreased.

The wiring 161 (TX) is set to "L" at Time T13, whereby the transistor 131 is turned off. Accordingly, the potentials of the nodes FD1 and FD2 are retained.

When the interval between Time T12 and Time T13 is assumed to be T, the potential decrease at the node FD1 is equal to the potential decrease "$\Delta V1$" from Time T02 to Time T03 because the photoelectric conversion element 120 is irradiated with light with the same illuminance as that from Time T02 to Time T03. That is, the potential decrease at the node FD1 from Time T12 to Time T13 is equal to the potential increase at the node FD1 at Time T11. The potential decrease at the node FD2 is equal to the potential increase "$\Delta V2$" at Time T11. Thus, the potential of the node FD2 becomes "VAZ," which is equal to the potential of the wiring 153 (VAZ).

The wiring 165 (SEL) is set to "H" at Time T14, whereby the transistor 135 is turned on. Thus, a signal that corresponds to imaging data is outputted to the wiring 156 (VOUT) in accordance with the potential of the node FD2. Note that the potential of the signal is equal to the potential of the signal outputted from Time T05 to Time T06.

The wiring 165 (SEL) is set to "L" at Time T15, whereby the transistor 135 is turned off. The above is the capturing and outputting operations of image data of the difference detection frame in the case where there is no difference between image data of the reference frame and that of the difference detection frame.

A period between Time T21 and Time T25 corresponds to a period during which the imaging data of the difference detection frame is captured and outputted in order to capture differential data in the case where there is a difference between the imaging data of the reference frame and the imaging data of the difference detection frame. The case where there is a difference corresponds to the case where light irradiating the photoelectric conversion element 120 has higher illuminance from Time T22 to Time T23 described later than from Time T12 to Time T13.

The operations of the transistors 131, 132, 133, and 135 from Time T21 to Time T25 are similar to those from Time T11 to Time T15.

The potential of the node FD1 at Time T21 is "VR." Accordingly, the potential is increased by "$\Delta V1$," which is the potential decrease from Time T12 to Time T13. Meanwhile, the potential of the node FD2 is increased by "$\Delta V2$," which is the potential decrease from Time T12 to Time T13. That is, the potential of the node FD2 becomes "VAZ+$\Delta V2$."

At Time T22, the potentials of the nodes FD1 and FD2 are decreased.

The potentials of the nodes FD1 and FD2 are retained at Time T23. When the interval between Time T22 and Time T23 is assumed to be T, the potential decrease "$\Delta V1'$" at the node FD1 from Time T22 to Time T23 is larger than the potential decrease "$\Delta V1$" from Time T12 to Time T13 ($\Delta V1' > \Delta V1$) because the illuminance of light irradiating the photoelectric conversion element 120 is higher than the illuminance of light irradiating the photoelectric conversion element 120 from Time T12 to Time T13. Furthermore, the potential decrease "$\Delta V2' = \Delta V1' \cdot \alpha$" at the node FD2 is larger than the potential decrease "$\Delta V2$" from Time T12 to Time T13 ($\Delta V2' > \Delta V2$). Thus, the potential "VAZ+$\Delta V2 - \Delta V2'$" of the node FD2 is lower than the potential "VAZ" of the wiring 153 (VAZ).

At Time T24, a signal that corresponds to imaging data is outputted to the wiring 156 (VOUT) in accordance with the potential of the node FD2. Note that the higher the illuminance of light irradiating the photoelectric conversion element 120 from Time T22 to Time T23 is, the lower the potential of the signal outputted from the wiring 156 (VOUT) is, therefore making the potential of the output signal lower than the potential of an output signal from Time T14 to Time T15.

Similarly to the case from Time T11 to Time T15, a period between Time T31 and Time T35 corresponds to a period during which the imaging data of the difference detection frame is captured and outputted in order to capture differential data in the case where there is no difference between the imaging data of the reference frame and the imaging data of the difference detection frame.

The operations of the transistors 131, 132, 133, and 135 from Time T31 to Time T35 are similar to those from Time T11 to Time T15.

The potential of the node FD1 from Time T31 to Time T32 is "VR." Accordingly, the potential is increased by "ΔV1'," which is the potential decrease from Time T22 to Time T23. Meanwhile, the potential of the node FD2 is increased by "ΔV2'," which is the potential decrease from Time T22 to Time T23. That is, the potential of the node FD2 becomes "VAZ+ΔV2."

When the interval between Time T32 and Time T33 is assumed to be T, the potential decrease at the node FD1 is equal to the potential decrease "ΔV1" from Time T12 to Time T13 because the photoelectric conversion element 120 is irradiated with light with the same illuminance as that from Time T12 to Time T13. The potential decrease at the node FD2 is equal to the potential decrease "ΔV2" from Time T12 to Time T13. Thus, the potential of the node FD2 becomes "VAZ," which is equal to the potential of the wiring 153 (VAZ).

A period between Time T41 and Time T45 corresponds to a period during which the imaging data of the difference detection frame is captured and outputted in order to capture differential data in the case where there is a difference between the imaging data of the reference frame and the imaging data of the difference detection frame. The case where there is a difference corresponds to the case where light irradiating the photoelectric conversion element 120 has lower illuminance from Time T42 to Time T43 described later than from Time T32 to Time T33.

The operations of the transistors 131, 132, 133, and 135 from Time T41 to Time T45 are similar to those from Time T31 to Time T35.

The potential of the node FD1 at Time T41 is "VR." Accordingly, the potential is increased by "ΔV1," which is the potential decrease from Time T32 to Time T33. Meanwhile, the potential of the node FD2 is increased by "ΔV2," which is the potential decrease from Time T32 to Time T33. That is, the potential of the node FD2 becomes "VAZ+ΔV2."

At Time T42, the potentials of the nodes FD1 and FD2 are decreased.

The potentials of the nodes FD1 and FD2 are retained at Time T43. When the interval between Time T42 and Time T43 is assumed to be T, the potential decrease "ΔV1'"" at the node FD1 from Time T42 to Time T43 is smaller than the potential decrease "ΔV1" from Time T32 to Time T33 (ΔV1"<ΔV1) because the illuminance of light irradiating the photoelectric conversion element 120 is lower than the illuminance of light irradiating the photoelectric conversion element 120 from Time T32 to Time T33. Furthermore, the potential decrease "ΔV2"=ΔV1"·α" at the node FD2 is smaller than the potential decrease "ΔV2" from Time T32 to Time T33 (ΔV2"<ΔV2). Thus, the potential "VAZ+ΔV2−ΔV2'" of the node FD2 is higher than the potential "VAZ" of the wiring 153 (VAZ).

At Time T44, a signal that corresponds to imaging data is outputted to the wiring 156 (VOUT) in accordance with the potential of the node FD2. Note that the lower the illuminance of light irradiating the photoelectric conversion element 120 from Time T42 to Time T43 is, the higher the potential of the signal outputted from the wiring 156 (VOUT) is, therefore making the potential of the output signal higher than the potential of an output signal from Time T34 to Time T35.

Described above is an operation example of the pixel 11 in the second mode.

This embodiment can be implemented in appropriate combination with any of the structures described in the other embodiments.

Embodiment 3

In this embodiment, modification examples of the pixel 11 included in the imaging device 10 will be described with reference to drawings.

Figure 8:
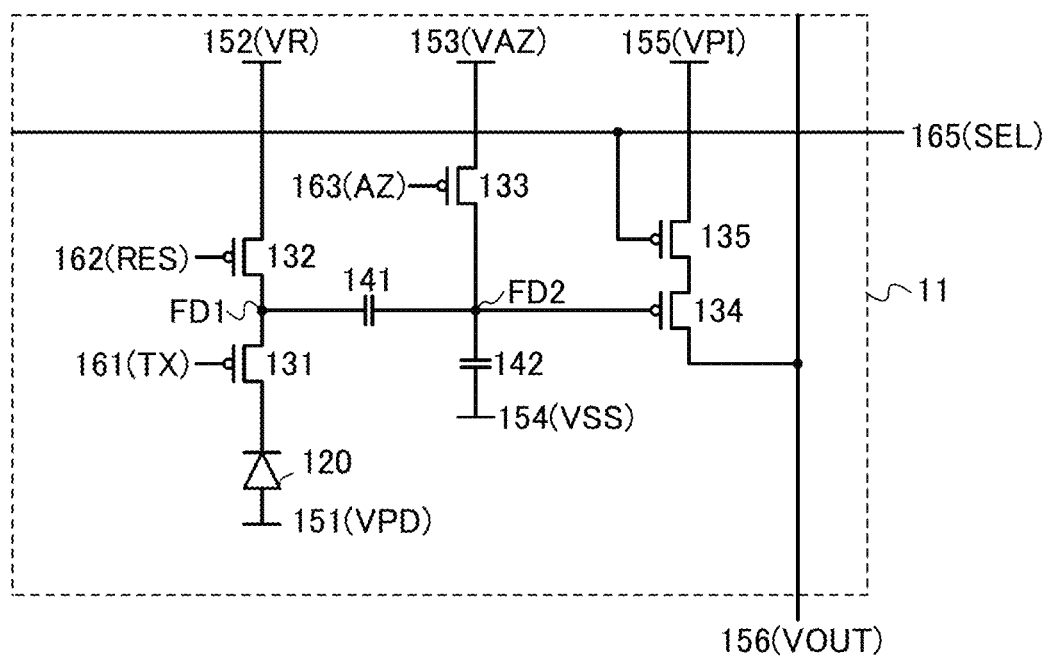
FIG. 8 illustrates a pixel circuit of an imaging device.

The pixel 11 included in the imaging device 10 of one embodiment of the present invention can have a configuration illustrated in FIG. 8 as well as the configuration FIG. 5. FIG. 8 is different from FIG. 5 in that the transistors 131 to 135 are all p-channel transistors. When the magnitude relationships of the potentials are reversed as appropriate, for example, FIG. 6 and FIG. 7 can be referred to for the operations in the first imaging mode and in the second mode, respectively. Note that only some of the transistors 131 to 135 may be p-channel transistors. Alternatively, a CMOS transistor may be employed.

Figure 9:
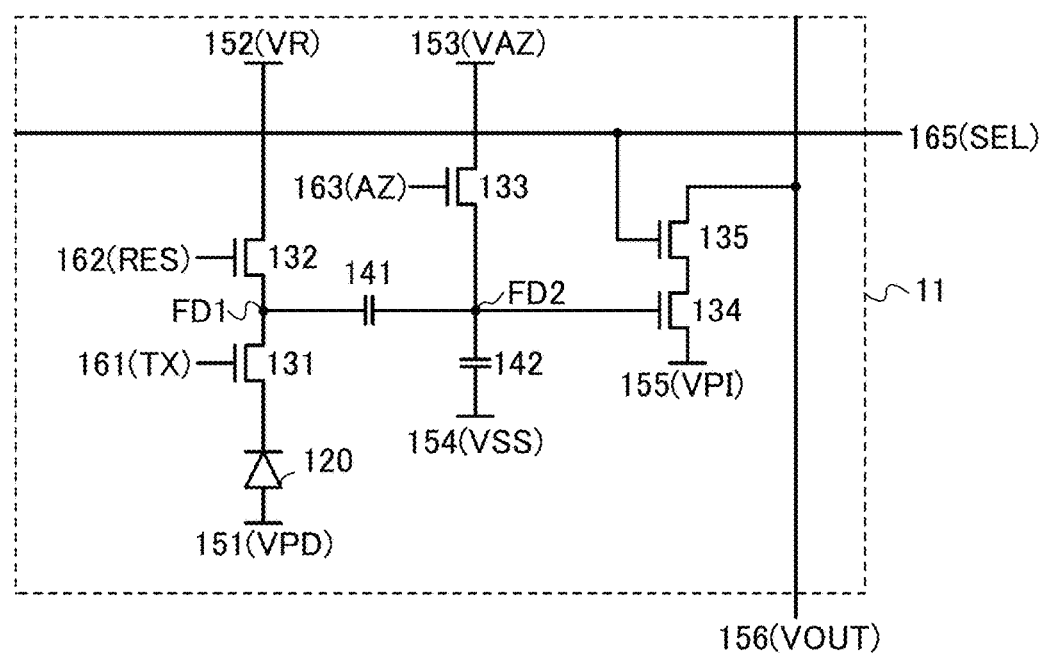
FIG. 9 illustrates a pixel circuit of an imaging device.

Although the transistor 135 is provided between the transistor 134 and the wiring 155 (VPI) in FIG. 5, the transistor 134 may be provided between the transistor 135 and the wiring 155 (VPI) as illustrated in FIG. 9.

Figure 10:
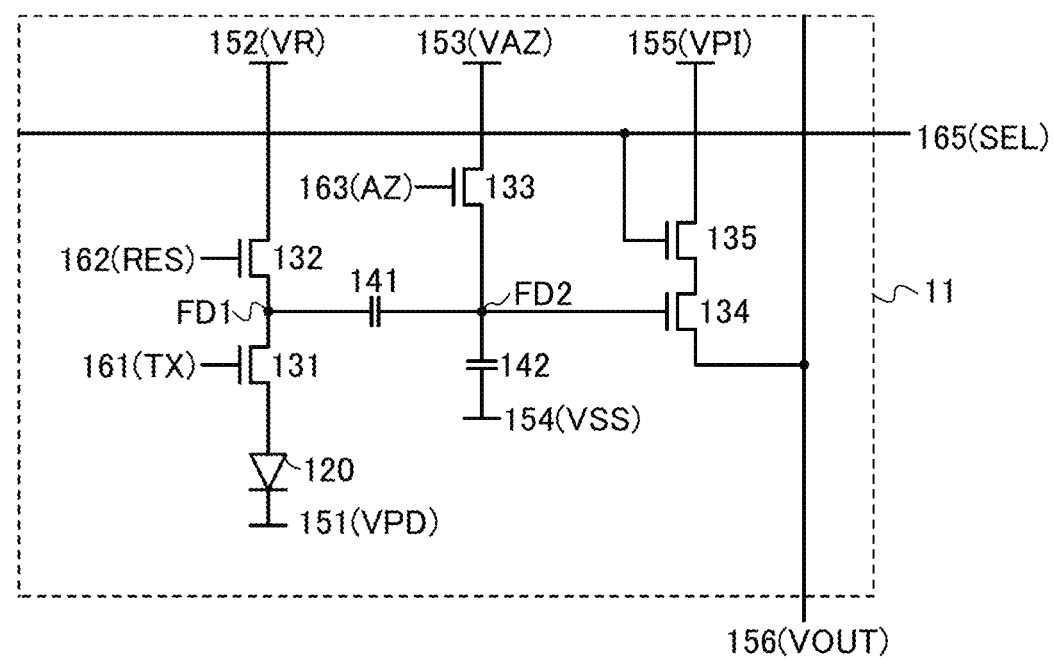
FIG. 10 illustrates a pixel circuit of an imaging device.

The pixel 11 included in the imaging device 10 of one embodiment of the present invention may have a configuration illustrated in FIG. 10. FIG. 10 illustrates a configuration in which the connection orientation of the photoelectric conversion element 120 in the pixel 11 is opposite to that in FIG. 5. In this case, the wiring 151 (VPD) is set to "H" and the wiring 152 (VR) is set to "L." FIG. 6 and FIG. 7 can be referred to for the operations in the first imaging mode and in the second imaging mode, respectively; in this case however, the higher the illuminance of light irradiating the photoelectric conversion element 120 is, the higher the potentials of the nodes FD1 and FD2 are. Thus, in the circuit configuration illustrated in FIG. 10, the higher the illuminance of light irradiating the photoelectric conversion element 120 is, the higher the potential of the output signal from the wiring 156 (VOUT) is.

Figure 11A:
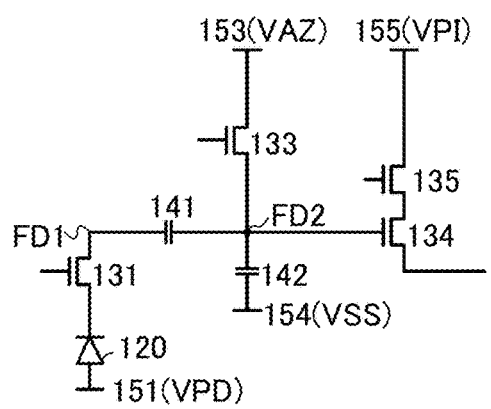
FIGS. 11A to 11C illustrate a pixel circuit of an imaging device.

FIG. 11A illustrates a configuration in which the transistor 132 is excluded from the pixel 11 illustrated in FIG. 5. In this case, the wiring 151 (VPD) is configured to be able to switch between "L" and "H." The reset operation of the node FD1 can be performed when the wiring 151 (VPD) is set to "H." In a predetermined period, when the wiring 151 (VPD) is set to "H," a forward bias is applied to the photoelectric conversion element 120. Thus, the potential of the node FD1 can be set to the potential "VPD" of the wiring 151 (VPD).

To capture imaging data, the wiring 151 (VPD) is set to "L." When the wiring 151 (VPD) is set to "L," a reverse bias is applied to the photoelectric conversion element 120; thus, charge can be released from the node FD1 to the wiring 151 (VPD) in accordance with the illuminance of light. In that case, the higher the illuminance of light irradiating the photoelectric conversion element 120 is, the lower the potentials of the nodes FD1 and FD2 are. Thus, in the circuit configuration illustrated in FIG. 11A, the higher the illuminance of light irradiating the photoelectric conversion element 120 is, the lower the potential of the output signal from the wiring 156 (VOUT) is.

Figure 11B:
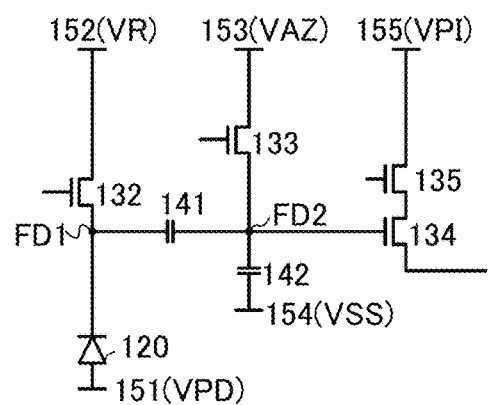
Figure 11C:
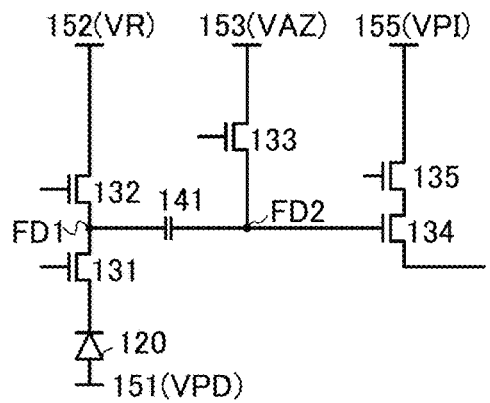

As another configuration of the pixel 11 included in the imaging device 10 of one embodiment of the present invention, the transistor 131 may be excluded as illustrated in FIG. 11B; alternatively, the capacitor 142 may be excluded as illustrated in FIG. 11C.

Note that some wirings are not illustrated in FIGS. 11A to 11C.

Figure 12A:
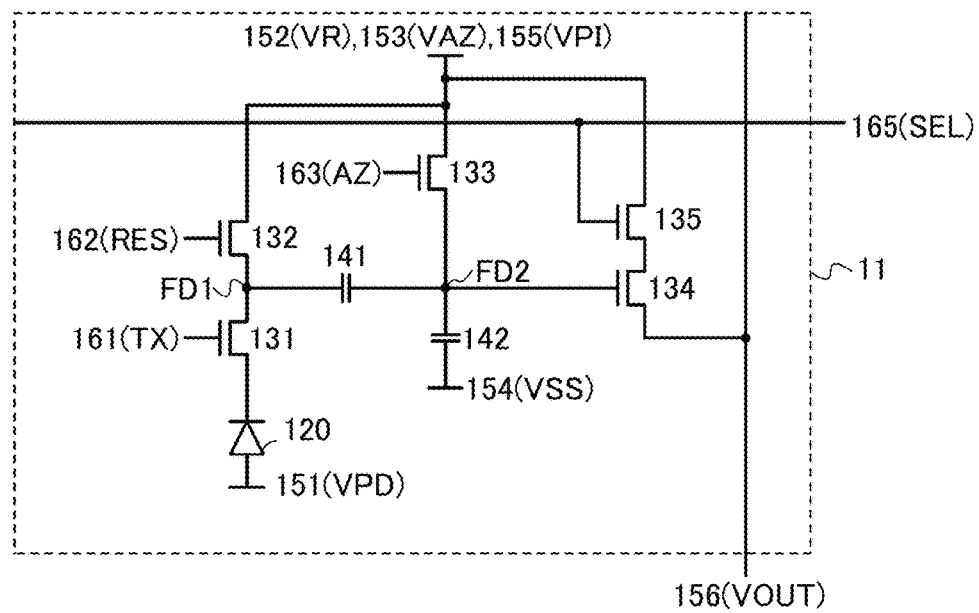
FIGS. 12A and 12B illustrate a pixel circuit of an imaging device.
Figure 12B:
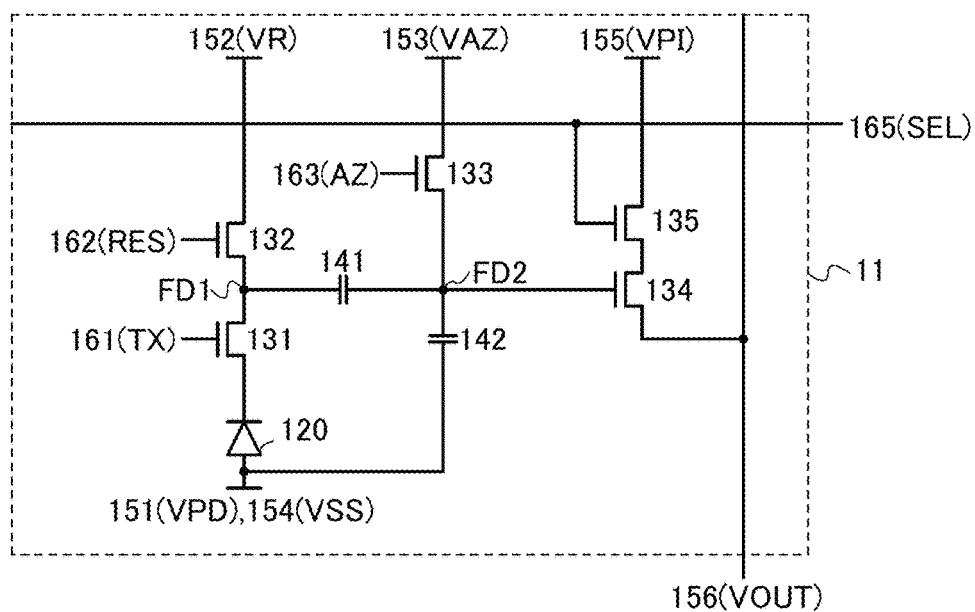

Although FIG. 5 illustrates wirings supplying the same potential as different wirings, one wiring may serve as those wirings. For example, as in the pixel 11 illustrated in FIG. 12A, the wiring 152 (VR), the wiring 153 (VAZ), and the wiring 155 (VPI) to which "H" is applied may be the same wiring. Alternatively, as in the pixel 11 illustrated in FIG. 12B, the wiring 151 (VPD) and the wiring 154 (VSS) to which "L" is applied may be the same wiring.

Figure 13A:
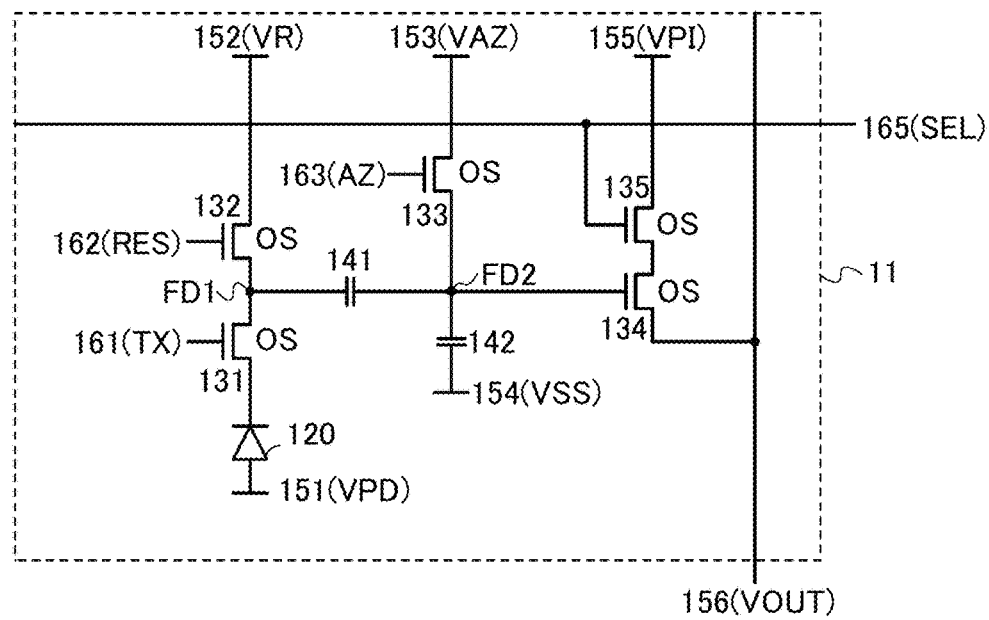
FIGS. 13A and 13B illustrate a pixel circuit of an imaging device.

FIG. 13A is different from FIG. 5 in that the transistors 131 to 135 included in the pixel 11 are transistors (hereinafter referred to as OS transistors) whose active layers or active regions contain oxide semiconductors.

Unless otherwise specified, the off-state current in this specification refers to a drain current of a transistor in the off state (also referred to as non-conduction state and cutoff state). Unless otherwise specified, the off state of an n-channel transistor means that the voltage between its gate and source ($V_{gs}$: gate-source voltage) is lower than the threshold voltage "$V_{th}$," and the off state of a p-channel transistor means that the gate-source voltage "$V_{gs}$" is higher than the threshold voltage "$V_{th}$." For example, the off-state current of an n-channel transistor sometimes refers to a drain current that flows when the gate-source voltage "$V_{gs}$" is lower than the threshold voltage "$V_{th}$."

The off-state current of a transistor depends on "$V_{gs}$" in some cases. Thus, "the off-state current of a transistor is lower than or equal to I" means "there is $V_{gs}$ with which the off-state current of a transistor becomes lower than or equal to I' in some cases. Furthermore, the off-state current of a transistor may refer to the off-state current in an off state at predetermined "$V_{gs}$," the off-state current in an off state at "$V_{gs}$" in a predetermined range, the off-state current in an off state at "$V_{gs}$" with which sufficiently reduced off-state current is obtained, or the like.

As an example, the assumption is made of an n-channel transistor where the threshold voltage "$V_{th}$" is 0.5 V and the drain current is $1\times10^{-9}$ A at "$V_{gs}$" of 0.5 V, $1\times10^{-13}$ A at "$V_{gs}$" of 0.1 V, $1\times10^{-19}$ A at "$V_{gs}$" of –0.5 V, and $1\times10^{-22}$ A at "$V_{gs}$" of –0.8 V. The drain current of the transistor is $1\times10^{-19}$ A or lower at "$V_{gs}$" of –0.5 V or at "$V_{gs}$" in the range of –0.8 V to –0.5 V; therefore, it can be said that the off-state current of the transistor is $1\times10^{-19}$ A or lower. Since there is "$V_{gs}$" at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value in relation to the channel width W or by a current value per given channel width (e.g., 1 µm). In the latter case, the off-state current may be expressed in the unit with the dimension of current per length (e.g., A/µm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). The description "an off-state current of a transistor is lower than or equal to I" may refer to a situation where there is "$V_{gs}$" at which the off-state current of a transistor is lower than or equal to I at room temperature, 60° C., 85° C., 95° C., 125° C., a temperature at which the reliability of a semiconductor device including the transistor is ensured, or a temperature at which the semiconductor device or the like including the transistor is used (e.g., temperature in the range of 5° C. to 35° C.).

The off-state current of a transistor depends on voltage "$V_{ds}$" between its drain and source in some cases. Unless otherwise specified, the off-state current in this specification may be an off-state current at "$V_{ds}$" of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at "$V_{ds}$" at which the reliability of a semiconductor device or the like including the transistor is ensured or "$V_{ds}$" used in the semiconductor device or the like. The state where the off-state current of a transistor is "I" or lower may indicate that the off-state current of the transistor at "$V_{ds}$" of 0.1 V, 0.8 V, 1 V, 1.2 V, 1.8 V, 2.5 V, 3 V, 3.3 V, 10 V, 12 V, 16 V, or 20 V, at "$V_{ds}$" at which the reliability of a semiconductor device or the like including the transistor is ensured, or at "$V_{ds}$" used in the semiconductor device or the like including the transistor is "I" or lower at a certain "$V_{gs}$."

In this specification, the term "leakage current" sometimes expresses the same meaning as off-state current.

In this specification, the off-state current sometimes refers to a current that flows between a source and a drain when a transistor is off, for example.

The use of the OS transistor in the pixel 11 can broaden the dynamic range of imaging. In the circuit configuration in FIG. 5, the potential of the node FD1 is decreased when light with high illuminance enters the photoelectric conversion element 120 and thus the potential of the node FD2 is also decreased. Since the OS transistor has extremely low off-state current, a current based on a gate potential can be accurately outputted even when the potential of the node FD2 (gate potential of the transistor 134) is extremely low. Accordingly, it is possible to widen the detection range of illuminance, i.e., the dynamic range.

A period during which charge can be held in the node FD1 and the node FD2 can be extremely long owing to the low off-state current of the transistor. Therefore, a global shutter system in which imaging data is captured in all the pixels at the same time can be used without complicated circuit configurations and operation methods.

Figure 14A:
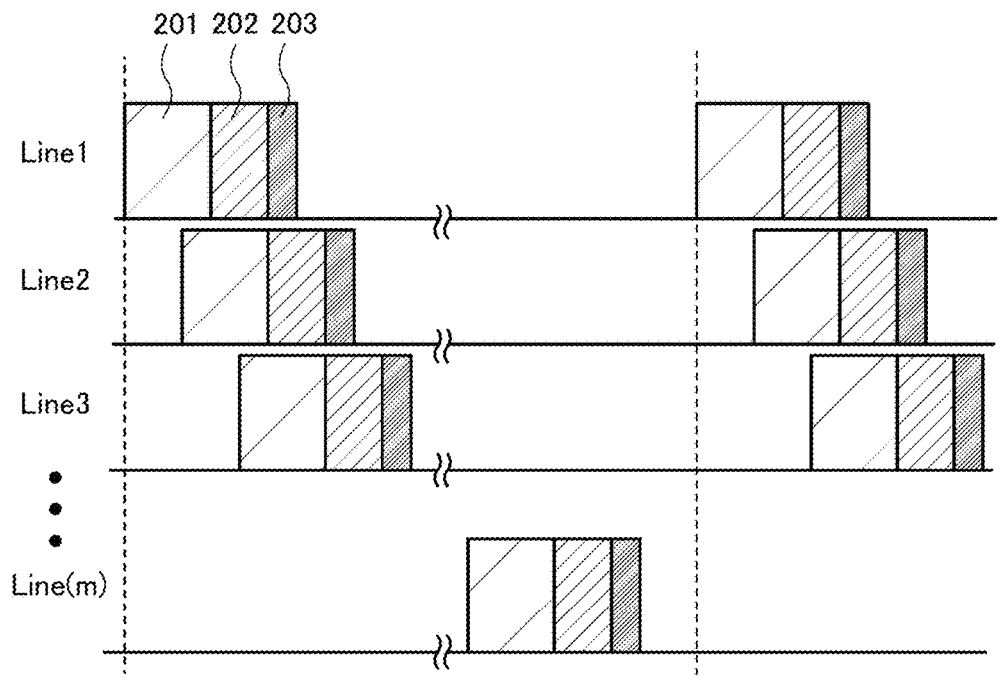
FIGS. 14A and 14B are timing charts illustrating operations of a global shutter system and a rolling shutter system, respectively.

In a general imaging device where pixels are arranged in matrix, a rolling shutter system is employed in which an imaging operation 201, a data retention operation 202, and a read operation 203 are performed row by row as illustrated in FIG. 14A. In the case of employing the rolling shutter system, simultaneousness of imaging is lost. Therefore, when an object moves, an image is distorted.

Figure 14B:
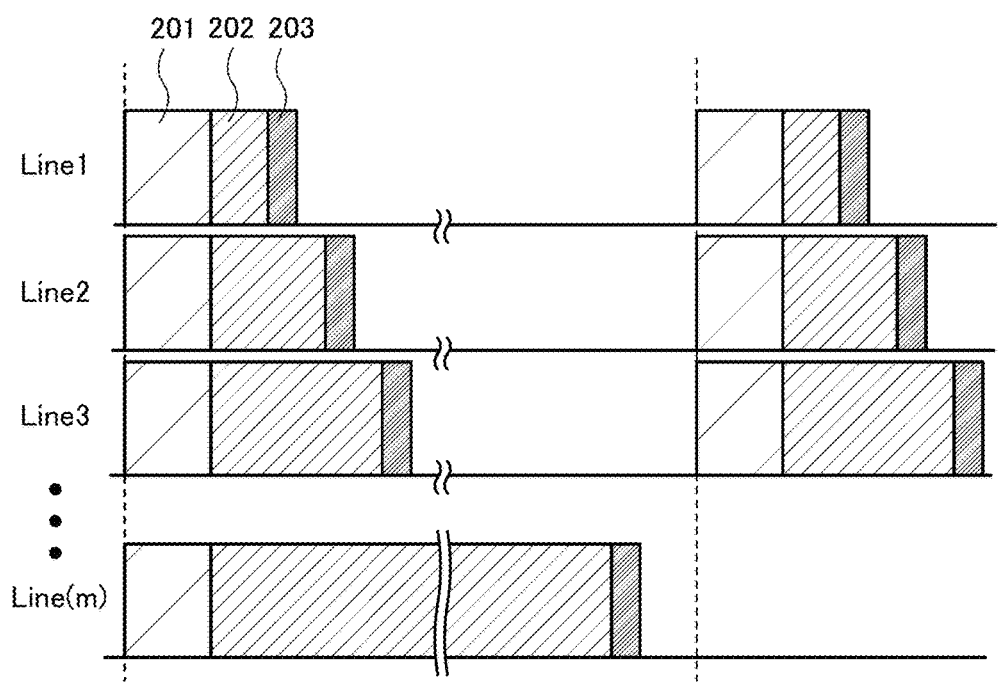

For this reason, in one embodiment of the present invention, it is preferable to employ a global shutter system in which the imaging operation 201 can be performed simultaneously in all the rows and the read operation 203 can be sequentially performed row by row as illustrated in FIG. 14B. By employing the global shutter system, simultaneousness of imaging in all the pixels in the imaging device can be ensured, and an image with little distortion can be easily obtained even when an object moves.

In addition, the OS transistor has lower temperature dependence of change in electrical characteristics than a transistor whose active layer or active region contains silicon (hereinafter, such a transistor is referred to as a Si transistor), and thus can be used in an extremely wide range of temperatures. Therefore, an imaging device and a semiconductor device that include OS transistors are suitable for use in automobiles, aircrafts, and spacecrafts.

A transistor connected to either the node FD1 or the node FD2 needs to be a transistor with low noise. The channel of a transistor including two or three oxide semiconductor layers to be described later is a buried channel, which has significantly high resistance to noise. Thus, the use of the transistor leads to an image with low noise.

With the configuration illustrated in FIG. 13A, the pixel can be composed of OS transistors and a photoelectric conversion element formed using silicon. Such a configuration facilitates an increase in the effective area of the photoelectric conversion element because a Si transistor need not be formed in the pixel. Thus, the imaging sensitivity can be improved Not only the pixel 11 but also peripheral circuits such as the circuit 13, the circuit 14, the circuit 15, the circuit 16, the circuit 17, the circuit 18, the circuit 19, the circuit 21, and the circuit 22 may include OS transistors. A structure in which peripheral circuits are formed using only OS transistors does not need a process for forming Si transistors and thus is effective in reducing the cost of the imaging device. Furthermore, a structure in which peripheral circuits are formed using only OS transistors and p-channel Si transistors does not need a process for forming n-channel Si transistors and thus is effective in reducing the cost of the imaging device. Furthermore, a structure in which CMOS circuits are employed as the peripheral circuits is effective in reducing power consumption of the peripheral circuits, that is, reducing power consumption of the imaging device.

Figure 13B:
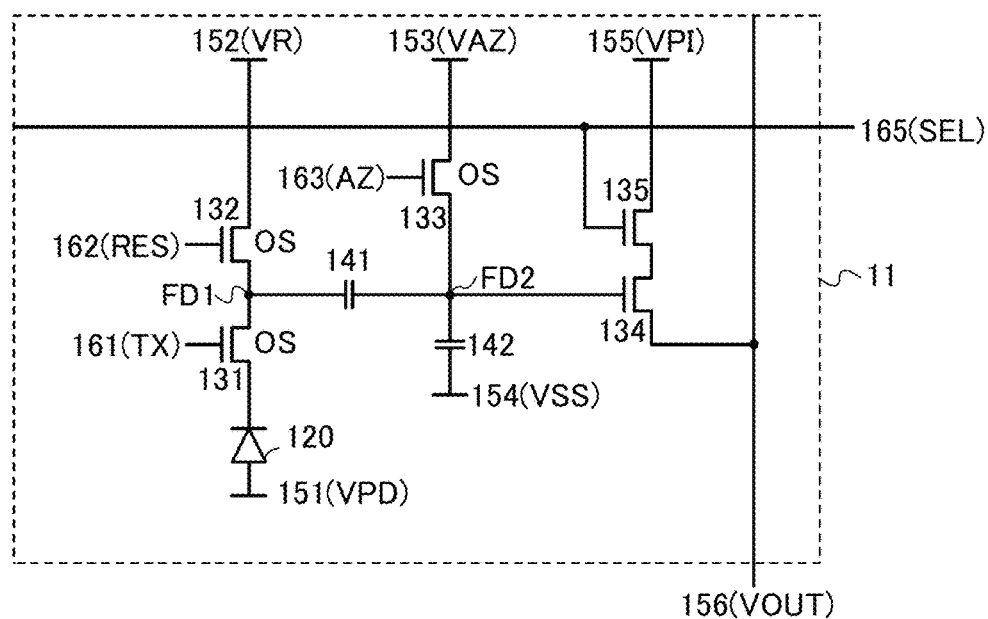

FIG. 13B is another circuit diagram of the pixel 11, which is a modification example of FIG. 13A. The transistors 134 and 135 in the pixel 11 shown in FIG. 13B are Si transistors.

The Si transistor has a characteristic of excellent field-effect mobility as compared to the OS transistor. Thus, the amount of current flowing in a transistor functioning as an amplifier transistor or a selection transistor can be increased. For example, in FIG. 13B, the amount of current flowing in the transistors 134 and 135 can be increased depending on charge accumulated in the node FD2.

In the circuit diagrams illustrated in FIGS. 13A and 13B, "OS" is written beside a circuit symbol of an OS transistor for clarification.

Figure 15A:
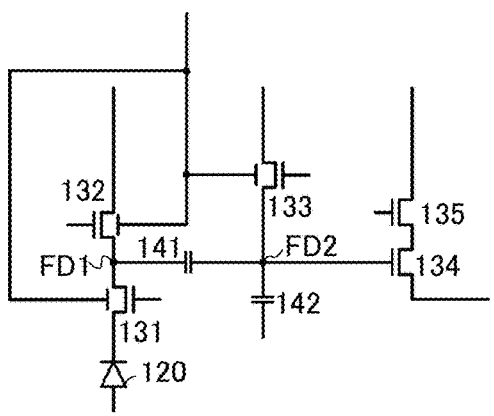
FIGS. 15A to 15F illustrate a pixel circuit of an imaging device.
Figure 15B:
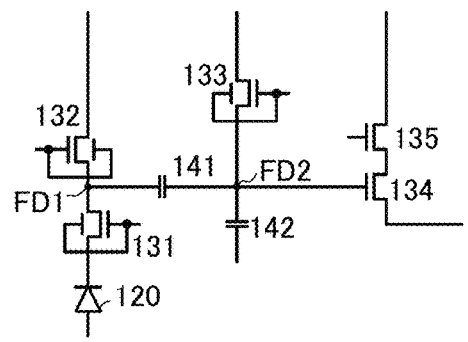
Figure 15C:
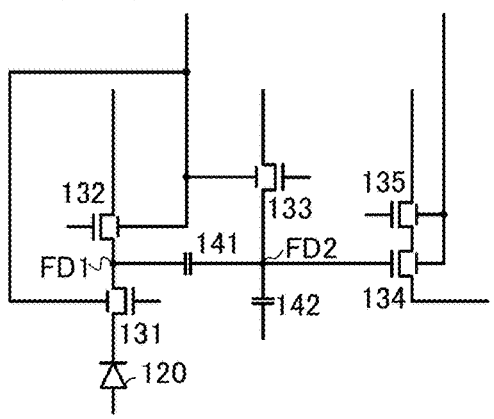
Figure 15D:
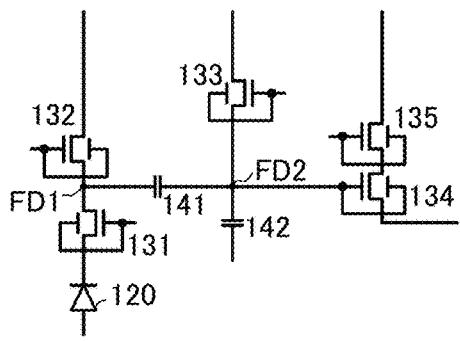

The transistors 131, 132, and 133 in the pixels 11 may each include a back gate as illustrated in FIGS. 15A and 15B. FIG. 15A illustrates a configuration in which a constant potential is applied to the back gates, which enables control of the threshold voltages. FIG. 15B illustrates a configuration in which the same potential is applied to the back gates and front gates, which enables an increase in on-state current. The transistors 131 to 135 may each have a back gate as illustrated in FIGS. 15C and 15D.

Figure 15E:
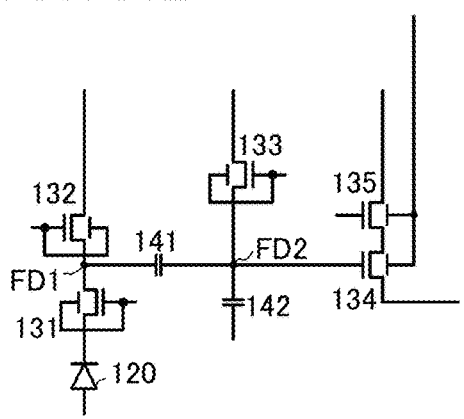
Figure 15F:
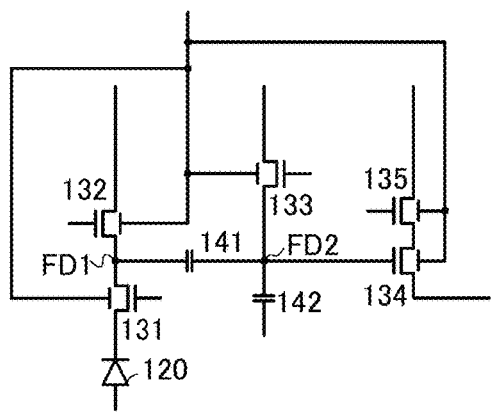

Moreover, as illustrated in FIG. 15E, a configuration in which the same potential is applied to a front gate and a back gate and a configuration in which a constant potential is applied to a back gate may be arbitrarily combined as necessary for the transistors in one pixel. Furthermore, a circuit configuration in which a back gate is not provided may be arbitrarily combined with any of the above configurations. As the configuration in which a constant potential is applied to a back gate, for example, a configuration in which the same potential is applied to all the back gates can be employed as illustrated in FIG. 15F, for example.

Note that some wirings are not illustrated in FIGS. 15A to 15F.

Since an OS transistor has lower on-state current than a Si transistor, it is particularly preferable that the OS transistor have a back gate. For example, in the case where the transistors 131 to 135 are OS transistors as illustrated in FIG. 13A, the transistors 131 to 135 preferably have back gates. In the case where the transistors 131 to 133 are OS transistors as illustrated in FIG. 13B, for example, the transistors 131 to 133 preferably have back gates.

Figure 16:
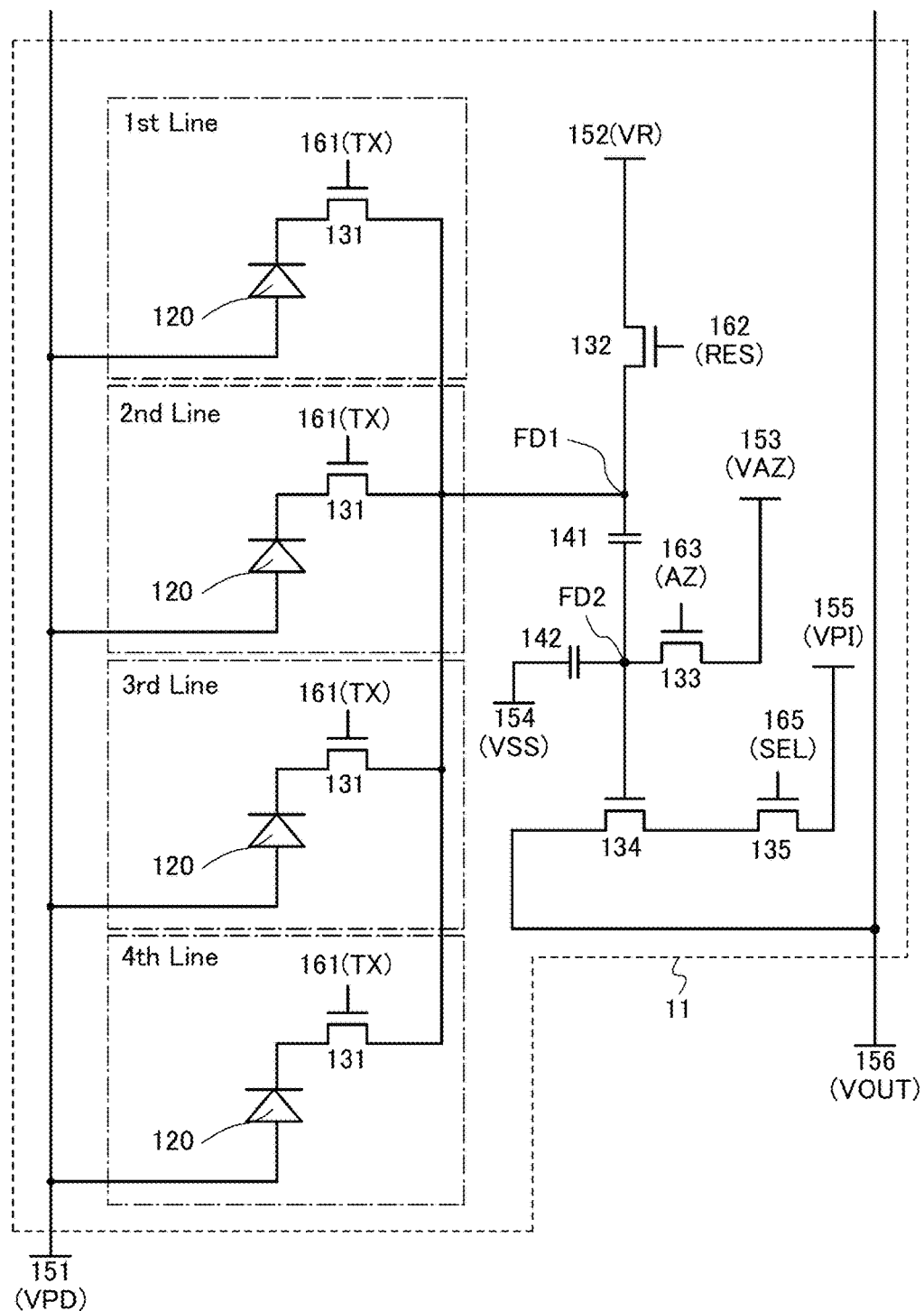
FIG. 16 illustrates a pixel circuit of an imaging device.

The pixel 11 may have a configuration in which the transistors 132 to 135 are shared among a plurality of pixels as illustrated in FIG. 16. FIG. 16 illustrates a configuration in which the transistors 132 to 135 are shared among a plurality of pixels in a perpendicular direction. Note that the transistors 132 to 135 may be shared among a plurality of pixels in a horizontal direction or among a plurality of pixels in horizontal and perpendicular directions. Such a configuration can reduce the number of transistors included in one pixel.

Although FIG. 16 illustrates a configuration in which the transistors 132 to 135 are shared among four pixels, the transistors 132 to 135 may be shared among two pixels, three pixels, or five or more pixels.

Such a configuration can provide an imaging device that includes a highly integrated pixel array. Furthermore, such a configuration can provide an imaging device capable of obtaining high-quality imaging data.

Note that the structures shown in FIG. 5, FIG. 8 to FIGS. 13A and 13B, FIGS. 15A to 15F, and FIG. 16 can be freely combined with one another.

This embodiment can be implemented in an appropriate combination with any of the structures described in the other embodiments.

Embodiment 4

This embodiment describes a structure example of the circuit 16 included in the imaging device 10.

The pixels 11 in this embodiment are arranged in n rows and m columns as in Embodiment 1. The circuit configuration of the pixel 11 is similar to the circuit configuration shown in FIG. 5, which has been described in Embodiment 5.

Figure 17:
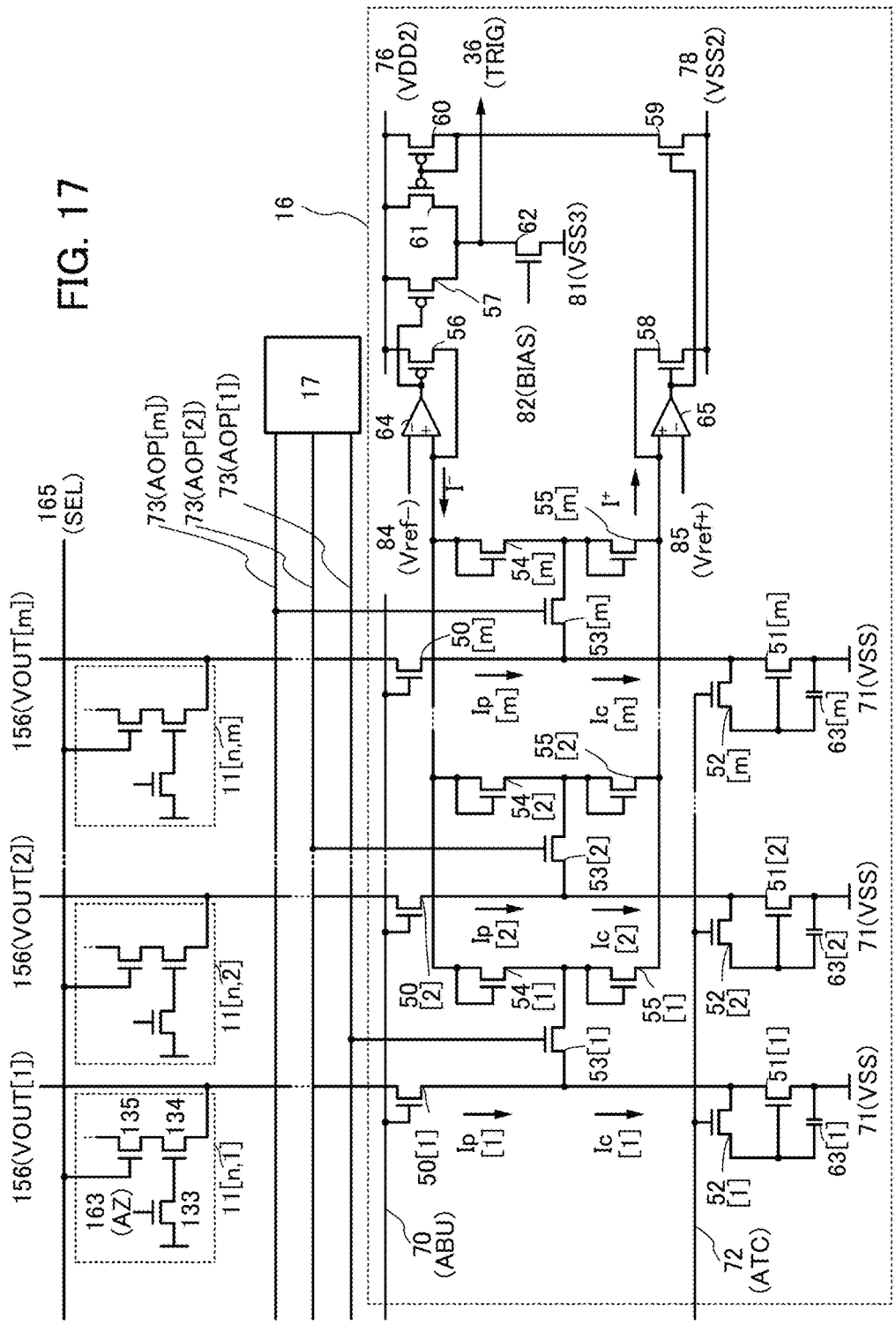
FIG. 17 illustrates a deference detection circuit of an imaging device.

FIG. 17 shows the structure of the circuit 16 and the connection relationship between the pixels 11, the circuit 16, and the circuit 17. The circuit 16 includes a transistor 50, a transistor 51, transistor 52, a transistor 53, a transistor 54, a transistor 55, a transistor 56, a transistor 57, a transistor 58, a transistor 59, a transistor 60, a transistor 61, a transistor 62, a capacitor 63, a comparator 64, and a comparator 65. Note that the circuit 16 includes m transistors 50 to 55 each and m capacitors 63.

FIG. 17 focuses on the nth row pixels 11.

Although the transistors 50 to 55, the transistor 58, the transistor 59, and the transistor 62 in FIG. 17 are n-channel transistors, the transistor 56, the transistor 57, the transistor 60, and the transistor 61 are p-channel transistors, some of the n-channel transistors may be replaced with p-channel transistors and some of the p-channel transistors may be replaced with n-channel transistors as appropriate.

In the circuit 16 shown in FIG. 17, one of a source and a drain of a transistor 50[1] is electrically connected to one of a source and a drain of a transistor 134 through a wiring 156 (VOUT[1]), and the other one of the transistor 50[1] is electrically connected to one of a source and a drain of a transistor 51[1], to one of a source and a drain of a transistor 52[1], and to one of a source and a drain of the transistor 53[1]. The same applies to the transistors 50[2] to 50[$m$]. Gates of the transistors 50[1] to 50[$m$] are electrically connected to a wiring 70 (ABU).

The other of the source and the drain of the transistor 51[1] is electrically connected to one terminal of a capacitor 63[1] and to a wiring 71 (VSS). A gate of the transistor 51[1] is electrically connected to the other of the source and the drain of the transistor 52[1] and the other terminal of the capacitor 63[1]. The same applies to the transistors 51[2] to 51[m].

Gates of the transistors 52[1] to 52[m] are electrically connected to a wiring 72 (ATC).

Gates of the transistors 53[1] to 53[m] are electrically connected to the circuit 17 respectively through wirings 73 (AOP[1]) to 73 (AOP[m]). The other of the source and the drain of the transistor 53[1] is electrically connected to one of a source and a drain of a transistor 54[1], to a gate of a transistor 55[1], and to one of a source and a drain of the transistor 55[1]. The same applies to the transistors 53[2] to 53[m].

The other of the source and the drain of the transistor 54[1] is electrically connected to a gate of the transistor 54[1], to one of a source and a drain of the transistor 56, and to a non-inverting input terminal of the comparator 64. The same applies to the transistors 54[2] to 54[m].

The other of the source and the drain of the transistor 55[1] is electrically connected to one of a source and a drain of the transistor 58 and a non-inverting input terminal of the comparator 65. The same applies to the transistors 55[2] to 55[m].

The other of the source and the drain of the transistor 56 is electrically connected to one of a source and a drain of the transistor 57, one of a source and a drain of the transistor 60, and one of a source and a drain of the transistor 61 through a wiring 76 (VDD2). A gate of the transistor 56 is electrically connected to a gate of the transistor 57 and an output terminal of the comparator 64.

The other of the source and the drain of the transistor 57 is electrically connected to the other of the source and the drain of the transistor 61 and one of a source and a drain of the transistor 62.

The other of the source and the drain of the transistor 58 is electrically connected to one of a source and a drain of the transistor 59. A gate of the transistor 58 is electrically connected to a gate of the transistor 59 and an output terminal of the comparator 65.

The other of the source and the drain of the transistor 59 is electrically connected to the other of the source and the drain of the transistor 60, a gate of the transistor 60, and a gate of the transistor 61.

The other of the source and the drain of the transistor 62 is electrically connected to a wiring 81 (VSS3). A gate of the transistor 62 is electrically connected to a wiring 82 (BIAS).

The non-inverting input terminal of the comparator 64 is electrically connected to a wiring 84 (Vref⁻). The non-inverting input terminal of the comparator 65 is electrically connected to a wiring 85 (Vref⁺).

Note that a potential "Vref⁻" of the wiring 84 (Vref⁻) and a potential "Vref⁺" of the wiring 85 (Vref⁺) can be freely determined.

The wiring 71(VSS) can be set "L" or can be operated by the application of another potential.

Figure 18:
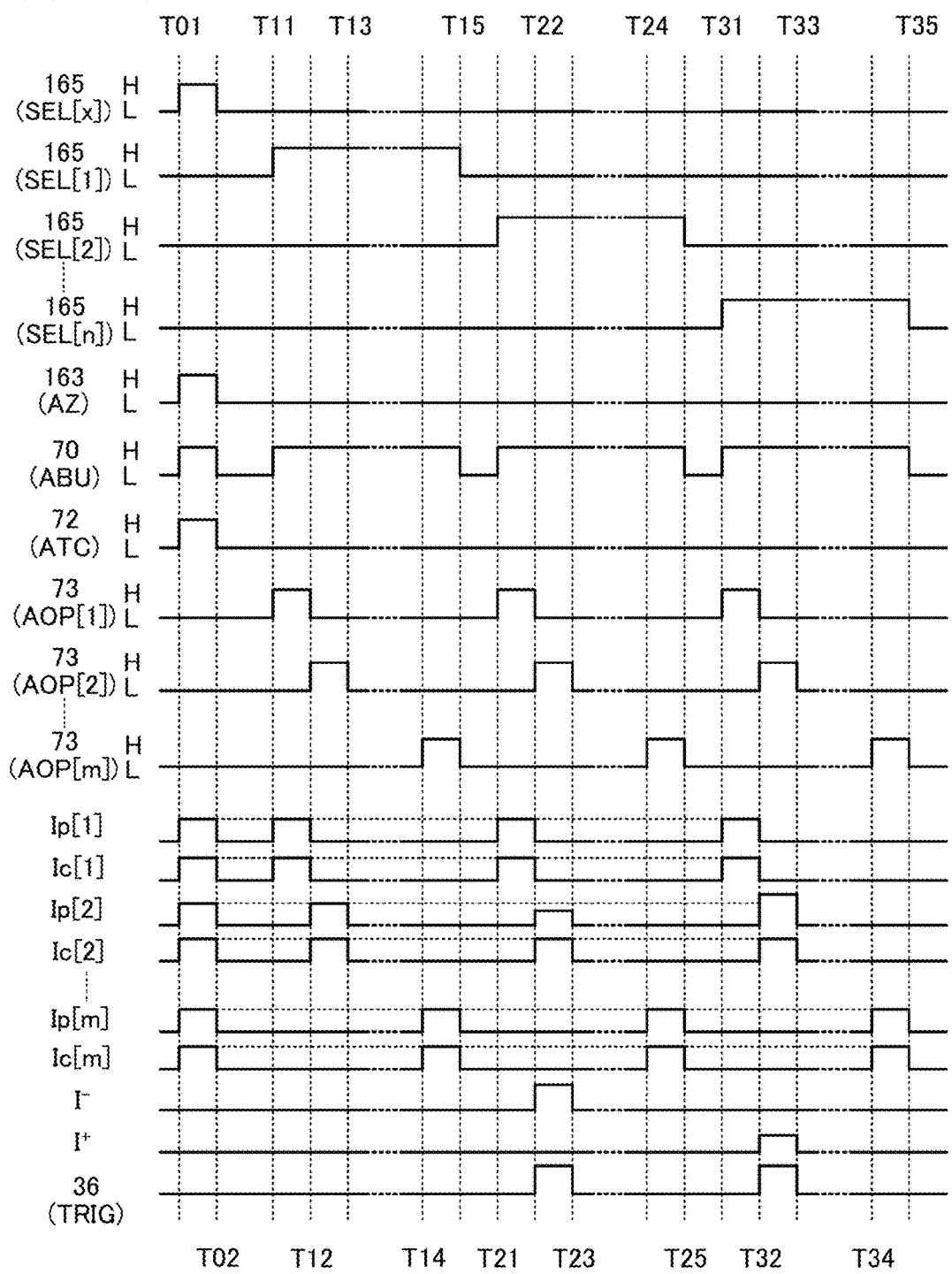
FIG. 18 is a timing chart illustrating operation for detecting a difference by an imaging device.

FIG. 18 is a timing chart showing an operation example of the circuit 16. In a time T01, a wiring 165 (SEL[x]), the wiring 163 (AZ), the wiring 70 (ABU), and the wiring 72 (ATC) are set "H", whereby the transistor 135, the transistor 133, the transistors 50[1] to 50[m], and the transistors 52[1] to 52[m] are turned on. The wirings 73 (AOP[1]) to 73 (AOP[m]) are set "L", whereby the transistors 53[1] to 53[m] are turned off. Note that the wiring 165 (SEL[x]) is a wiring 165 in any row (x is a natural number smaller than or equal to n).

At this time, current supplied to the wirings 156 (VOUT[1]) to 156 (VOUT[m]) in respective rows corresponds to the imaging data of the reference frame, and has a current value of "I0" which indicates no difference between the imaging data of the reference frame and the imaging data of the difference detection frame. The current value I0 may be referred to as a reference current value.

Each value of currents Ip[1] to Ip[m] flowing through the transistors 50[1] to 50[m] is equal to I0. Each current value of currents Ic[1] to Ic[m] flowing through the transistors 51[1] to 51[m] is also equal to I0. Potentials charged in the capacitors 63[1] to 63[m] correspond to a gate voltage required to supply I0 to the transistors 51[1] to 51[m].

In a time T02, the wiring 165 (SEL[x]), the wiring 163 (AZ), the wiring 70 (ABU), and the wiring 72 (ATC) are set "L", whereby the transistor 135, the transistor 133, the transistors 50[1] to 50[m], and the transistors 52[1] to 52[m] are turned off.

In a time T11, the wiring 165 (SEL[1]), the wiring 70 (ABU), and the wiring 73 (AOP[1]) are set "H", whereby the transistors 135 in the first-row pixels 11, the transistors 50[1] to 50[m], and the transistor 53[1] are turned off. Then, current corresponding to a difference that is detected by the pixel 11[1,1] is supplied to the wiring 156 (VOUT[1]). If the difference in the pixel 11[1,1] is zero, the value of current supplied to the wiring 156 (VOUT[1]) is I0. Each value of the currents Ip[1] and Ic[1] is equal to I0.

In a time T12, the wiring 73 (AOP[2]) is set "H", whereby the transistor 53[2] is turned on, and the wiring 73 (AOP[1]) is set "L", whereby the transistor 53[1] is turned off. Then, current corresponding to a difference that is detected by the pixel 11[1,2] is supplied to the wiring 156 (VOUT[2]). If the difference in the pixel 11[1,2] is zero, the value of current supplied to the wiring 156 (VOUT[2]) is I0. Each value of the currents Ip[2] and Ic[2] is equal to I0.

In a time T13, the wiring 73 (AOP[2]) is set "L", whereby the transistor 53[2] is turned off. In a time T14, the wiring 73 (AOP[m]) is set "H", whereby the transistor 53[m] is turned on. Then, current corresponding to a difference that is detected by the pixel 11[1,m] is supplied to the wiring 156 (VOUT[m]). If the difference in the pixel 11[1,m] is zero, the value of current supplied to the wiring 156 (VOUT[m]) is I0. Each value of the currents Ip[m] and Ic[m] is equal to I0.

In a time T15, the wiring 165 (SEL[1]), the wiring 70 (ABU), and the wiring 73 (AOP[m]) are set "L", whereby the transistors 135 in the first-row pixels 11, the transistors 50[1] to 50[m], and the transistor 53[m] are turned off. Through the above, the difference detection in the first-row pixels 11 is completed.

In a time T21, the wiring 165 (SEL[2]), the wiring 70 (ABU), and the wiring 73 (AOP[1]) are set "H", whereby the transistors 135 in the second-row pixels 11, the transistors 50[1] to 50[m], and the transistor 53[1] are turned on. Then, current corresponding to a difference that is detected by the pixel 11[2,1] is supplied to the wiring 156 (VOUT[1]). If the difference in the pixel 11[2,1] is zero, the value of current supplied to the wiring 156 (VOUT[1]) is I0. Each value of the currents Ip[1] and Ic[1] is equal to I0.

In a time T22, the wiring 73 (AOP[2]) is set "H", whereby the transistor 53[2] is turned on, and the wiring 73 (AOP[1]) is set "L", whereby the transistor 53[1] is turned off. Then, current corresponding to a difference that is detected by the pixel 11[2,2] is supplied to the wiring 156 (VOUT[2]). If the value of current supplied to the wiring 156 (VOUT[2]) is "I0−ΔI1", the values of the current Ip[2] and the current Ic[2] are equal to "I0−ΔI1" and "I0", respectively; therefore, current having a value of "ΔI1" is supplied through the transistors 53[2] and 54[2].

Note that the current value "I0−ΔI1" is smaller than the current value "I0" in the case where the luminance of light which the photoelectric conversion element 120 receives when the pixel 11[2,2] obtains imaging data of the difference detection frame is higher than the luminance of light which the photoelectric conversion element 120 receives when the pixel 11[2,2] obtains imaging data of the reference frame.

Here, owing to the comparator 64 and the transistor 56, the current "I−" is supplied. In the case where the current "I−" supplied to the transistor 54[2] through the transistor 56 is smaller than "ΔI1," the potential of a + terminal of the comparator 64 decreases, so that the output of the comparator 64 decrease. That is, the gate voltage of the transistor 56 decreases, and a larger amount of current "I−" can be supplied because the transistor 56 is a p-channel transistor. In contrast, in the case where the current "I−" supplied to the transistor 54[2] through the transistor 56 is larger than "ΔI1" the potential of the + terminal of the comparator 64 increases, so that the output of the comparator 64 increases. That is, the gate voltage of the transistor 56 increases, and a smaller amount of current "I−" can be supplied because the transistor 56 is a p-channel transistor.

In addition, a potential which is equal to the potential of the gate of the transistor 56 is applied to the transistor 57, so that current having a value of "n1×I−" obtained by multiplying the current by n1, where n1 means the W (the channel width direction)/L (the channel length direction) ratio of the transistor 57 to the transistor 56, flows to the transistor 57. Furthermore, a buffer composed of the transistor 62 and the transistor 57 sets the signal 36 (TRIG) "H". Note that a bias voltage is applied to the wiring 82 (BIAS). The bias voltage can be determined as appropriate.

In a time T23, the wiring 73 (AOP[2]) is set "L", whereby the transistor 53[2] is turned off. In a time T24, the wiring 73 (AOP[m]) is set "H", whereby the transistor 53[m] is turned on. Then, current corresponding to a difference that is detected by the pixel 11[2,m] is supplied to the wiring 156 (VOUT[m]). If the difference in the pixel 11[2,m] is zero, the value of current supplied to the wiring 156 (VOUT[m]) is I0. Each value of the currents Ip[m] and Ic[m] is equal to I0.

In a time T25, the wiring 165 (SEL[2]), the wiring 70 (ABU), and the wiring 73 (AOP[m]) are set "L", whereby the transistors 135 in the second-row pixels 11, the transistors 50[1] to 50[m], and the transistor 53[m] are turned off. Through the above, the difference detection in the second-row pixels 11 is completed.

In a time T31, the wiring 165 (SEL[2]), the wiring 70 (ABU), and the wiring 73 (AOP[1]) are set "H", whereby the transistors 135 in the second-row pixels 11, the transistors 50[1] to 50[m], and the transistor 53[1] are turned on. Then, current corresponding to a difference that is detected by the pixel 11[n,1] is supplied to the wiring 156 (VOUT[1]). If the difference in the pixel 11[n,1] is zero, the value of current supplied to the wiring 156 (VOUT[1]) is I0. Each value of the currents Ip[1] and Ic[1] is equal to I0.

In a time T32, the wiring 73 (AOP[2]) is set "H", whereby the transistor 53[2] is turned on, and the wiring 73 (AOP[1]) is set "L", whereby the transistor 53[1] is turned off. Then, current corresponding to a difference that is detected by the pixel 11[n,2] is supplied to the wiring 156 (VOUT[2]). If the value of current supplied to the wiring 156 (VOUT[2]) is "I0+ΔI2", the values of the current Ip[2] and the current Ic[2] are equal to "I0+ΔI2" and "I0", respectively; therefore, current having a value of "ΔI1" is supplied through the transistors 53[2] and 55[2].

Note that the current value "I0+ΔI2" is larger than the current value "I0" in the case where the luminance of light which the photoelectric conversion element 120 receives when the pixel 11[2,2] obtains imaging data of the difference detection frame is higher than the luminance of light which the photoelectric conversion element 120 receives when the pixel 11[2,2] obtains imaging data of the reference frame.

Here, owing to the comparator 65 and the transistor 58, the current $I^+$ can be supplied. In the case where the current $I^+$ flowing from the transistor 55[2] to the transistor 58 is smaller than the current ΔI2, the potential of a + terminal of the comparator $CMP^+$ increases, and thus, the output of the comparator 65 increases. That is, the gate voltage of the transistor 58 increases; as a result, it becomes possible that a larger current $I^+$ can be supplied. In contrast, in the case where the current $I^+$ flowing from the transistor 55[2] to the transistor 58 is larger than the current ΔI2, the potential of the + terminal of the comparator $CMP^+$ decreases, and thus, the output of the comparator 65 decreases. That is, the gate voltage of the transistor 58 decreases; as a result, it becomes possible that a smaller current $I^+$ can be supplied.

Furthermore, since a potential that is equal to the potential of the gate of the transistor 58 is applied to the transistor 59, a current $n2 \times I^+$ obtained by multiplying the current $I^+$ by n2, where n2 means the W/L ratio of the transistor 59 to the transistor 58 flows in the transistor 59. The current flowing in the transistor 59 also flows in the transistor 60, and a current $n3 \times n2 \times I^+$ obtained by multiplying by n3, where n3 means the W/L ratio of the transistor 61 to the transistor 60 flows in the transistor 61. Owing to a buffer formed using the transistor 62, the transistor 57, and the transistor 61, the signal 36 (TRIG) is set at "H".

In a time T33, the wiring 73 (AOP[2]) is set "L", whereby the transistor 53[2] is turned off. In a time T34, the wiring 73 (AOP[m]) is set "H", whereby the transistor 53[m] is turned on. Then, current corresponding to a difference that is detected by the pixel 11[n,m] is supplied to the wiring 156 (VOUT[m]). If the difference in the pixel 11[n,m] is zero, the value of current supplied to the wiring 156 (VOUT[m]) is I0. Each value of the currents Ip[m] and Ic[m] is equal to I0.

In a time T35, the wiring 165 (SEL[n]), the wiring 70 (ABU), and the wiring 73 (AOP[m]) are set "L", whereby the transistors 135 in the nth-row pixels 11, the transistors 50[1] to 50[m], and the transistor 53[m] are turned off. Through the above, the difference detection in the nth-row pixels 11 is completed.

In one embodiment of the present invention with the above-described structure, the signal 36 (TRIG) for rewriting imaging data by a simple process without a digital processing for the difference detection can be generated. Such a structure that the separated wirings 73 (AOP[1]) to 73 (AOP[m]) are electrically connected to the transistors 53[1] to 53[m], respectively, allows pixel-by-pixel difference detection and can identify the pixel 11 from which a difference is detected.

Note that the circuit 16 shown in FIG. 17 can be used for the pixel 11 that has a structure different from that in FIG. 5. The timing chart shown in FIG. 18 can be referred to for the operation of the circuit 16 including the pixel 11 that has a structure different from that in FIG. 5.

This embodiment can be implemented in an appropriate combination with any of the structures described in the other embodiments.

Embodiment 5

In this embodiment, specific structure examples of the imaging device of one embodiment of the present invention will be described below with reference to drawings.

Figure 19A:
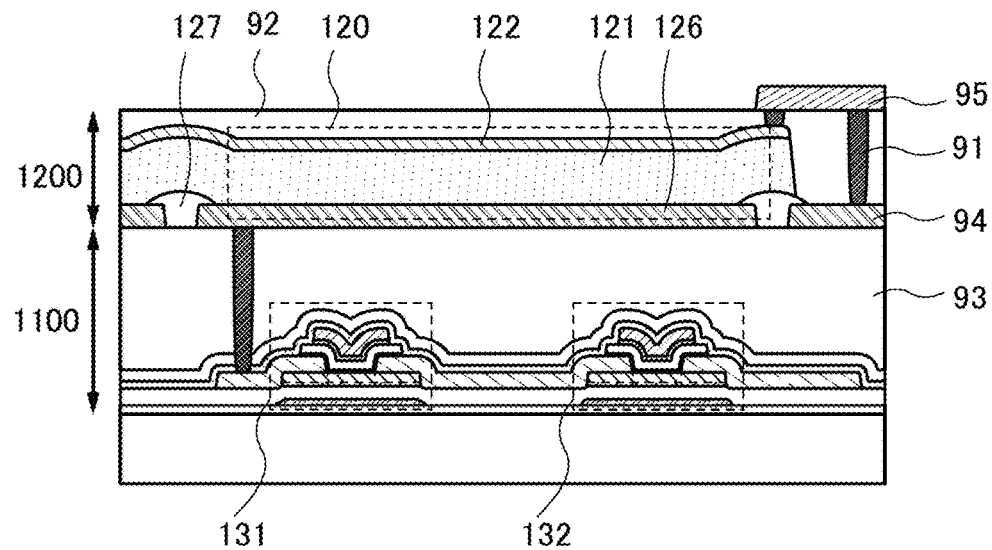
FIGS. 19A to 19C are cross-sectional views illustrating the structure of an imaging device.

FIG. 19A illustrates an example of a cross-sectional view of the imaging device of one embodiment of the present invention and illustrates a specific connection between the photoelectric conversion element 120, the transistor 131, and the transistor 132 which are included in each of the pixels 11 in FIG. 1. Note that the transistors 133 to 135 are not illustrated in FIG. 19A. The imaging device includes a tier 1100 including the transistors 131 to 135 and a tier 1200 including the photoelectric conversion element 120.

Although the wirings, electrodes, and conductors 91 are illustrated as independent components in cross-sectional views in this embodiment, some of them are provided as one component in some cases when they are electrically connected to each other. In addition, a structure in which a gate, a source, or a drain of the transistor is connected to the wirings through the conductor 91 is only an example. The gate, the source, and the drain of the transistor might each function as a wiring.

Over the components, an insulating layer 92, an insulating layer 93, and the like that can function as protective films, interlayer insulating layers, or planarization films are provided. For example, an inorganic insulating film such as a silicon oxide film or a silicon oxynitride film can be used as each of the insulating layers 92 and 93 and the like. Alternatively, an organic insulating film such as an acrylic resin film or a polyimide resin film may be used. Top surfaces of the insulating layers 92 and 93 and the like are preferably planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. In some cases, a layer that is not illustrated in the drawing is included in the stacked-layer structure. One or more of the layers illustrated in the drawing are not included in some cases.

Figure 19B:
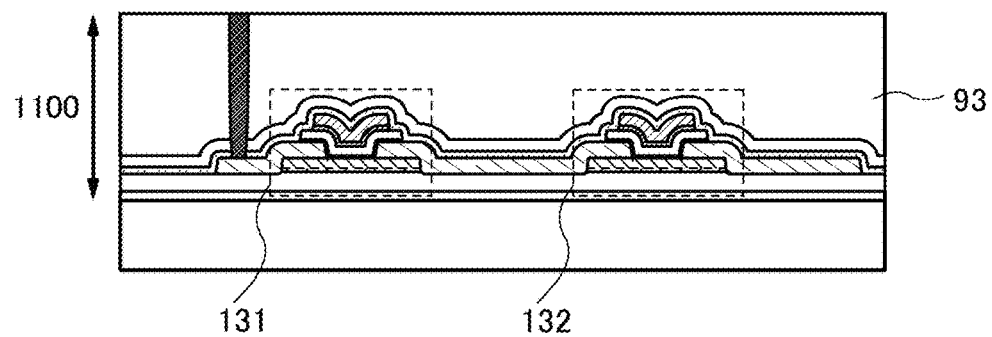
Figure 19C:
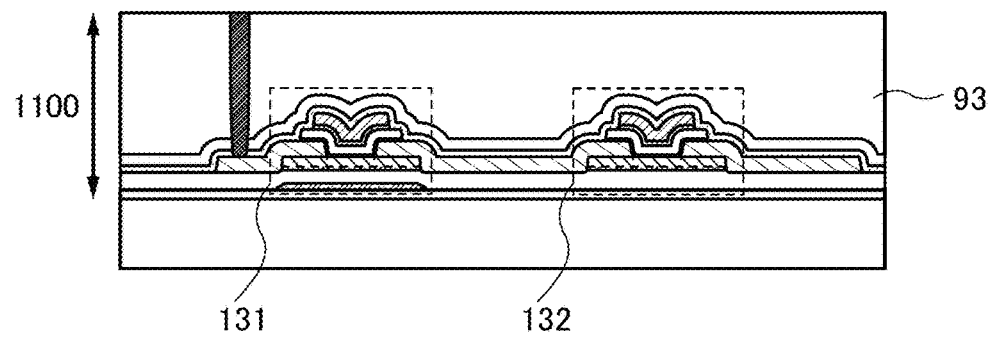

Note that although each transistor includes a back gate in FIG. 19A, each transistor does not necessarily include a back gate as illustrated in FIG. 19B. Alternatively, one or more transistors, for example, only the transistor 131, as illustrated in FIG. 19C, may include a back gate. The back gate might be electrically connected to a front gate of the transistor, which faces the back gate. Note that different fixed potentials might be supplied to the back gate and the front gate. The presence or absence of the back gate can also be applied to another imaging device described in this embodiment.

Any of a variety of elements can be used as the photoelectric conversion element 120 provided in the tier 1200. FIG. 19A illustrates the photoelectric conversion element 120 containing a selenium-based material in a photoelectric conversion layer 121. The photoelectric conversion element 120 containing a selenium-based material has high external quantum efficiency with respect to visible light. Such a photoelectric conversion element can be a highly sensitive sensor in which the amount of amplification of electrons with respect to the amount of incident light is large because of an avalanche phenomenon. Furthermore, the selenium-based material has a high light-absorption coefficient, making the photoelectric conversion layer 121 thin easily.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to visible light and a higher absorption coefficient for visible light than amorphous selenium.

The photoelectric conversion layer 121 may be a layer containing a compound of copper, indium, and selenium (CIS). Alternatively, a layer containing a compound of copper, indium, gallium, and selenium (CIGS) may be used. With the CIS or CIGS, a photoelectric conversion element that can utilize an avalanche phenomenon as in the case of using a single layer of selenium can be formed.

In the photoelectric conversion element 120 containing the selenium-based material, for example, the photoelectric conversion layer 121 can be provided between a light-transmitting conductive layer 122 and an electrode 126 formed using a metal material or the like. Since CIS and CIGS are p-type semiconductors, an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to cause the avalanche phenomenon. Since the OS transistor has higher drain breakdown voltage than the Si transistor, the application of a relatively high voltage to the photoelectric conversion element is easy. Thus, the combination of the OS transistor having high drain breakdown voltage and the photoelectric conversion element containing the selenium-based material in the photoelectric conversion layer can provide a highly sensitive and highly reliable imaging device.

Figure 20A:
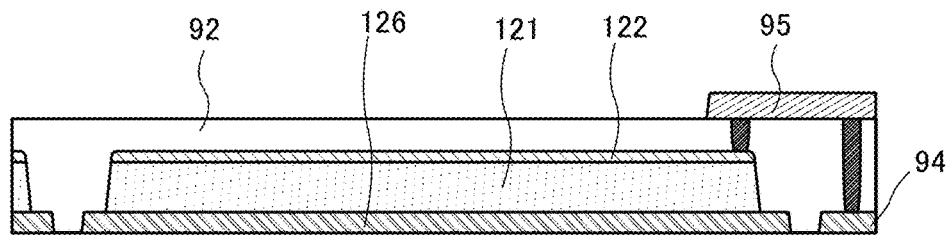
FIGS. 20A to 20D are cross-sectional views illustrating the structure of an imaging device.
Figure 20B:
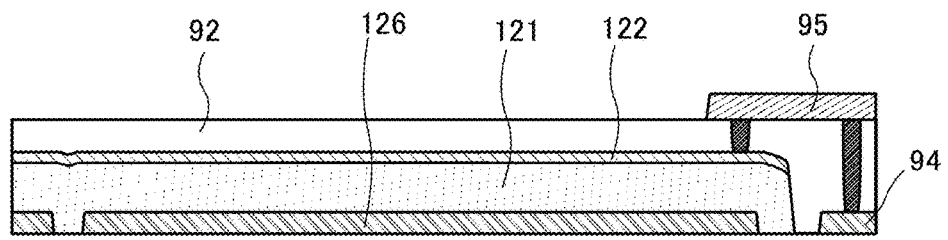
Figure 20C:
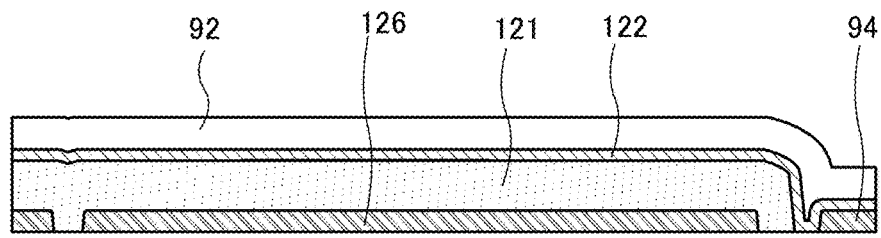
Figure 20D:
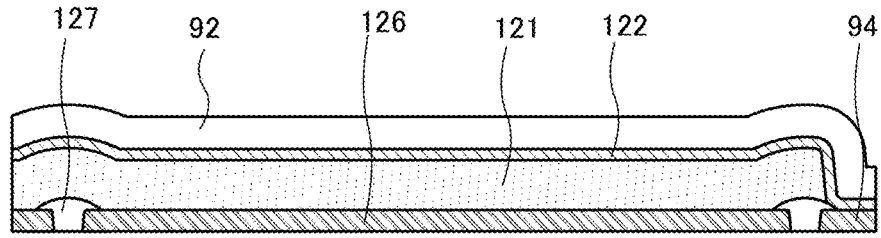

Although the photoelectric conversion layer 121 and the light-transmitting conductive layer 122 are not divided between pixels in FIG. 19A, they may be divided between circuits as illustrated in FIG. 20A. In a region between pixels where the electrode 126 is not provided, a partition wall 127 formed of an insulator is preferably provided, thereby preventing generation of a crack in the photoelectric conversion layer 121 and the light-transmitting conductive layer 122. However, the partition wall 127 is not necessarily provided as illustrated in FIG. 20B. Although the light-transmitting conductive layer 122 and a wiring 94 are connected to each other through a wiring 95 and a conductor 91 in FIG. 19A, the light-transmitting conductive layer 122 and the wiring 94 may be in direct contact with each other as in FIGS. 20C and 20D.

Figure 21A:
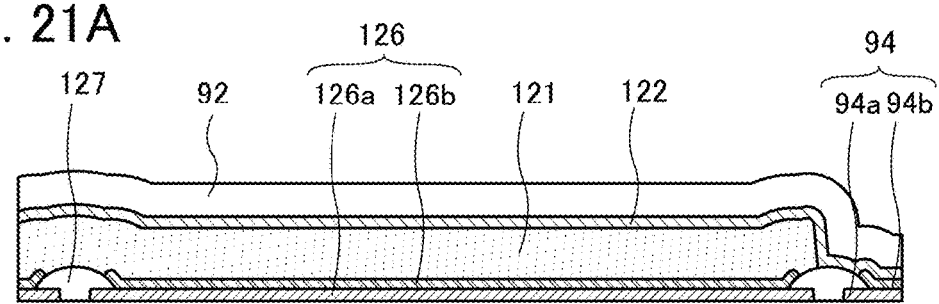
FIGS. 21A and 21B are cross-sectional views illustrating the structure of an imaging device.

The electrode 126, the wiring 94, and the like may each be a multilayer. For example, as illustrated in FIG. 21A, the electrode 126 can include two conductive layers 126a and 126b and the wiring 94 can include two conductive layers 94a and 94b. In the structure in FIG. 21A, for example, the conductive layers 126a and 94a may be made of a low-resistance metal or the like, and the conductive layer 126b may be made of a metal or the like that exhibits an excellent contact property with the photoelectric conversion layer 121. Such a structure can improve the electrical characteristics of the photoelectric conversion element. Furthermore, even when the conductive layer 94a contains a metal that causes electrolytic corrosion by being in contact with the light-transmitting conductive layer 122, the electrolytic corrosion can be prevented because the conductive layer 94b is between the conductive layer 94a and the light-transmitting conductive layer 122.

The conductive layers 126a and 94a can be formed using, for example, aluminum, titanium, or a stack of titanium, aluminum, and titanium that are layered in this order. The conductive layers 126b and 94b can be formed using, for example, molybdenum, tungsten, or the like.

Figure 21B:
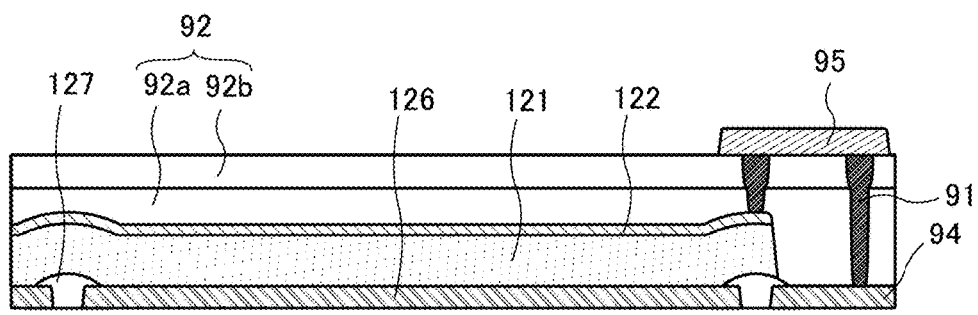

The insulating layer 92 and the like may each be a multilayer. In the case where the insulating layer 92 includes insulating layers 92a and 92b that have different etching rates as illustrated in FIG. 21B, for example, the conductor 91 has a difference in level. In the case where another insulating layer used as an interlayer insulating layer or a planarization film is a multilayer, the conductor 91 also has a difference in level. Although the insulating layer 92 is formed using two layers here, the insulating layer 92 and another insulating layer may each be formed using three or more layers.

Note that the partition wall 127 can be formed using an inorganic insulator, an insulating organic resin, or the like. The partition wall 127 may be colored black or the like in order to shield the transistors and the like from light and/or to determine the area of a light-receiving portion in each pixel.

As the photoelectric conversion element 120, a PIN diode element formed using an amorphous silicon film, a microcrystalline silicon film, or the like may be used.

Figure 22:
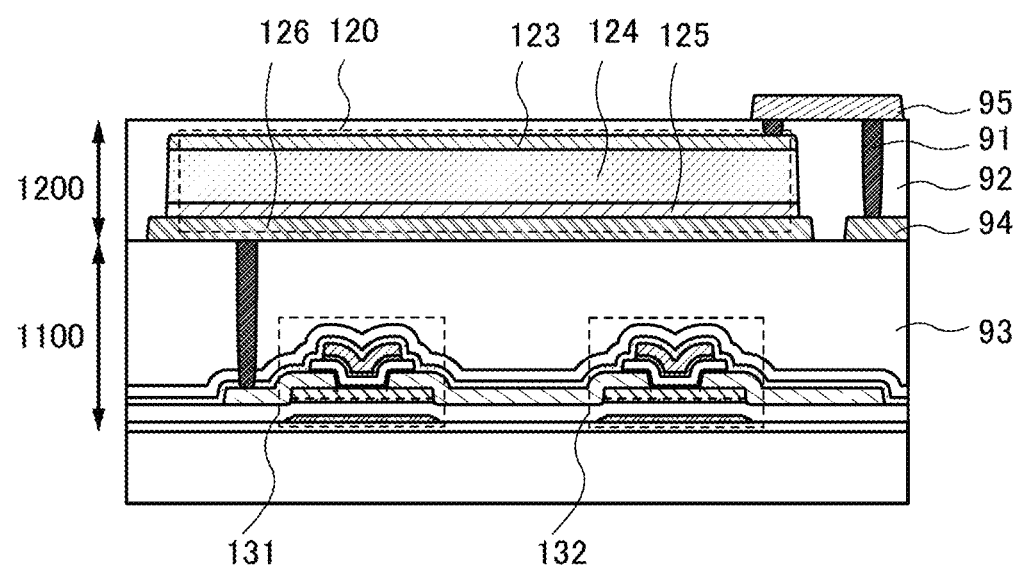
FIG. 22 is a cross-sectional view illustrating the structure of an imaging device.

FIG. 22 illustrates an example in which a thin film PIN photodiode is used as the photoelectric conversion element 120. In the photodiode, a p-type semiconductor layer 125, an i-type semiconductor layer 124, and an n-type semiconductor layer 123 are stacked in this order. The i-type semiconductor layer 124 is preferably formed using amorphous silicon. The n-type semiconductor layer 123 and the p-type semiconductor layer 125 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and thus can easily sense weak visible light.

In the photoelectric conversion element 120 illustrated in FIG. 22, the p-type semiconductor layer 125 is electrically connected to the electrode 126. Furthermore, the n-type semiconductor layer 123 is electrically connected to the wiring 94 through the conductor 91.

FIGS. 23A to 23F show other examples of the structure of the photoelectric conversion element 120 having a configuration of a PIN thin film photodiode and the connection between the photoelectric conversion element 120 and the wirings. Note that the structure of the photoelectric conversion element 120 and the connection between the photoelectric conversion element 120 and the wirings are not limited thereto, and other configurations may be applied.

Figure 23A:
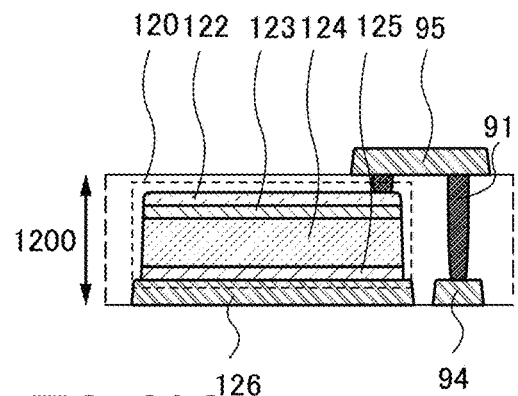
FIGS. 23A to 23F are cross-sectional views illustrating the structure of an imaging device.

FIG. 23A illustrates a structure of the photoelectric conversion element 120 that includes the light-transmitting conductive layer 122 in contact with the n-type semiconductor layer 123. The light-transmitting conductive layer 122 serves as an electrode and can increase the output current of the photoelectric conversion element 120.

For the light-transmitting conductive layer 122, the following can be used: indium tin oxide; indium tin oxide containing silicon; indium oxide containing zinc; zinc oxide; zinc oxide containing gallium; zinc oxide containing aluminum; tin oxide;

tin oxide containing fluorine; tin oxide containing antimony; graphene; or the like. The light-transmitting conductive layer 122 is not limited to a single layer, and may be a stacked layer of different films.

Figure 23B:
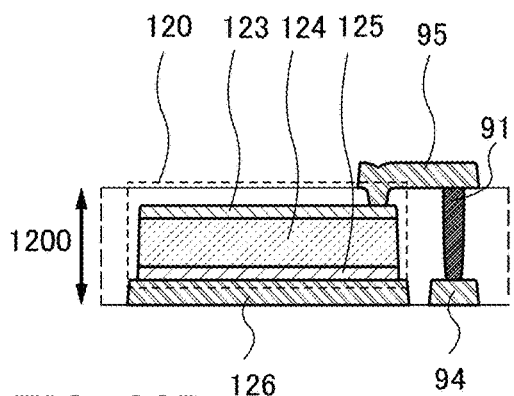

FIG. 23B illustrates a structure in which the n-type semiconductor layer 123 of the photoelectric conversion element 120 is directly connected to the wiring 95.

Figure 23C:
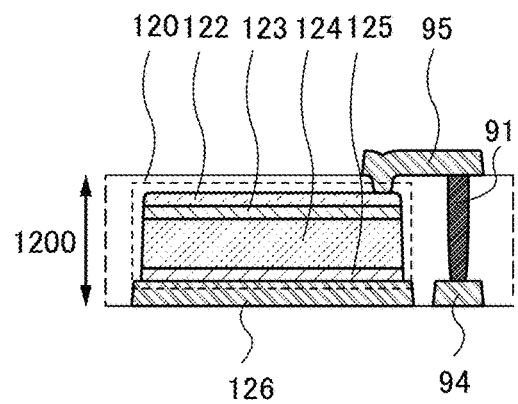

FIG. 23C illustrates a structure of the photoelectric conversion element 120 in which the light-transmitting conductive layer 122 is in contact with the n-type semiconductor layer 123 and the wiring 95 is electrically connected to the light-transmitting conductive layer 122.

Figure 23D:
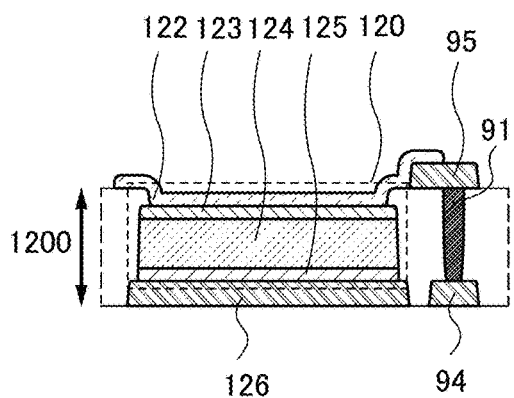

FIG. 23D illustrates a structure in which an opening exposing the n-type semiconductor layer 123 is provided in an insulating layer covering the photoelectric conversion element 120, and the light-transmitting conductive layer 122 that covers the opening is electrically connected to the wiring 95.

Figure 23E:
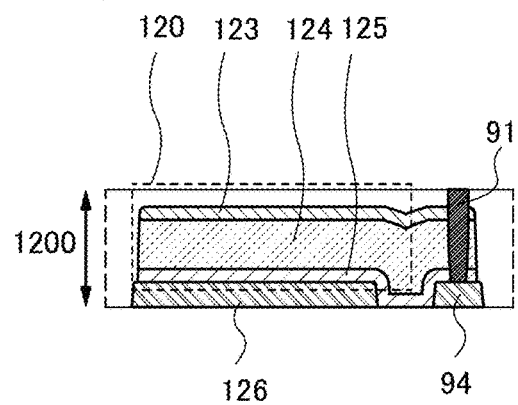

FIG. 23E illustrates a structure including the conductor 91 which penetrates the photoelectric conversion element 120. In the structure, the wiring 94 is electrically connected to the n-type semiconductor layer 123 through the conductor 91. Note that in the drawing, the wiring 94 appears to be electrically connected to the electrode 126 through the p-type semiconductor layer 125. However, because of a high electric resistance in the lateral direction of the p-type semiconductor layer 125, the resistance between the wiring 94 and the electrode 126 is extremely high when there is an appropriate distance therebetween. Thus, the photoelectric conversion element 120 can have diode characteristics without a short circuit between the anode and the cathode. Note that two or more conductors 91 that are electrically connected to the n-type semiconductor layer 123 may be provided.

Figure 23F:
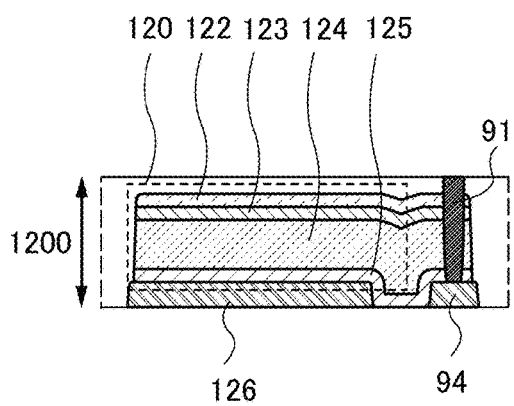

FIG. 23F illustrates a structure in which the photoelectric conversion element 120 in FIG. 23E is provided with the light-transmitting conductive layer 122 in contact with the n-type semiconductor layer 123.

Note that each of the photoelectric conversion elements 120 illustrated in FIGS. 23D to 23F has an advantage of having a large light-receiving area because wirings and the like do not overlap with a light-receiving region.

Figure 24:
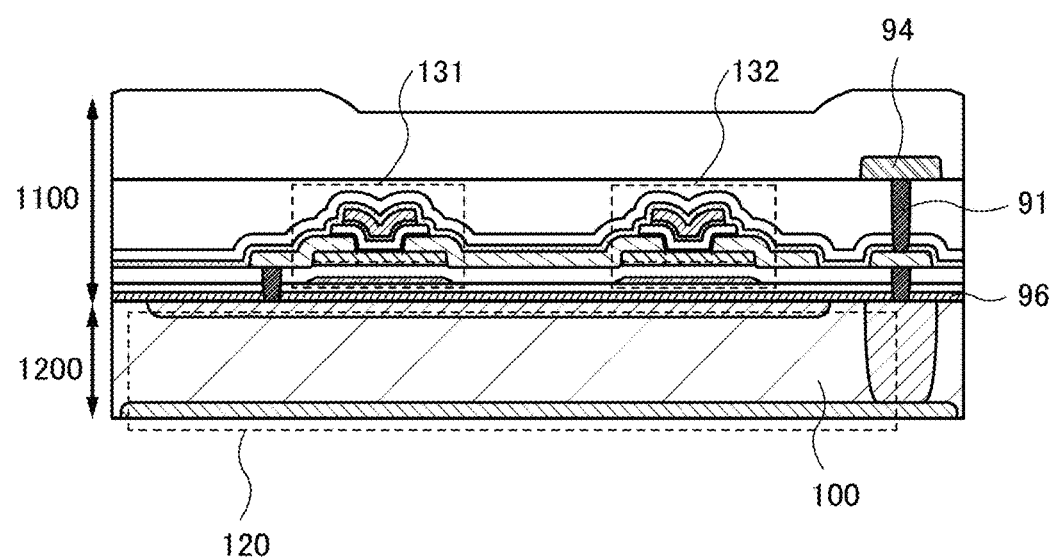
FIG. 24 is a cross-sectional view illustrating the structure of an imaging device.

Alternatively, as illustrated in FIG. 24, the photoelectric conversion element 120 may be a photodiode including a silicon substrate 100 as a photoelectric conversion layer.

The photoelectric conversion element 120 formed using the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 121 does not need to be divided between circuits as illustrated in FIG. 19A. Therefore, the imaging device of one embodiment of the present invention can be manufactured with a high yield at low cost. In contrast, a photodiode including the silicon substrate 100 as the photoelectric conversion layer requires difficult processes such as a polishing process and a bonding process.

Figure 25A:
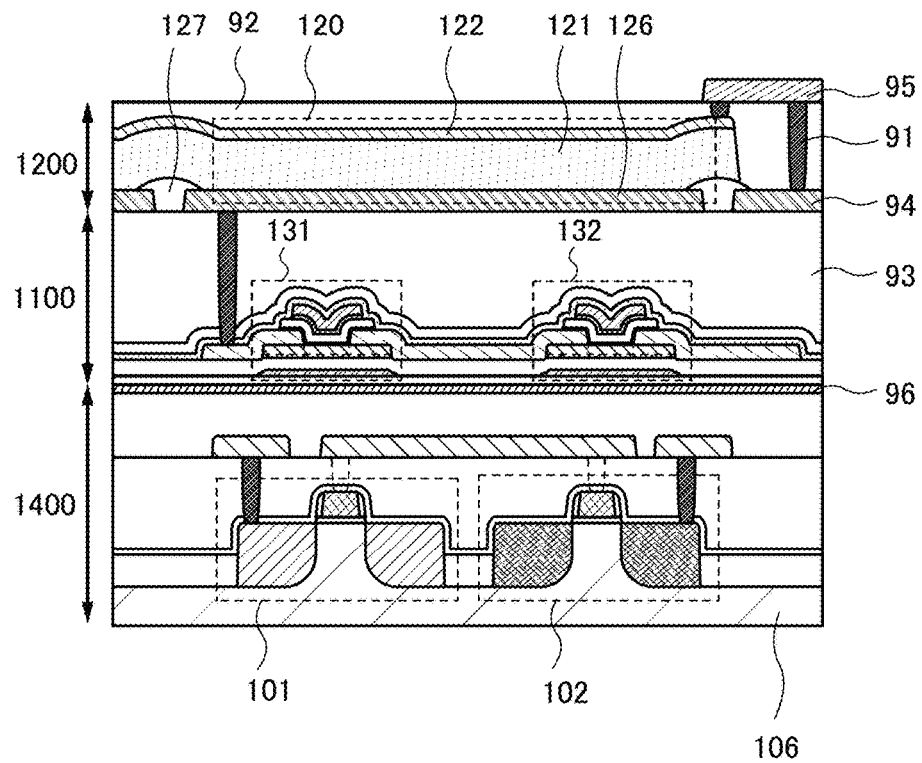
FIGS. 25A to 25C are cross-sectional views and a circuit diagram illustrating the structure of an imaging device.
Figure 25B:
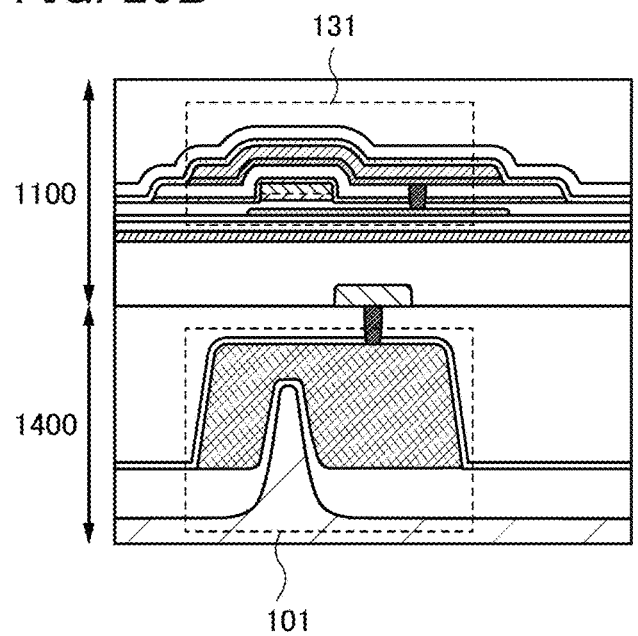

Furthermore, in the imaging device of one embodiment of the present invention, a stack including a silicon substrate 106 in which a circuit is formed may be used. For example, as illustrated in FIG. 25A, the pixel circuit may overlap with a tier 1400 that includes a transistor 101 and a transistor 102 whose active regions are formed in the silicon substrate 106. FIG. 25B is a cross-sectional view illustrating the transistors in the channel width direction.

Figure 25C:
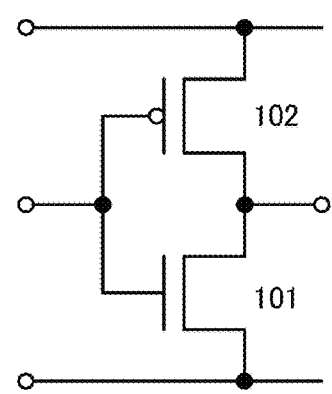

The circuit formed in the silicon substrate 106 is capable of reading a signal outputted from the pixel circuit and converting the signal, for example. The circuit may include, for example, a CMOS inverter as illustrated in the circuit diagram in FIG. 25C. A gate of the transistor 101 (n-channel transistor) is electrically connected to a gate of the transistor 102 (p-channel transistor). One of a source and a drain of one of the transistors 101 and 102 is electrically connected to one of a source and a drain of the other transistor. The other of the source and the drain of the one transistor and the other of the source and the drain of the other transistor are electrically connected to different wirings.

Each of the silicon substrate 100 and the silicon substrate 106 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 24 and FIG. 25A, an insulating layer 96 is provided between a region including an oxide semiconductor transistor and a region including a Si device (a Si transistor or a Si photodiode).

Dangling bonds of silicon are terminated with hydrogen in insulating layers provided in the vicinities of the active regions of the transistors 101 and 102. Therefore, the hydrogen has an effect of improving the reliability of the transistors 101 and 102. Meanwhile, hydrogen in insulating layers provided in the vicinity of the oxide semiconductor layer that is the active layer of the transistor 131 or the like causes generation of carriers in the oxide semiconductor layer, and thus may reduce the reliability of the transistor 131 or the like. For this reason, the insulating layer 96 that can have a function of preventing diffusion of hydrogen is preferably provided between one layer including the Si transistor and another layer stacked thereover that includes the OS transistor. Hydrogen is confined in the one layer owing to the insulating layer 96, so that the reliability of the transistors 101 and 102 can be improved. Furthermore, diffusion of hydrogen from the one layer to the other layer is inhibited, leading to an improvement in the reliability of the transistor 131 or the like.

The insulating layer 96 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIG. 25A, a circuit (e.g., a driver circuit) formed in the silicon substrate 106, the transistor 131 or the like, and the photoelectric conversion element 120 can overlap with each other; thus, the integration degree of pixels can be increased. In other words, the resolution of the imaging device can be increased. Such a structure is suitable for an imaging device with, for example, 4K2K, 8K4K, or 16K8K pixels. Note that since the 8K4K imaging device includes thirty-three million pixels, it can also be referred to as "33 M." Furthermore, for example, a structure may be employed in which Si transistors are formed as the transistors 134 and 135 included in the pixel 11 and there is a region where the transistors 134 and 135 overlap with the transistors 131 to 133 and the photoelectric conversion element 120. In that case, the transistors 131 to 133 are OS transistors.

In the imaging device in FIG. 25A, no photoelectric conversion element is provided on the silicon substrate 106. Therefore, an optical path for the photoelectric conversion element 120 can be ensured without being influenced by the transistors or wirings, and a pixel with a high aperture ratio can be formed.

Figure 26A:
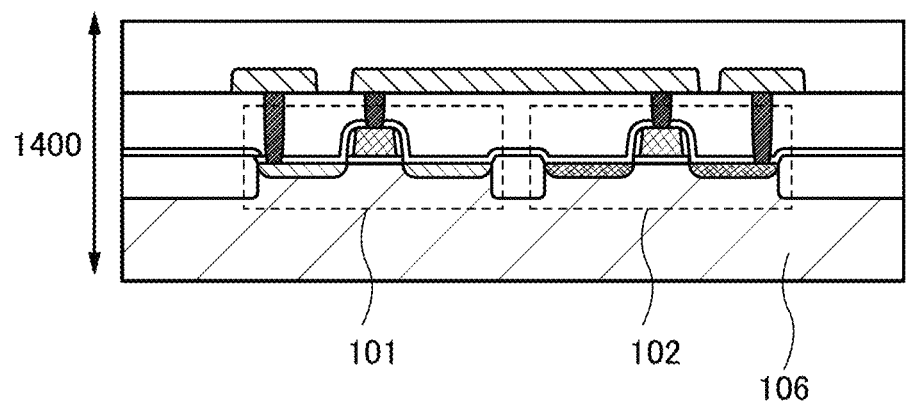
FIGS. 26A and 26B are cross-sectional views illustrating the structure of an imaging device.
Figure 26B:
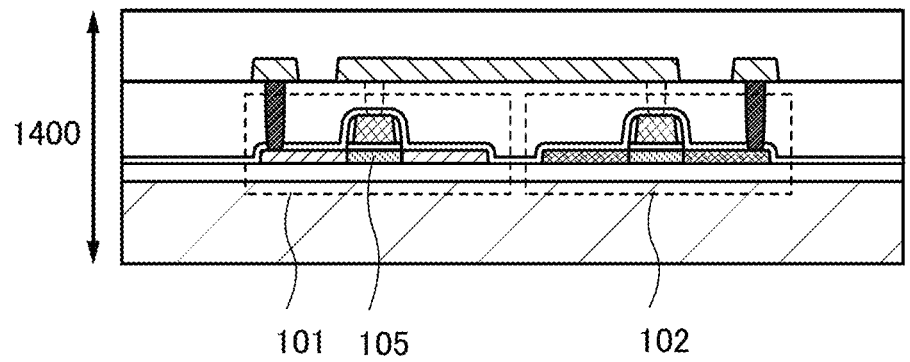

Although FIGS. 25A and 25B show fin type Si transistors, planar type transistors may be used as illustrated in FIG. 26A. Alternatively, as illustrated in FIG. 26B, transistors each including an active layer 105 formed using a silicon thin film may be used. The active layer 105 can be formed using polycrystalline silicon or single crystal silicon of a silicon-on-insulator (SOI) structure.

Figure 27:
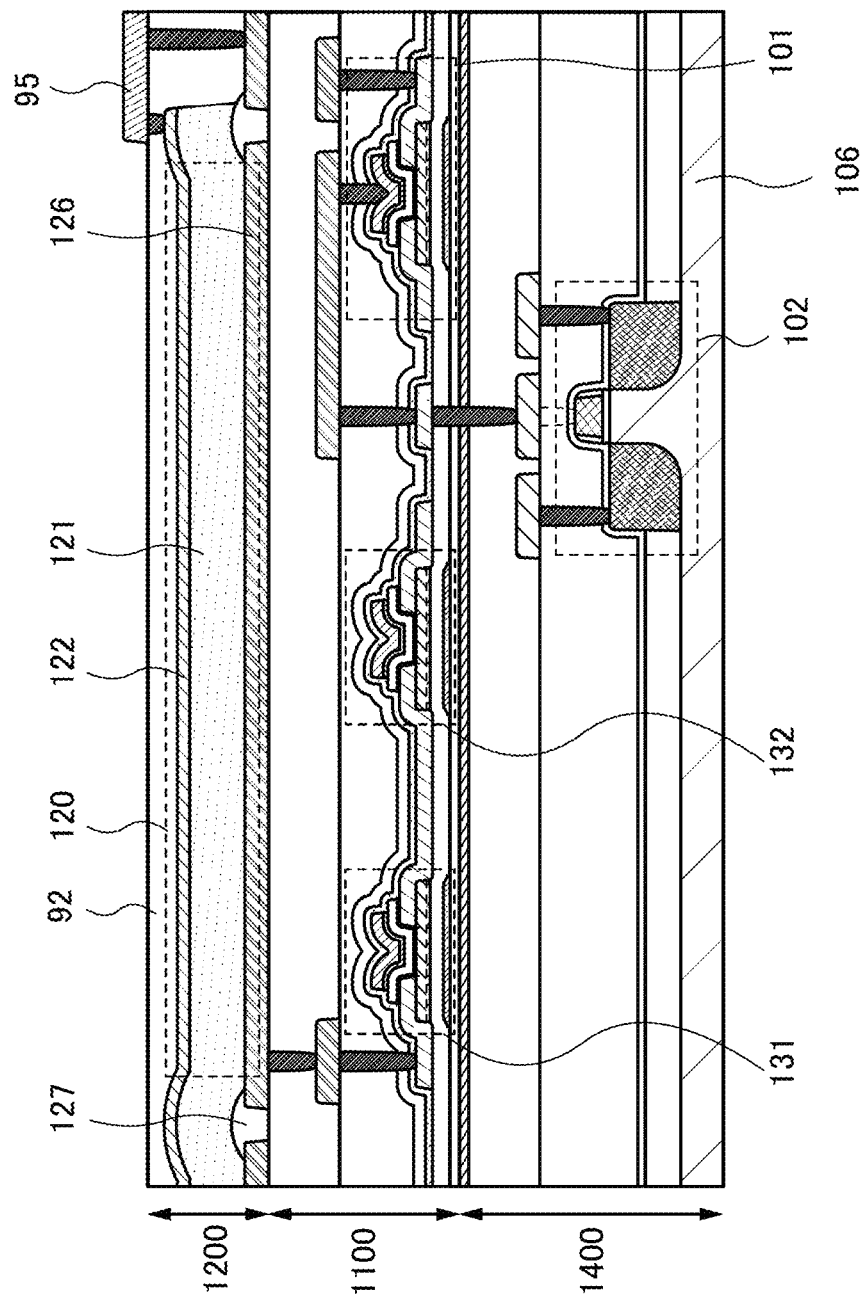
FIG. 27 is a cross-sectional view illustrating the structure of an imaging device.

The imaging device of one embodiment of the present invention can also have a structure in FIG. 27.

An imaging device in FIG. 27 is a modification example of the imaging device in FIG. 25A. A CMOS inverter is formed using an OS transistor and a Si transistor.

Here, the transistor 102 provided in the tier 1400 is a p-channel Si transistor, and the transistor 101 provided in the tier 1100 is an n-channel OS transistor. When only the p-channel transistor is provided in the silicon substrate 106, a step of forming a well, an n-type impurity layer, or the like can be omitted.

Although selenium or the like is used for the photoelectric conversion element 120 in the imaging device in FIG. 27, a thin film PIN photodiode may be used as in FIG. 22.

In the imaging device in FIG. 27, the transistor 101 can be formed through the same process as the transistors 131 and 132 formed in the tier 1100. Thus, the manufacturing process of the imaging device can be simplified.

Figure 28:
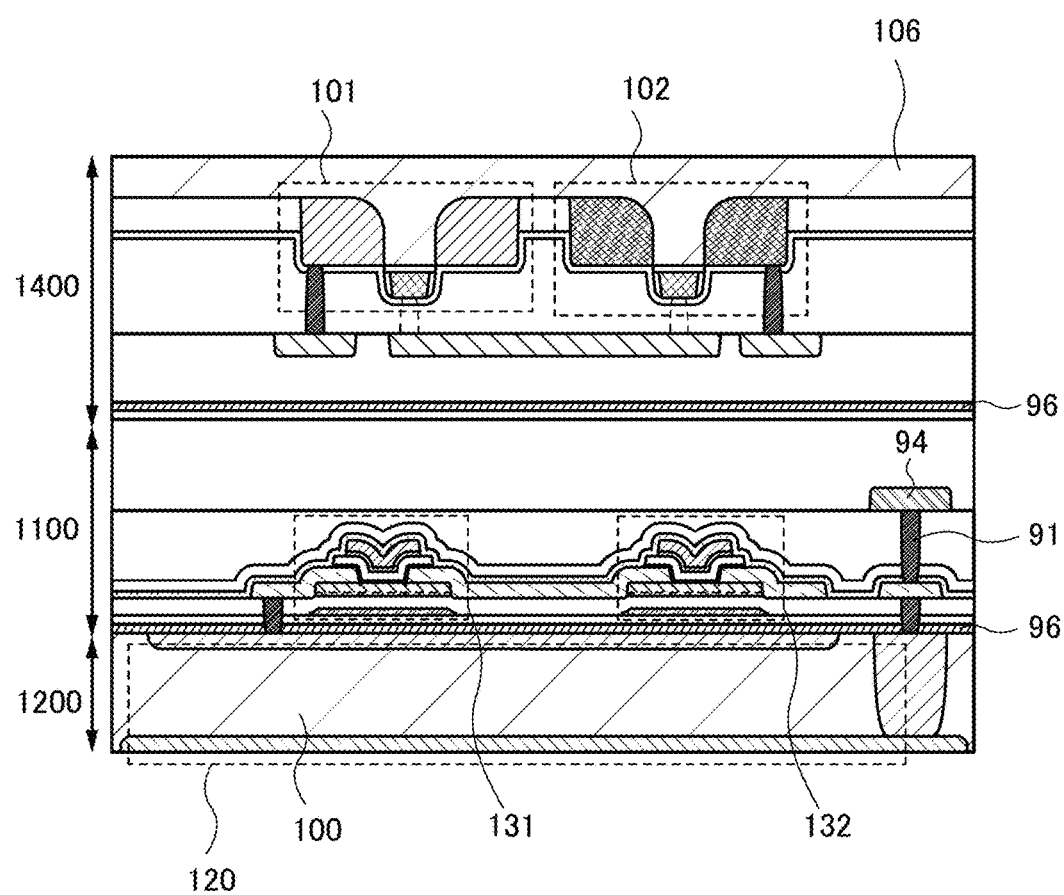
FIG. 28 is a cross-sectional view illustrating a structure of an imaging device.

As illustrated in FIG. 28, the imaging device of one embodiment of the present invention may have a structure where a pixel and the silicon substrate 106 in which a circuit is formed are attached to each other. Note that the pixel includes a photodiode formed in the silicon substrate 100 and OS transistors formed over the photodiode. Such a structure facilitates an increase in the effective area of the photodiode formed in the silicon substrate 100. Furthermore, when the integration degree of the circuit formed in the silicon substrate 106 is improved using miniaturized Si transistors, a high-performance semiconductor device can be provided.

Figure 29A:
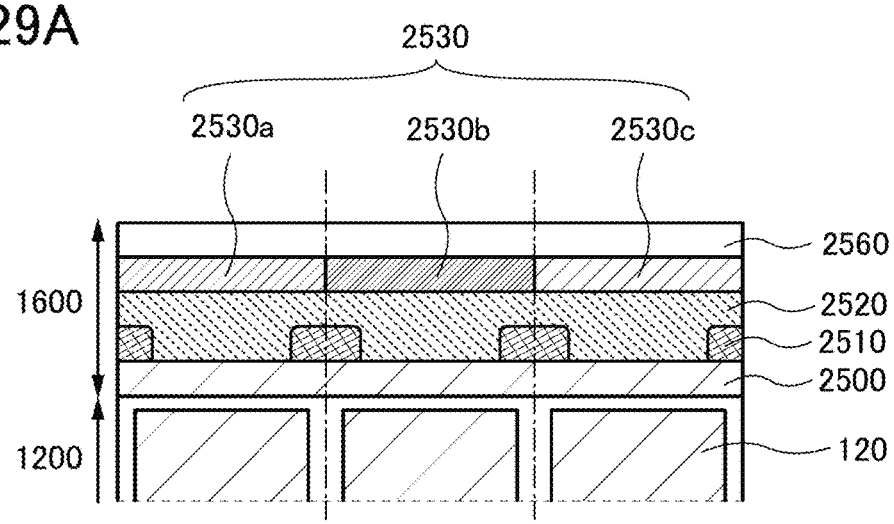
FIGS. 29A to 29C are cross-sectional views each illustrating a structure of an imaging device.

FIG. 29A is a cross-sectional view of an example of a mode in which a color filter and the like are added to the imaging device. The cross-sectional view illustrates part of a region including pixel circuits of three pixels. An insulating layer 2500 is formed over the tier 1200 where the photoelectric conversion element 120 is formed. As the insulating layer 2500, a silicon oxide film or the like with a high visible-light transmitting property can be used. A silicon nitride film may be stacked as a passivation film. Furthermore, a dielectric film of hafnium oxide or the like may be stacked as an anti-reflection film.

A light-blocking layer 2510 may be formed over the insulating layer 2500. The light-blocking layer 2510 can have a function of inhibiting color mixing of light passing through the color filter. The light-blocking layer 2510 can be formed using a metal layer of aluminum, tungsten, or the like, or a stack including the metal layer and a dielectric film that can function as an anti-reflection film.

An organic resin layer 2520 can be formed as a planarization film over the insulating layer 2500 and the light-blocking layer 2510. A color filter 2530 (a color filter 2530a, a color filter 2530b, or a color filter 2530c) is formed in each pixel. For example, the color filter 2530a, the color filter 2530b, and the color filter 2530c each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 29B:
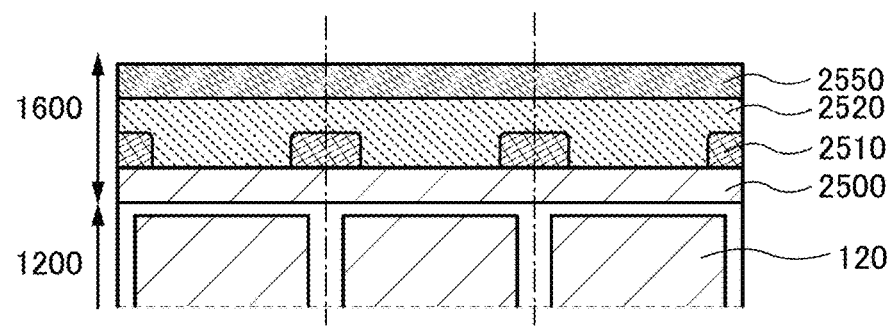

As illustrated in FIG. 29B, an optical conversion layer 2550 may be used instead of the color filter 2530. Such a structure enables the imaging device to take images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

When a scintillator is used for the optical conversion layer 2550, an imaging device that takes an image visualizing the intensity of radiation, which is used for an X-ray imaging device or the like, can be obtained. Radiation such as X-rays that passes through a subject to enter a scintillator is converted into light (fluorescence) such as visible light or ultraviolet light owing to a phenomenon known as photoluminescence. Then, the photoelectric conversion element 120 detects the light to obtain image data. Furthermore, the imaging device having the structure may be used in a radiation detector or the like.

A scintillator is formed using a substance that, when irradiated with radiation such as X-rays or gamma-rays, absorbs energy of the radiation to emit visible light or ultraviolet light, or a material containing the substance. Materials such as $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO and a resin or ceramics in which any of the materials is dispersed are known, for example.

In the photoelectric conversion element 120 containing a selenium-based material, radiation such as X-rays can be directly converted into charge; thus, the scintillator is unnecessary.

A microlens array 2540 may be provided over the color filters 2530a, 2530b, and 2530c. Light transmitting lenses included in the microlens array 2540 passes through the color filters positioned thereunder and enters the photoelectric conversion element 120. Note that a region other than the tier 1200 in FIGS. 29A to 29C is referred to as a layer 1600.

Figure 29C:
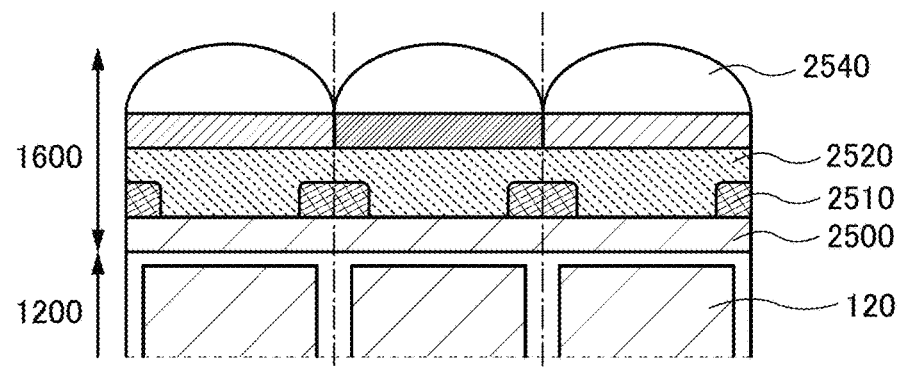
Figure 31:
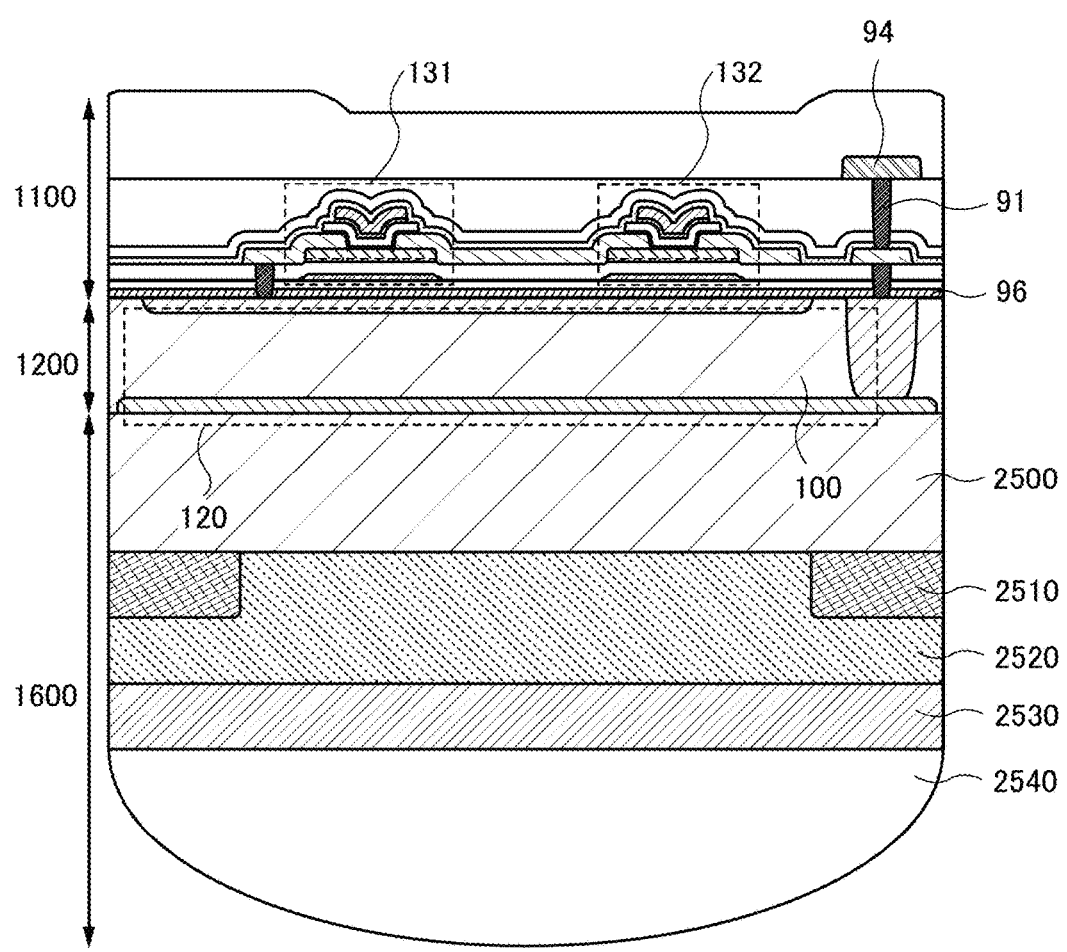
FIG. 31 is a cross-sectional view illustrating a structure of an imaging device.

The specific structure of the imaging device in FIG. 29C is illustrated in FIG. 30 by taking an example of the imaging device in FIG. 28A. In addition, the specific structure of the imaging device in FIG. 29C is illustrated in FIG. 31 by taking an example of the imaging device in FIG. 33.

Figure 32:
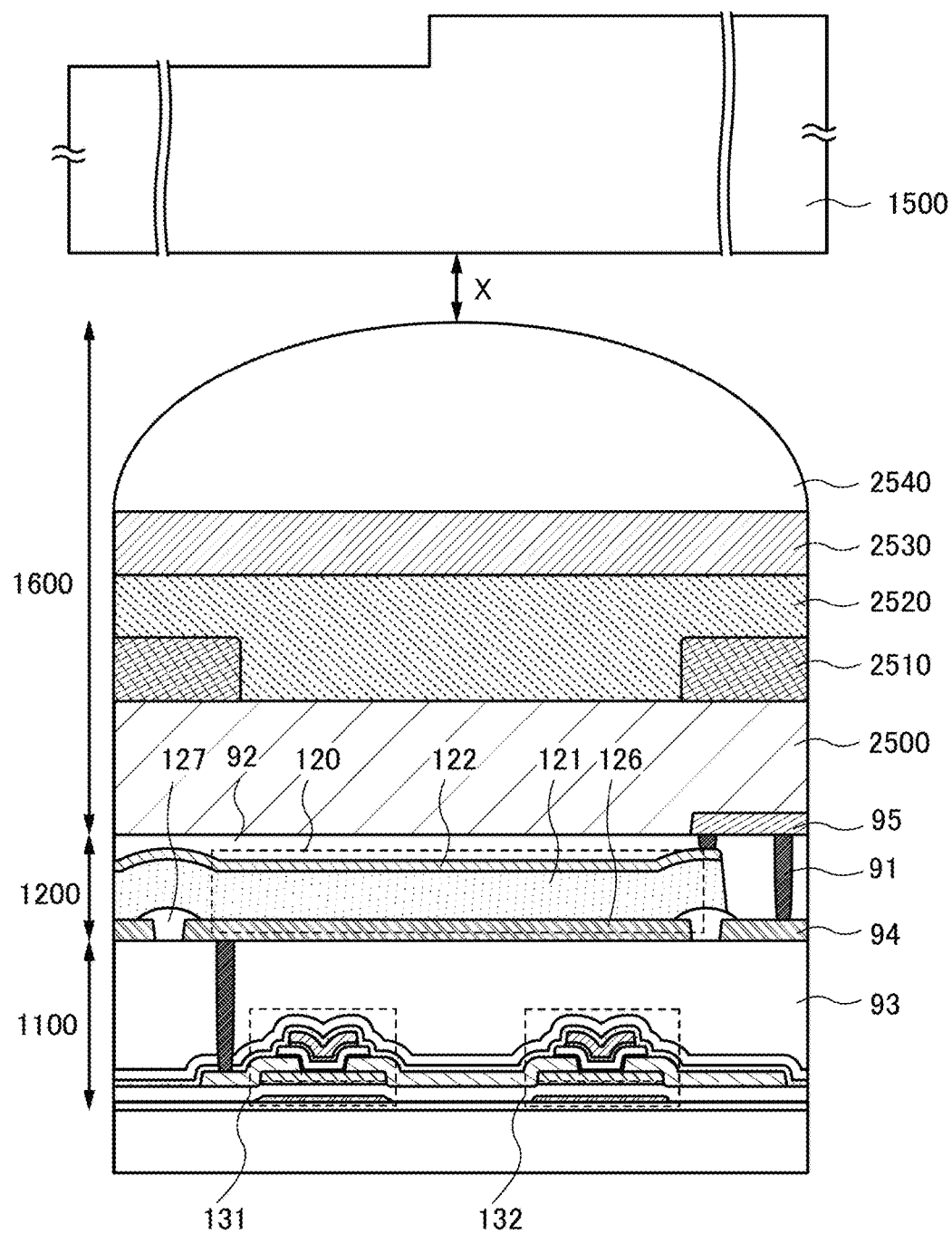
FIG. 32 is a cross-sectional view illustrating a structure of an imaging device.
Figure 33:
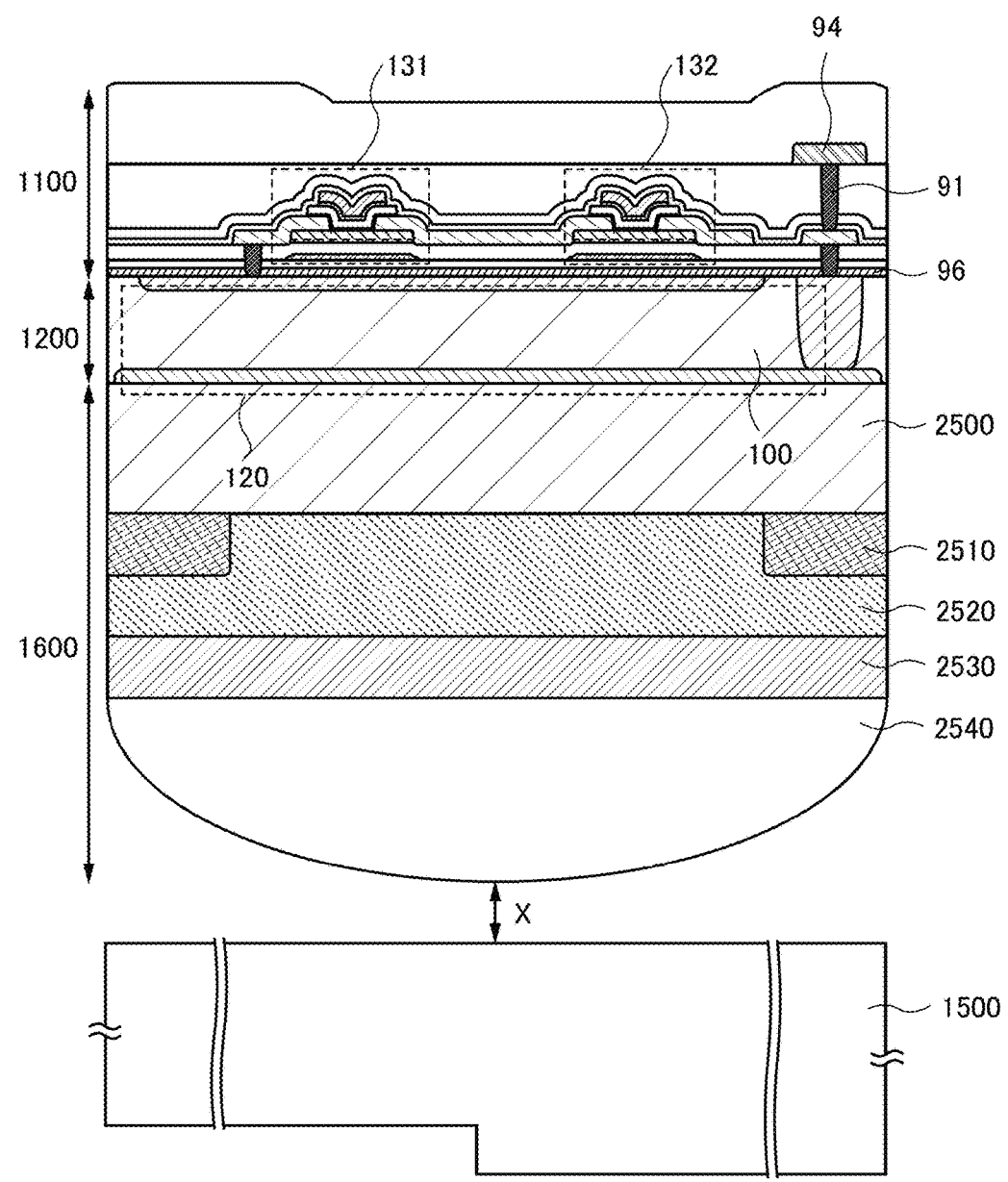
FIG. 33 is a cross-sectional view illustrating a structure of an imaging device.

The imaging device of one embodiment of the present invention may be combined with a diffraction grating 1500 as illustrated in FIG. 32 and FIG. 33. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. For example, an inorganic insulating film such as a silicon oxide film or a silicon oxynitride film can be used. Alternatively, an organic insulating film such as an acrylic resin film or a polyimide resin film may be used. Further alternatively, a stack including the inorganic insulating film and the organic insulating film may be used.

The diffraction grating 1500 can be formed by a lithography process using a photosensitive resin or the like. Alternatively, the diffraction grating 1500 can be formed by a lithography process and an etching process. Further alternatively, the diffraction grating 1500 can be formed by nanoimprint lithography, laser scribing, or the like.

Note that a space X may be provided between the diffraction grating 1500 and the microlens array 2540. The space X can be less than or equal to 1 mm, and preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Further alternatively, a liquid such as silicone oil may be provided. Even in the case where the microlens array 2540 is not provided, the space X may be provided between the color filter 2530 and the diffraction grating 1500.

As illustrated in FIG. 34A1 and FIG. 34B1, the imaging device of one embodiment of the present invention may be bent. FIG. 34A1 illustrates a state in which the imaging device is bent in the direction of dashed-two dotted line X1-X2.

FIG. 34A2 is a cross-sectional view illustrating a portion indicated by dashed-two dotted line X1-X2 in FIG. 34A1. FIG. 34A3 is a cross-sectional view illustrating a portion indicated by dashed-two dotted line Y1-Y2 in FIG. 34A1.

FIG. 34B1 illustrates a state where the imaging device is bent in the direction of dashed-two dotted line X3-X4 and the direction of dashed-two dotted line Y3-Y4. FIG. 34B2 is a cross-sectional view illustrating a portion indicated by dashed-two dotted line X3-X4 in FIG. 34B1. FIG. 34B3 is a cross-sectional view illustrating a portion indicated by dashed-two dotted line Y3-Y4 in FIG. 34B1.

Bending the imaging device can reduce field curvature and astigmatism. Thus, the optical design of a lens or the like, which is used in combination of the imaging device, can be facilitated. For example, the number of lenses used for aberration correction can be reduced; accordingly, the size or weight of semiconductor device or the like including the imaging device can be easily reduced. In addition, the quality of a captured image can be improved.

This embodiment can be implemented in appropriate combination with any of the structures described in the other embodiments.

Embodiment 6

In this embodiment, the configuration of the display device 23 described in Embodiment 1 will be described in detail with reference to drawings.

Figure 35A:
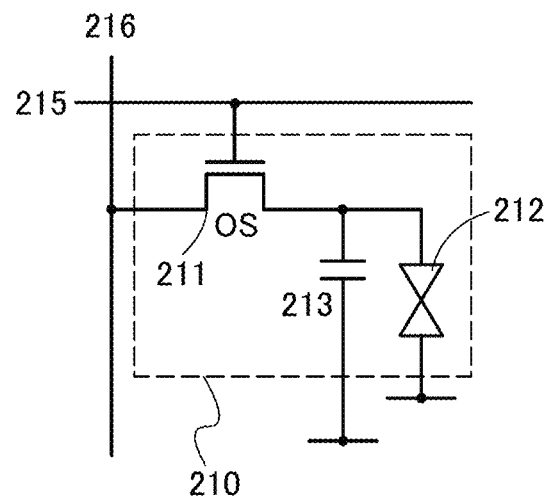
FIGS. 35A and 35B each illustrate a pixel circuit of a display device.
Figure 35B:
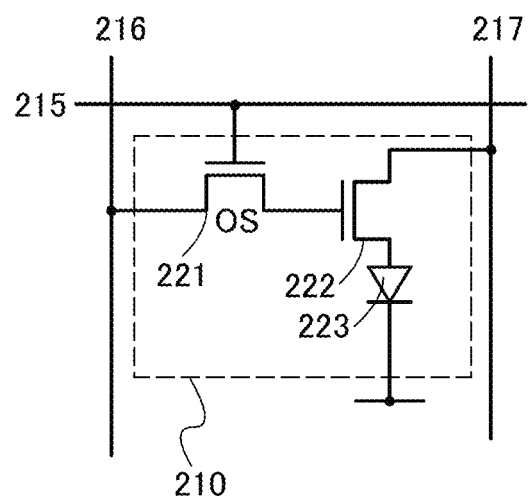

FIGS. 35A and 35B are circuit diagrams each illustrating a configuration example of the pixel 210 included in the display device 23. FIG. 35A illustrates an example of a pixel in which a liquid crystal element is used as a display element, and FIG. 35B illustrates an example of a pixel in which a light-emitting element is used as a display element.

The pixel 210 illustrated in FIG. 35A includes a transistor 211, a liquid crystal element 212, and a capacitor 213.

A gate of the transistor 211 is electrically connected to the wiring 215. One of a source and a drain of the transistor 211 is electrically connected to the wiring 216. The other of the source and the drain of the transistor 211 is electrically connected to one terminal of the liquid crystal element 212 and one terminal of the capacitor 213.

The transistor 211 can serve as a switching element for controlling an electrical connection between the liquid crystal element 212 and the wiring 216. The transistor 211 is turned on or off by using a scan signal inputted from the wiring 215. Note that an OS transistor whose off-state current is low is suitable for the transistor 211.

The pixel 210 illustrated in FIG. 35B includes a transistor 221, a transistor 222, and a light-emitting element 223.

A gate of the transistor 221 is electrically connected to the wiring 215. One of a source and a drain of the transistor 221 is electrically connected to the wiring 216. The other of the source and the drain of the transistor 221 is electrically connected to a gate of the transistor 222. One of a source and a drain of the transistor 222 is electrically connected to a wiring 217. The other of the source and the drain of the transistor 222 is electrically connected to one terminal of the light-emitting element 223.

The transistor 221 is a switching element for controlling an electrical connection between the gate of the transistor 222 and the wiring 216. The transistor 221 is turned on or off by using a scan signal inputted from the wiring 215. Note that an OS transistor whose off-state current is low is suitable for the transistor 221.

In the circuit diagrams illustrated in FIGS. 35A and 35B, "OS" is written beside a circuit symbol of an OS transistor for clarification.

Note that a transistor with low off-state current is not necessarily used in the pixel 210 as long as a pixel can retain image data in the second mode during which the imaging data 31 is not output. The pixel 210 may include a memory that can retain image data.

Figure 36A:
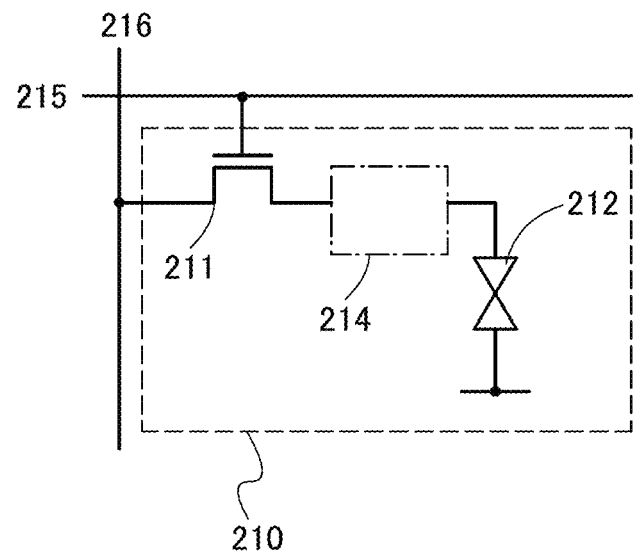
FIGS. 36A and 36B each illustrate a pixel circuit of a display device.
Figure 36B:
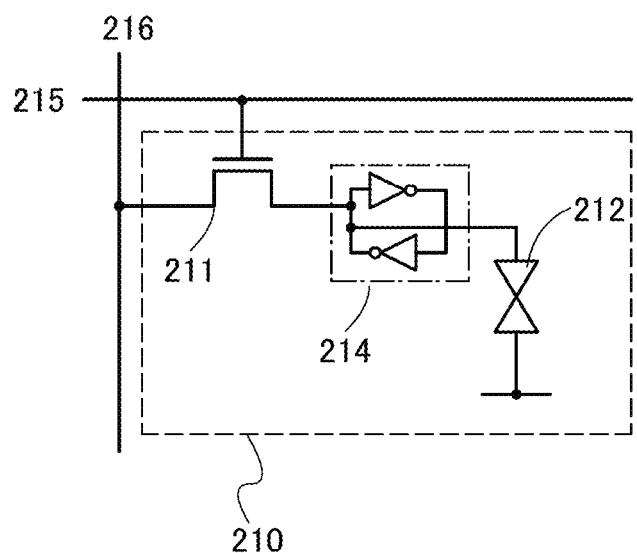

FIG. 36A illustrates the pixel 210 that includes a memory. Owing to a memory 214, the pixel 210 can retain video data. As the memory, a memory circuit such as a static random access memory (SRAM) or a dynamic random access memory (DRAM) may be used. FIG. 36B illustrates an example of a circuit diagram in the case where an SRAM is used as the memory 214.

This embodiment can be implemented in an appropriate combination with any of the structures described in the other embodiments.

Embodiment 7

In this embodiment, a transistor containing an oxide semiconductor that can be used in one embodiment of the present invention will be described with reference to drawings. In the drawings in this embodiment, some components are enlarged, reduced in size, or omitted for easy understanding.

Figure 37A:
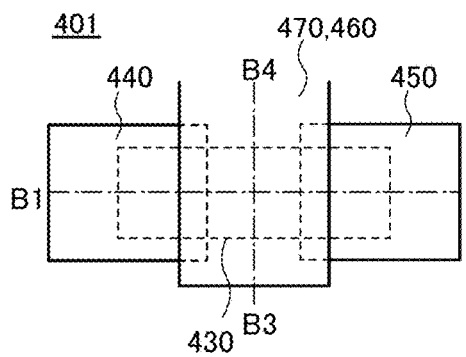
FIGS. 37A to 37F are top views and cross-sectional views illustrating transistors.
Figure 37B:
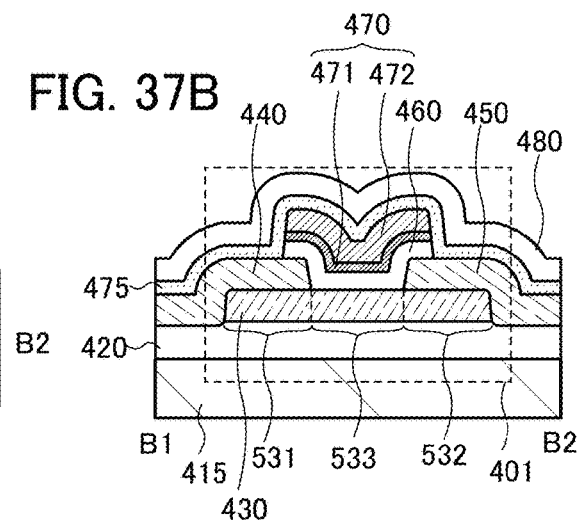
Figure 39A:
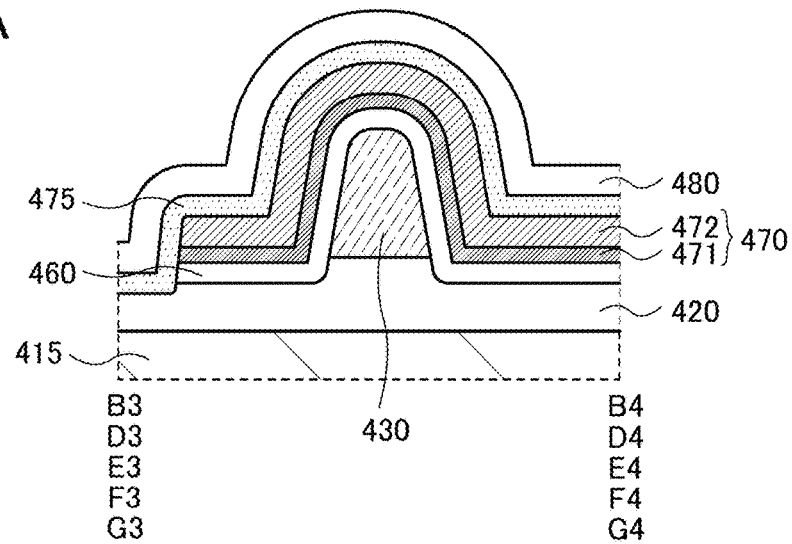
FIGS. 39A to 39D each illustrate a cross section of a transistor in a channel width direction.

FIG. 37A is a top view illustrating a transistor 401 in one embodiment of the present invention. A cross section in the direction of dashed-dotted line B1-B2 in FIG. 37A is illustrated in FIG. 37B. A cross section in the direction of dashed-dotted line B3-B4 in FIG. 37A is illustrated in FIG. 39A. Note that the direction of dashed-dotted line B1-B2 is referred to as a channel length direction, and the direction of dashed-dotted line B3-B4 is referred to as a channel width direction, in some cases.

The transistor 401 includes a substrate 415, an insulating layer 420, an oxide semiconductor layer 430, a conductive layer 440, a conductive layer 450, an insulating layer 460, a conductive layer 470, an insulating layer 475, and an insulating layer 480.

The insulating layer 420 is in contact with the substrate 415. The oxide semiconductor layer 430 is in contact with the insulating layer 420. The conductive layer 440 and the conductive layer 450 are in contact with the insulating layer 420 and the oxide semiconductor layer 430. The insulating layer 460 is in contact with the insulating layer 420, the oxide semiconductor layer 430, the conductive layer 440, and the conductive layer 450. The conductive layer 470 is in contact with the insulating layer 460. The insulating layer 475 is in contact with the insulating layer 420, the conductive layer 440, the conductive layer 450, and the conductive layer 470. The insulating layer 480 is in contact with the insulating layer 475.

Here, in the oxide semiconductor layer 430, a region overlapping with the conductive layer 440, a region overlapping with the conductive layer 450, and a region in contact with the insulating layer 460 are referred to as a region 531, a region 532, and a region 533, respectively.

Furthermore, the conductive layers 440 and 450 are electrically connected to the oxide semiconductor layer 430.

The conductive layer 440 can function as one of a source and a drain. The conductive layer 450 can function as the other of the source and the drain. The insulating layer 460 can function as a gate insulating layer. The conductive layer 470 can function as a gate.

The region 531, the region 532, and the region 533 which are illustrated in FIG. 37B can function as one of a source region and a drain region, the other of the source region and the drain region, and a channel formation region, respectively.

Each of the conductive layers 440 and 450 is a single layer in the drawing, but also may be a stack of two or more layers. The conductive layer 470 includes two layers, a conductive layer 471 and a conductive layer 472, in the drawing, but also may be a single layer or a stack of three or more layers. The same applies to other transistors described in this embodiment.

The insulating layer 480 may function as a planarization film as necessary.

Figure 37C:
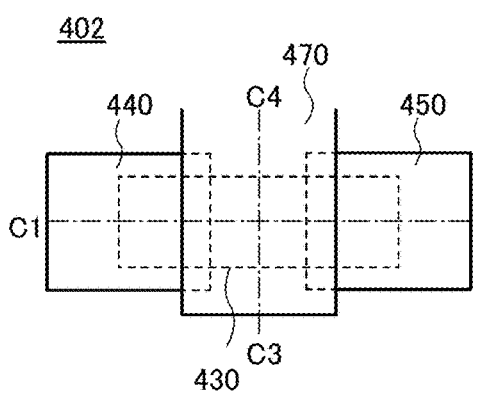
Figure 37D:
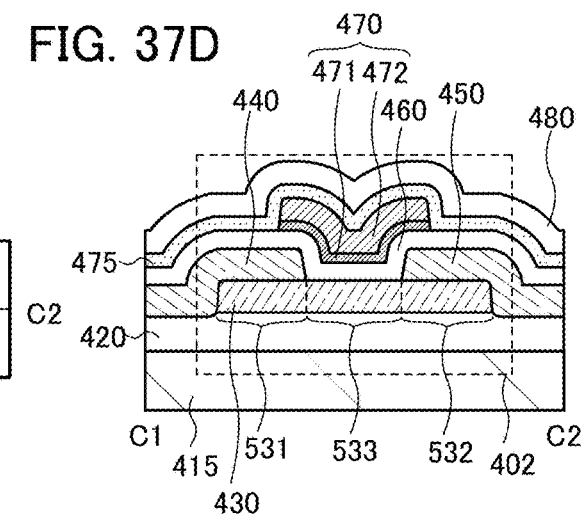
Figure 39B:
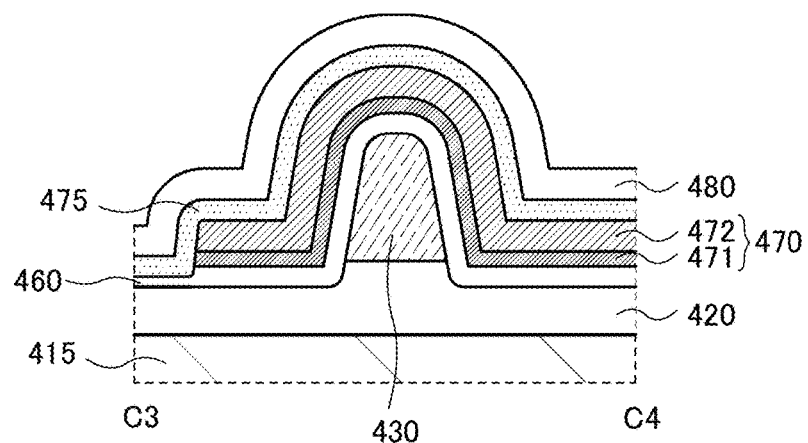

The transistor in one embodiment of the present invention may have a structure illustrated in FIGS. 37C and 37D. FIG. 37C is a top view of a transistor 402. A cross section in the direction of dashed-dotted line C1-C2 in FIG. 37C is illustrated in FIG. 37D. A cross section in the direction of dashed-dotted line C3-C4 in FIG. 37C is illustrated in FIG. 39B. The direction of dashed-dotted line C1-C2 is referred to as a channel length direction, and the direction of dashed-dotted line C3-C4 is referred to as a channel width direction in some cases.

The transistor 402 is different from the transistor 401 in that an end portion of the insulating layer 460 is not aligned with an end portion of the conductive layer 470. In the transistor 402, wide areas of the conductive layers 440 and 450 are covered with the insulating layer 460 and accordingly the electric resistance between the conductive layer 470 and the conductive layers 440 and 450 is high; therefore, the transistor 402 has a feature of low gate leakage current.

The transistors 401 and 402 each have a top-gate structure including regions where the conductive layer 470 overlaps with the conductive layers 440 and 450. To reduce parasitic capacitance, the width of each of the regions in the channel length direction is preferably greater than or equal to 3 nm and less than 300 nm. Since an offset region is not formed in the oxide semiconductor layer 430 in this structure, a transistor with a high on-state current can be easily formed.

Figure 37E:
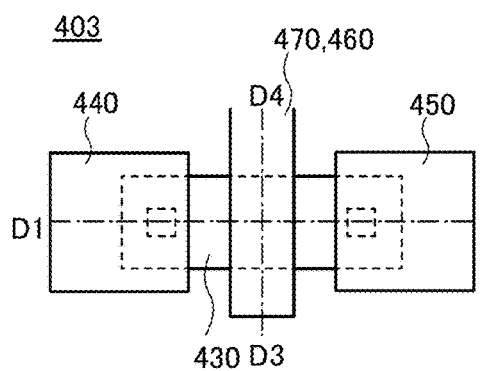
Figure 37F:
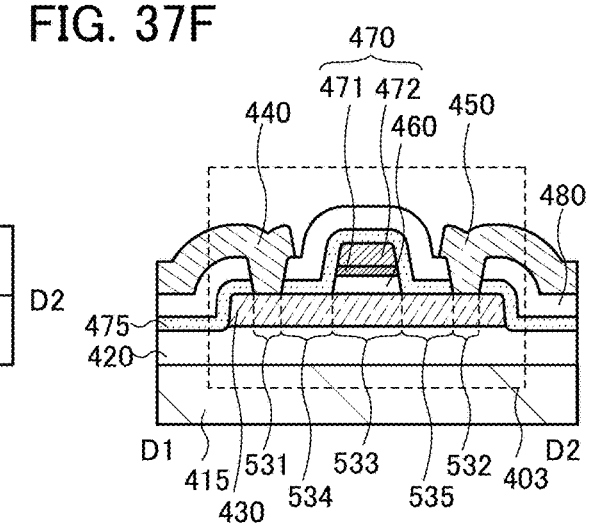

The transistor in one embodiment of the present invention may have a structure illustrated in FIGS. 37E and 37F. FIG. 37E is a top view of a transistor 403. A cross section in the direction of dashed-dotted line D1-D2 in FIG. 37E is illustrated in FIG. 37F. A cross section in the direction of dashed-dotted line D3-D4 in FIG. 37E is illustrated in FIG. 39A. The direction of dashed-dotted line D1-D2 is referred to as a channel length direction, and the direction of dashed-dotted line D3-D4 is referred to as a channel width direction.

In the transistor 403, the insulating layer 420 is in contact with the substrate 415; the oxide semiconductor layer 430 is in contact with the insulating layer 420; the insulating layer 460 is in contact with the insulating layer 420 and the oxide semiconductor layer 430; the conductive layer 470 is in contact with the insulating layer 460; the insulating layer 475 is in contact with the insulating layer 420, the oxide semiconductor layer 430, and the conductive layer 470; the insulating layer 480 is in contact with the insulating layer 475; and the conductive layer 440 and the conductive layer 450 are in contact with the oxide semiconductor layer 430 and the insulating layer 480.

Openings are formed in the insulating layers 475 and 480, and the conductive layers 440 and 450 are electrically connected to the oxide semiconductor layer 430 through the openings.

The transistor 403 may further include, for example, an insulating layer (planarization film) in contact with the conductive layers 440 and 450 and the insulating layer 480 as necessary.

In the oxide semiconductor layer 430, a region that overlaps with the insulating layer 475 and is sandwiched between the region 531 and the region 533 is referred to as a region 534, and a region that overlaps with the insulating layer 475 and is sandwiched between the region 532 and the region 533 is referred to as a region 535.

Figure 38A:
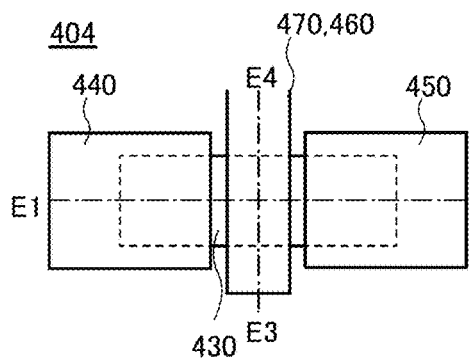
FIGS. 38A to 38F are top views and cross-sectional views illustrating transistors.
Figure 38B:
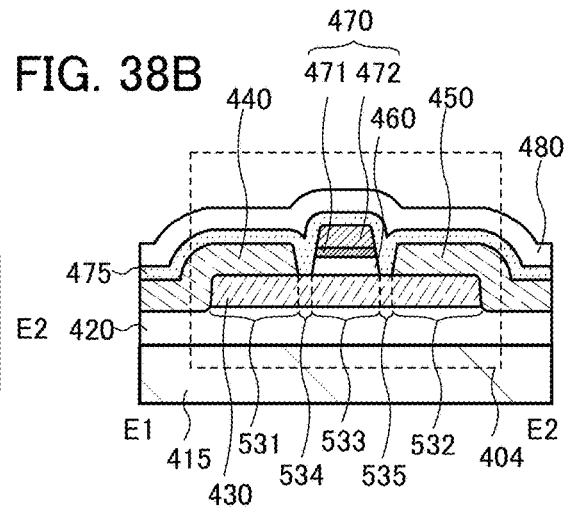

The transistor in one embodiment of the present invention may have a structure illustrated in FIGS. 38A and 38B. FIG. 38A is a top view of a transistor 404. A cross section in the direction of dashed-dotted line E1-E2 in FIG. 38A is illustrated in FIG. 38B. A cross section in the direction of dashed-dotted line E3-E4 in FIG. 38A is illustrated in FIG. 39A. The direction of dashed-dotted line E1-E2 is referred to as a channel length direction, and the direction of dashed-dotted line E3-E4 is referred to as a channel width direction in some cases.

In the transistor 404, the insulating layer 420 is in contact with the substrate 415; the oxide semiconductor layer 430 is in contact with the insulating layer 420; the conductive layers 440 and 450 are in contact with the insulating layer 420 and the oxide semiconductor layer 430; the insulating layer 460 is in contact with the insulating layer 420 and the oxide semiconductor layer 430; the conductive layer 470 is in contact with the insulating layer 460; the insulating layer 475 is in contact with the insulating layer 420, the oxide semiconductor layer 430, the conductive layer 440, the conductive layer 450, and the conductive layer 470; and the insulating layer 480 is in contact with the insulating layer 475.

The transistor 404 is different from the transistor 403 in that the conductive layers 440 and 450 in contact with the oxide semiconductor layer 430 cover end portions of the oxide semiconductor layer 430.

The transistors 403 and 404 each have a self-aligned structure that does not include regions where the conductive layer 470 overlaps with the conductive layers 440 and 450. A transistor with a self-aligned structure, which has extremely low parasitic capacitance between a gate and a source and between the gate and a drain, is suitable for applications that require high-speed operation.

Figure 38C:
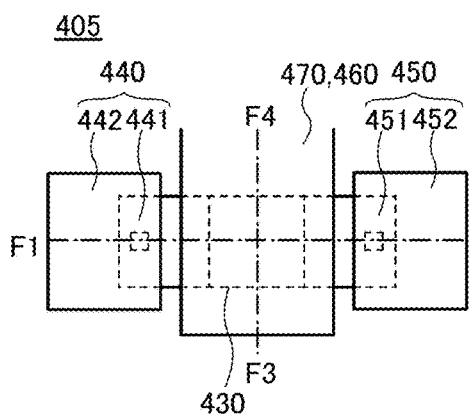
Figure 38D:
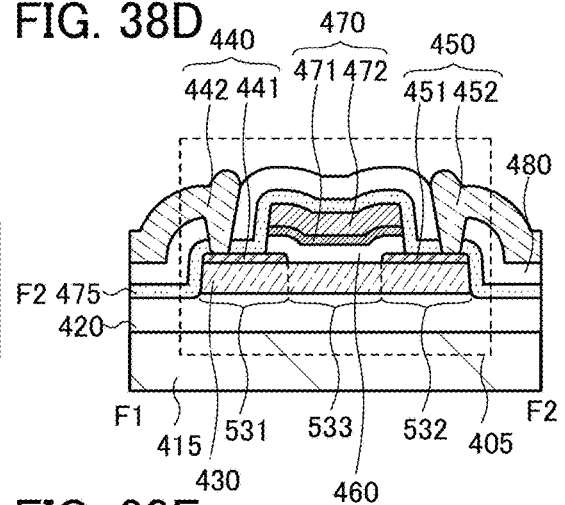

The transistor in one embodiment of the present invention may have a structure illustrated in FIGS. 38C and 38D. FIG. 38C is a top view of a transistor 405. A cross section in the direction of dashed-dotted line F1-F2 in FIG. 38C is illustrated in FIG. 38D. A cross section in the direction of dashed-dotted line F3-F4 in FIG. 38C is illustrated in FIG. 39A. The direction of dashed-dotted line F1-F2 is referred to as a channel length direction, and the direction of dashed-dotted line F3-F4 is referred to as a channel width direction in some cases.

In the transistor 405, the conductive layer 440 includes two layers, a conductive layer 441 and a conductive layer 442, and the conductive layer 450 includes two layers, a conductive layer 451 and a conductive layer 452. The insulating layer 420 is in contact with the substrate 415. The oxide semiconductor layer 430 is in contact with the insulating layer 420. The conductive layer 441 and the conductive layer 451 are in contact with the oxide semiconductor layer 430. The insulating layer 460 is in contact with the insulating layer 420, the oxide semiconductor layer 430, the conductive layer 441, and the conductive layer 451. The conductive layer 470 is in contact with the insulating layer 460. The insulating layer 475 is in contact with the insulating layer 420, the conductive layer 441, the conductive layer 451, and the conductive layer 470. The insulating layer 480 is in contact with the insulating layer 475. The conductive layer 442 is in contact with the conductive layer 441 and the insulating layer 480. The conductive layer 452 is in contact with the conductive layer 451 and the insulating layer 480.

The conductive layers 441 and 451 are in contact with the top surface of the oxide semiconductor layer 430 and are not in contact with a side surface of the oxide semiconductor layer 430.

The transistor 405 may further include, for example, an insulating layer in contact with the conductive layers 442 and 452 and the insulating layer 480 as necessary.

The conductive layer 441 and the conductive layer 451 are electrically connected to the oxide semiconductor layer 430. Furthermore, the conductive layer 442 is electrically connected to the conductive layer 441, and the conductive layer 452 is electrically connected to the conductive layer 451.

In the oxide semiconductor layer 430, a region overlapping with the conductive layer 441 is the region 531 that can function as one of a source region and a drain region, and a region overlapping with the conductive layer 451 is the region 532 that can function as the other of the source region and the drain region.

Figure 38E:
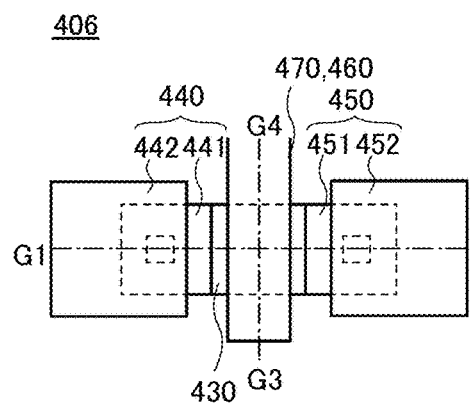
Figure 38F:
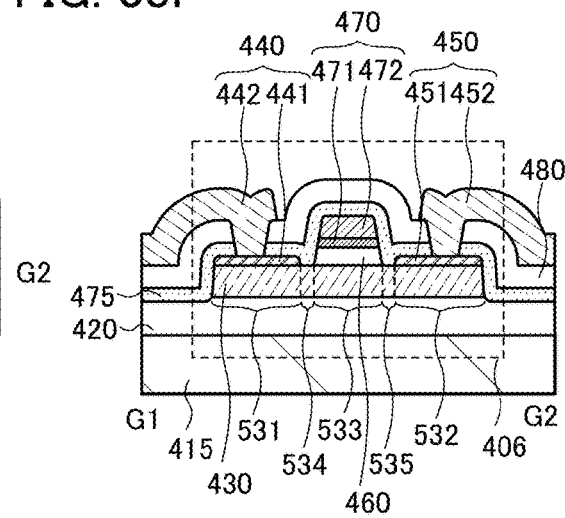

The transistor in one embodiment of the present invention may have a structure illustrated in FIGS. 38E and 38F. FIG. 38E is a top view of a transistor 406. A cross section in the direction of dashed-dotted line G1-G2 in FIG. 38E is illustrated in FIG. 38F. A cross section in the direction of dashed-dotted line G3-G4 in FIG. 38E is illustrated in FIG. 39A. The direction of dashed-dotted line G1-G2 is referred to as a channel length direction, and the direction of dashed-dotted line G3-G4 is referred to as a channel width direction in some cases.

The transistor 406 is different from the transistor 403 in that the conductive layer 440 includes two layers, the conductive layers 441 and 442, and the conductive layer 450 includes two layers, the conductive layers 451 and 452.

In the structures of the transistors 405 and 406, the conductive layers 440 and 450 are not in contact with the insulating layer 420. These structures make the insulating layer 420 less likely to be deprived of oxygen by the conductive layers 440 and 450 and facilitate oxygen supply from the insulating layer 420 to the oxide semiconductor layer 430.

An impurity for forming an oxygen vacancy to increase conductivity may be added to the regions 534 and 535 in the transistor 403, the transistor 404, and the transistor 406. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers that can function as a source and a drain; thus, contact resistance between the oxide conductor layer and the conductive layers that can function as a source and a drain can be reduced.

Although the transistors 401 to 406 in FIGS. 37A to 37F, FIGS. 38A to 38F, and FIGS. 39A to 39D are examples in which the oxide semiconductor layer 430 is a single layer, the oxide semiconductor layer 430 may be a stacked layer. FIG. 40A is a top view of the oxide semiconductor layer 430, and FIGS. 40B and 40C are cross-sectional views of the oxide semiconductor layer 430 having a two-layer structure of an oxide semiconductor layer 430a and an oxide semiconductor layer 430b. FIGS. 40D and 40E are cross-sectional views of the oxide semiconductor layer 430 having a three-layer structure of the oxide semiconductor layer 430a, the oxide semiconductor layer 430b, and an oxide semiconductor layer 430c.

The oxide semiconductor layers 430a and 430c can also be referred to as insulating layers because no channel region is formed therein.

Oxide semiconductor layers with different compositions, for example, can be used as the oxide semiconductor layer 430a, the oxide semiconductor layer 430b, and the oxide semiconductor layer 430c.

The oxide semiconductor layer 430 in the transistors 401 to 406 can be replaced by the oxide semiconductor layer 430 in FIGS. 40B and 40C or FIGS. 40D and 40E.

Figure 41A:
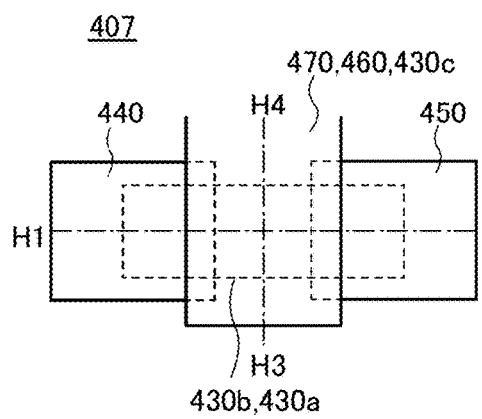
FIGS. 41A to 41F are top views and cross-sectional views illustrating transistors.
Figure 41B:
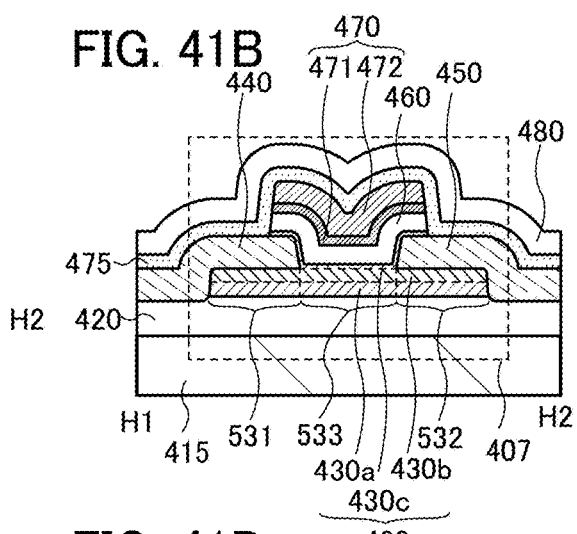
Figure 41C:
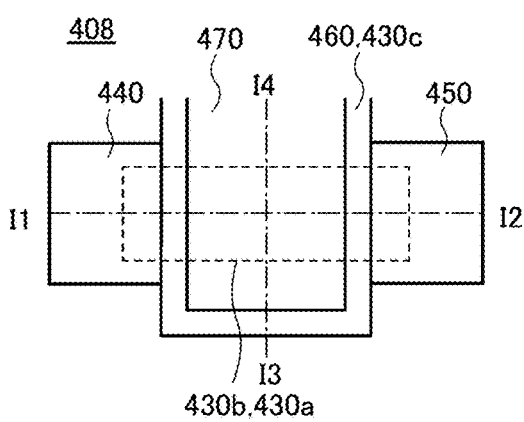
Figure 41D:
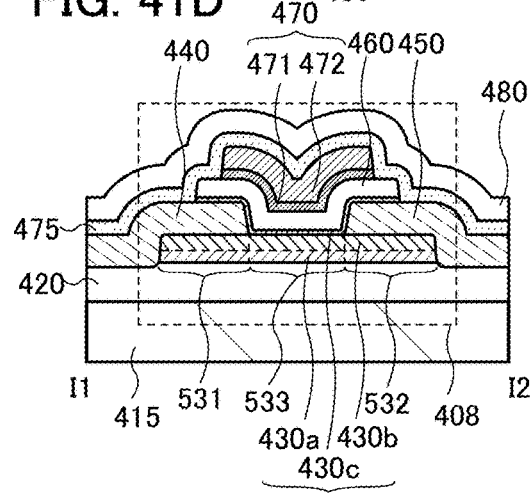
Figure 41E:
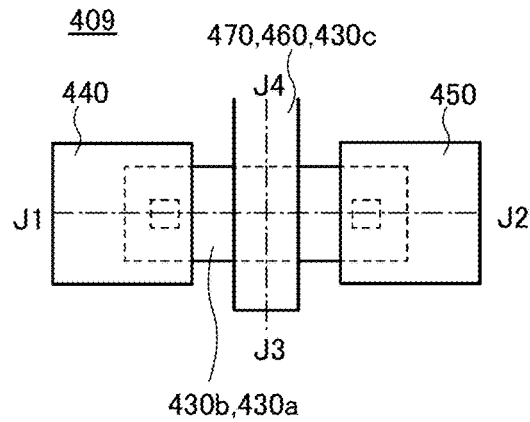
Figure 41F:
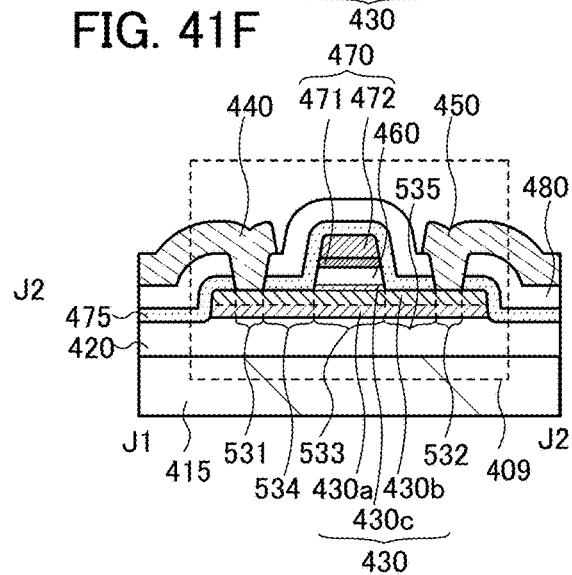
Figure 42A:
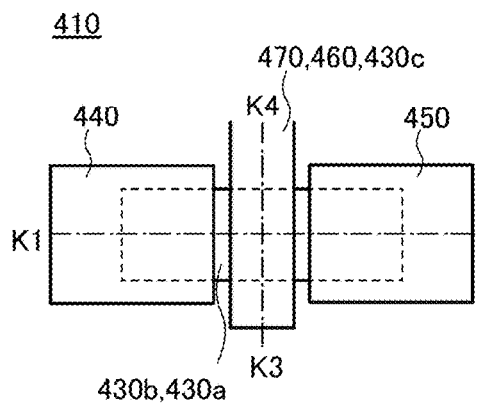
FIGS. 42A to 42F are top views and cross-sectional views illustrating transistors.
Figure 42B:
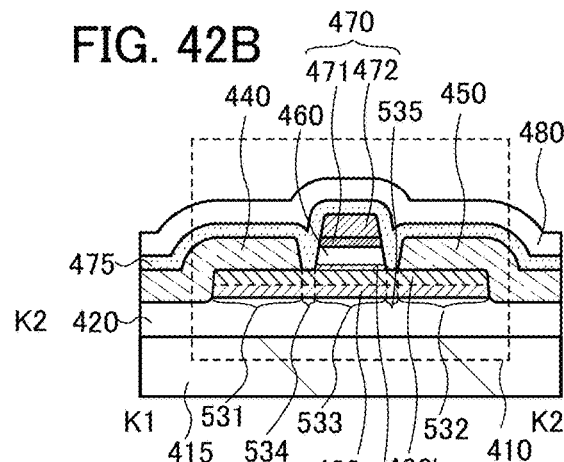
Figure 42C:
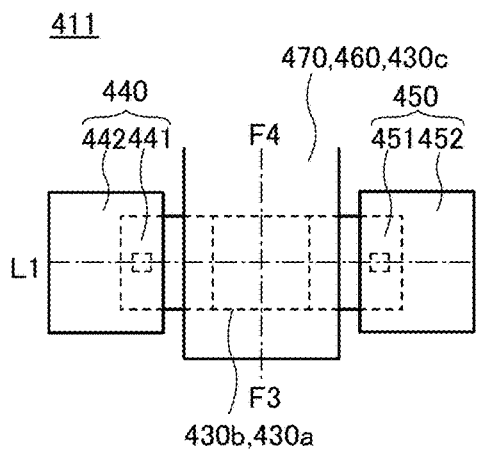
Figure 42D:
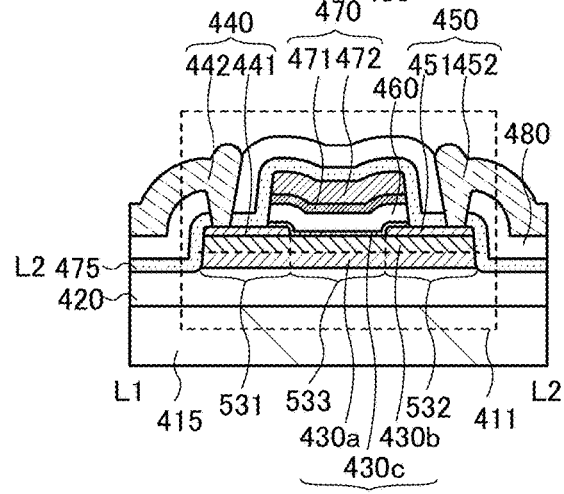
Figure 42E:
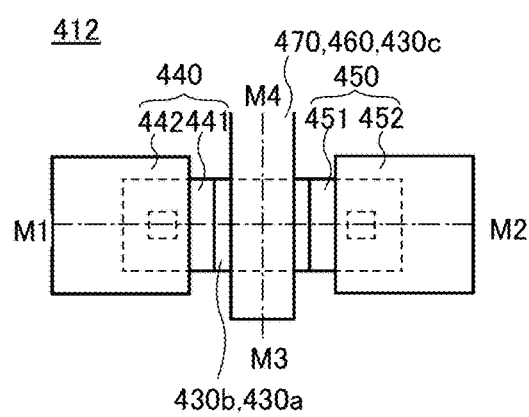
Figure 42F:
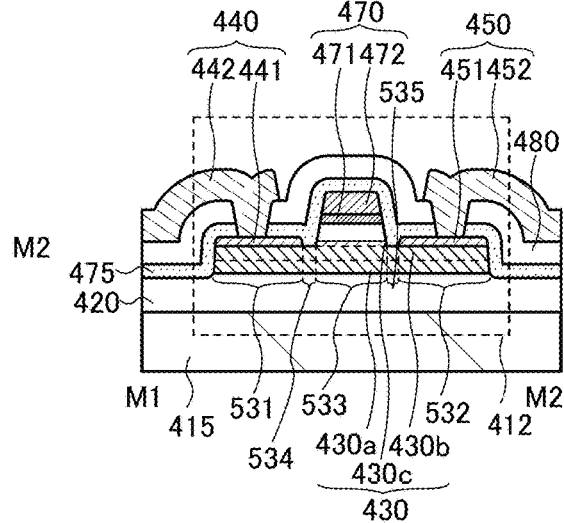
Figure 43A:
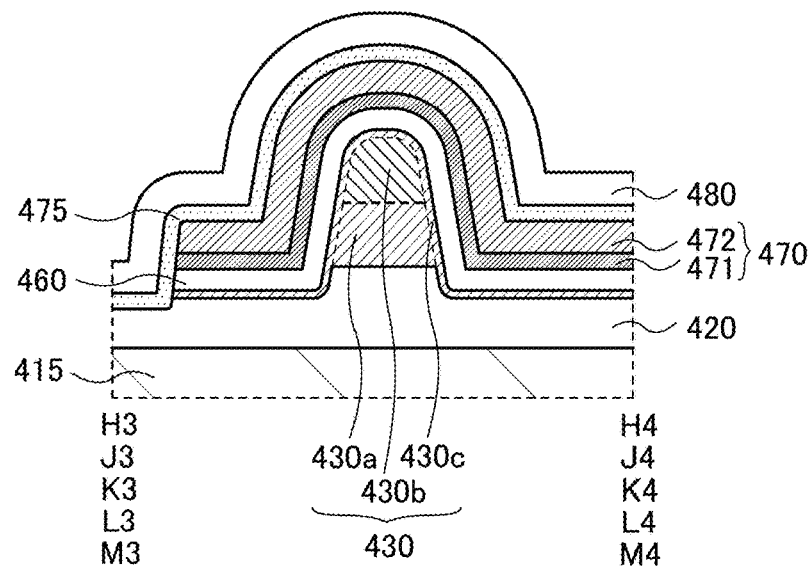
FIGS. 43A to 43D each illustrate a cross section of a transistor in a channel width direction.
Figure 43B:
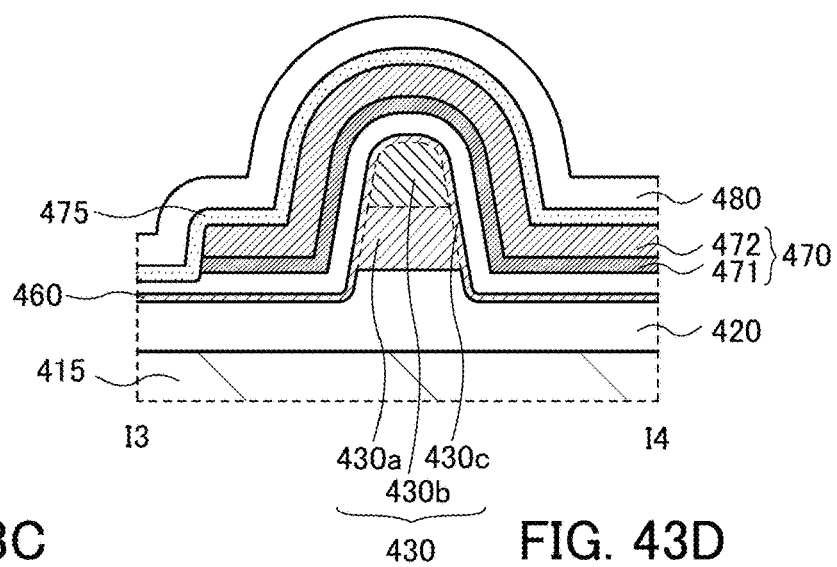

The transistor in one embodiment of the present invention may have a structure illustrated in FIGS. 41A to 41F, FIGS. 42A to 42F, and FIGS. 43A to 43D. FIGS. 41A, 41C, and 41E and FIGS. 42A, 42C, and 42E are top views of transistors 407, 408, 409, 410, 411, and 412, respectively. FIG. 41B is a cross section in the direction of dashed-dotted line H1-H2 in FIG. 41A. FIG. 41D is a cross section in the direction of dashed-dotted line I1-I2 in FIG. 41C. FIG. 41F is a cross section in the direction of dashed-dotted line J1-J2 in FIG. 41E. FIG. 42B is a cross section in the direction of dashed-dotted line K1-K2 in FIG. 42A. FIG. 42D is a cross section in the direction of dashed-dotted line L1-L2 in FIG. 42C. FIG. 42F is a cross section in the direction of dashed-dotted line M1-M2 in FIG. 42E. FIG. 43A illustrates each of cross sections in the directions of dashed-dotted lines H3-H4 in FIG. 41A, J3-J4 in FIG. 41E, K3-K4 in FIG. 42A, L3-L4 in FIG. 42C, and M3-M4 in FIG. 42E. FIG. 43B is a cross section in the direction of dashed-dotted line 13-14 in FIG. 41C. The directions of dashed-dotted lines H1-H2, I1-I2, J142, K1-K2, L1-L2, and M1-M2 may be each referred to as a channel length direction, and the directions of dashed-dotted lines H3-H4, I3-I4, J3-J4, K3-K4, L3-L4, and M3-M4 may be each referred to as a channel width direction.

The transistors 407 and 408 each have the same structure as the transistors 401 and 402 except that the oxide semiconductor layer 430 includes two layers (the oxide semiconductor layers 430a and 430b) in the regions 531 and 532, that the oxide semiconductor layer 430 includes three layers (the oxide semiconductor layers 430a to 430c) in the region 533, and that part of the oxide semiconductor layer (the oxide semiconductor layer 430c) exists between the insulating layer 460 and the conductive layers 440 and 450.

The transistors 409, 410, and 412 each have the same structure as the transistors 403, 404, and 406 except that the oxide semiconductor layer 430 includes two layers (the oxide semiconductor layers 430a and 430b) in the regions 531, 532, 534, and 535 and that the oxide semiconductor layer 430 includes three layers (the oxide semiconductor layers 430a to 430c) in the region 533.

The transistor 411 has the same structure as the transistor 405 except that the oxide semiconductor layer 430 includes two layers (the oxide semiconductor layers 430a and 430b) in the regions 531 and 532, that the oxide semiconductor layer 430 includes three layers (the oxide semiconductor layers 430a to 430c) in the region 533, and that part of the oxide semiconductor layer (the oxide semiconductor layer 430c) exists between the insulating layer 460 and the conductive layers 441 and 451.

Figure 39C:
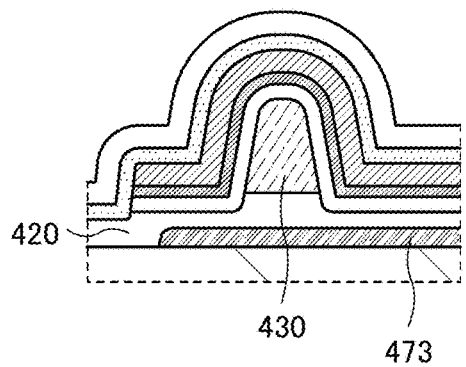
Figure 40A:
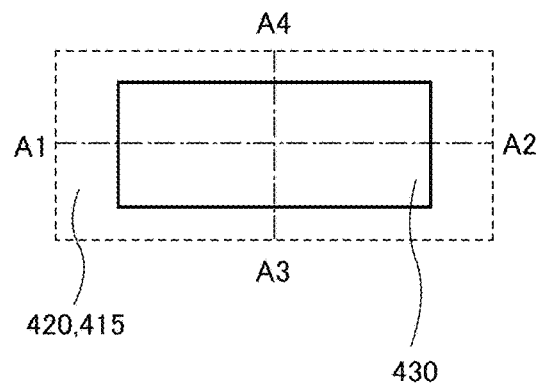
FIGS. 40A to 40E are a top view and cross-sectional views illustrating semiconductor layers.
Figure 40B:
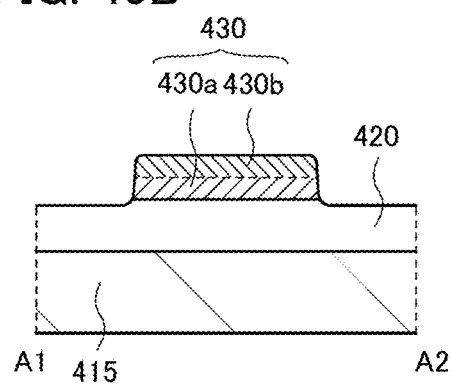
Figure 40D:
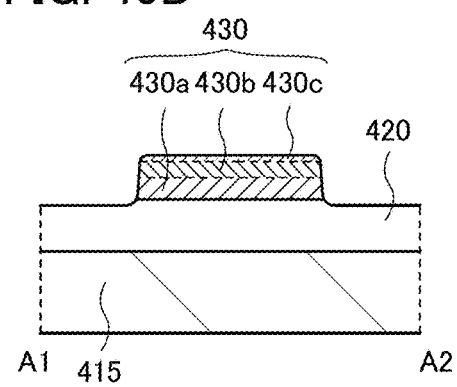
Figure 40C:
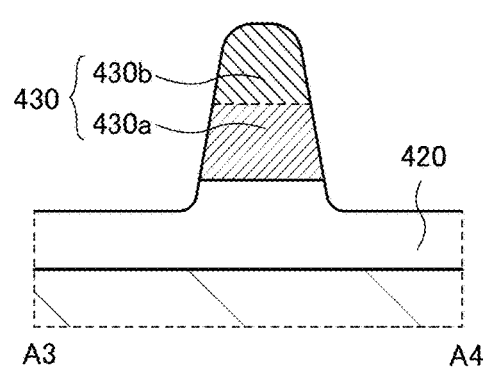
Figure 40E:
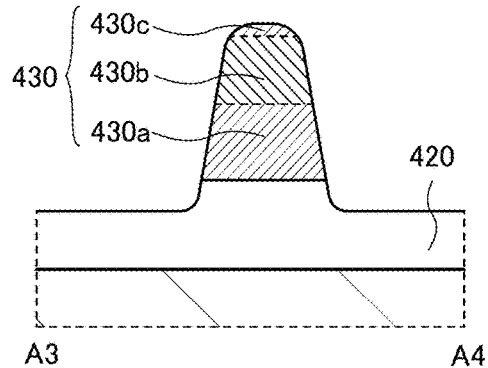
Figure 43C:
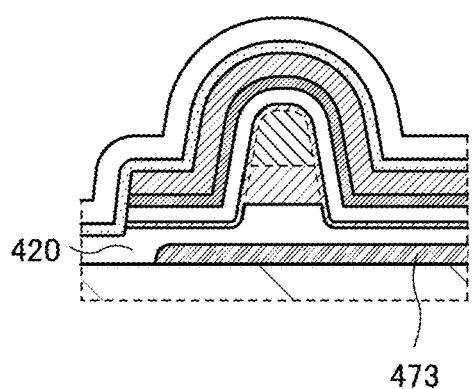

The transistor in one embodiment of the present invention may include a conductive layer 473 between the oxide semiconductor layer 430 and the substrate 415 as illustrated in cross-sectional views in the channel length directions of the transistors 401 to 412 illustrated in FIGS. 44A to 44F and FIGS. 45A to 45F, the cross-sectional view in the channel width direction of each of the transistors 401 to 406 illustrated in FIG. 39C, and the cross-sectional view in the channel width direction of each of the transistors 407 to 412 illustrated in FIG. 43C. The conductive layer 473 is used as a second gate electrode (also referred to as a back gate electrode), whereby the channel formation region in the oxide semiconductor layer 430 is electrically surrounded by the conductive layers 470 and 473. Such a transistor structure is referred to as a surrounded channel (s-channel) structure. Such a structure can increase the on-state current, and can control the threshold voltage. In the cross-sectional views in FIGS. 44A to 44F and FIGS. 45A to 45F, the width of the conductive layer 473 may be smaller than that of the oxide semiconductor layer 430. Moreover, the width of the conductive layer 473 may be shorter than that of the conductive layer 470.

Figure 39D:
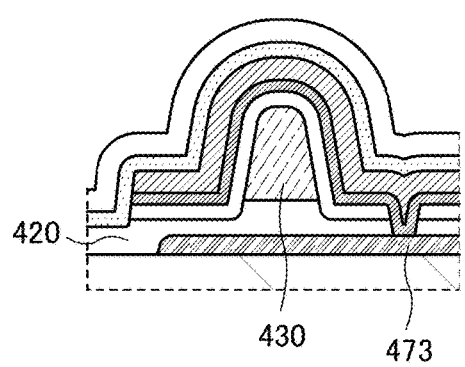
Figure 43D:
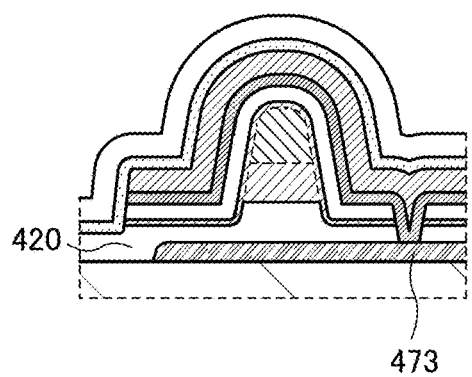
Figure 44A:
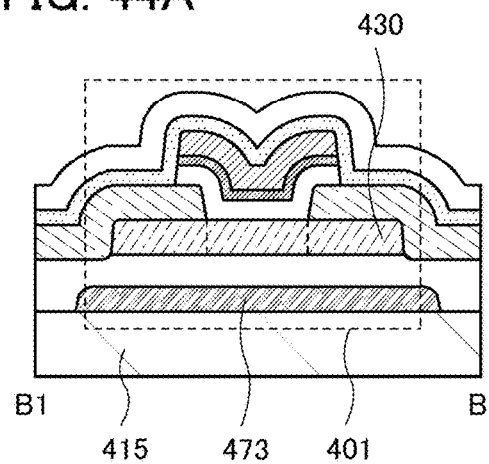
FIGS. 44A to 44F each illustrate a cross section of a transistor in a channel length direction.
Figure 44B:
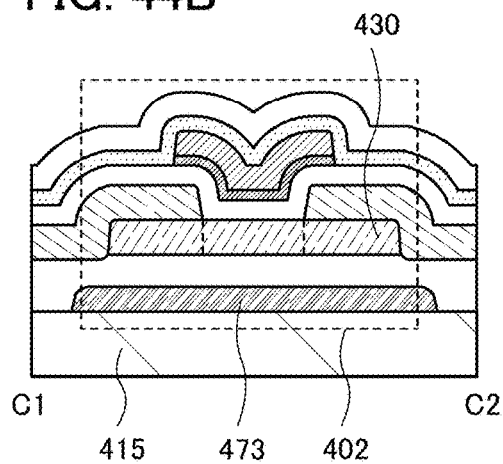
Figure 44C:
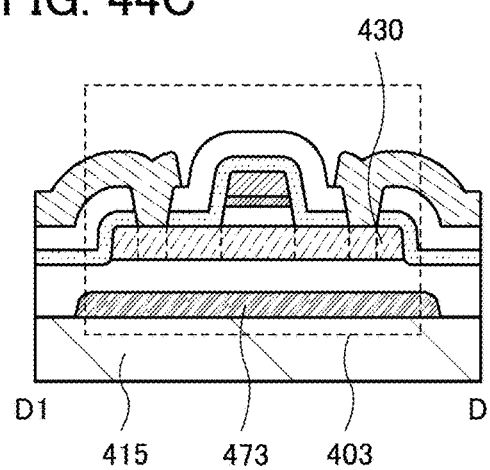
Figure 44D:
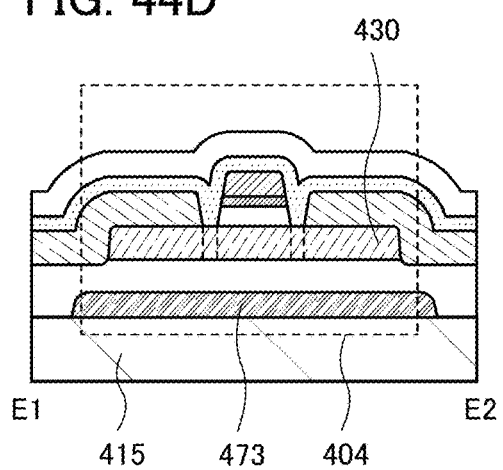
Figure 44E:
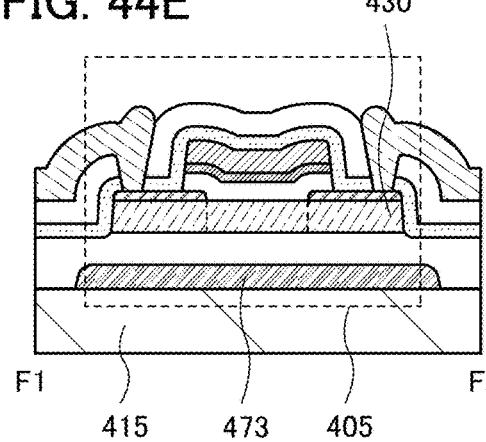
Figure 44F:
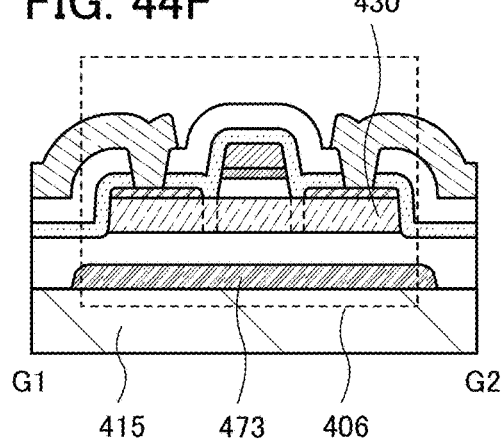
Figure 45A:
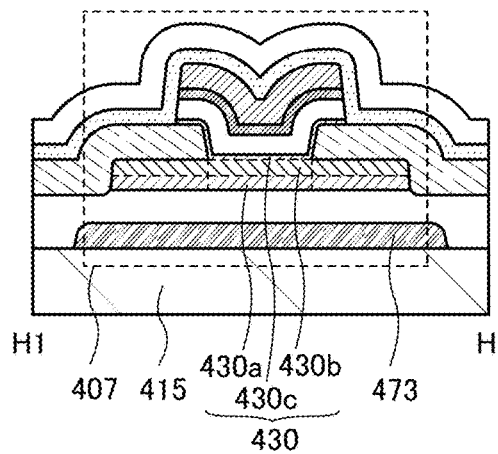
FIGS. 45A to 45F each illustrate a cross section of a transistor in a channel length direction.
Figure 45B:
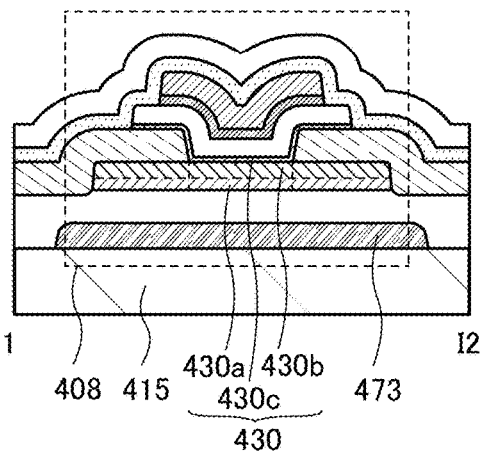
Figure 45C:
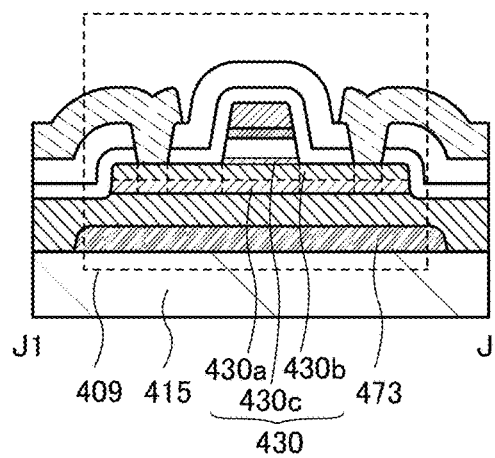
Figure 45D:
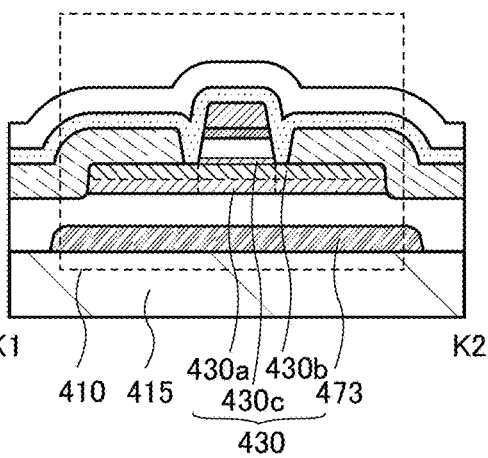
Figure 45E:
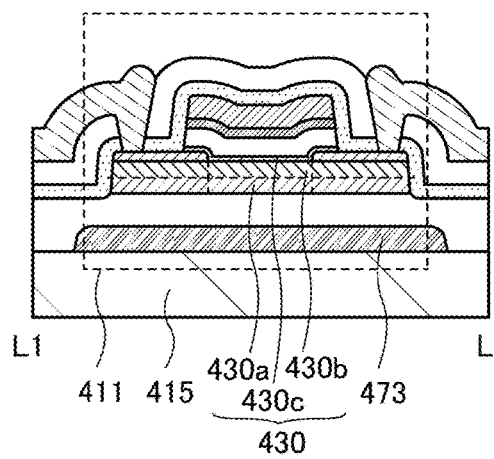
Figure 45F:
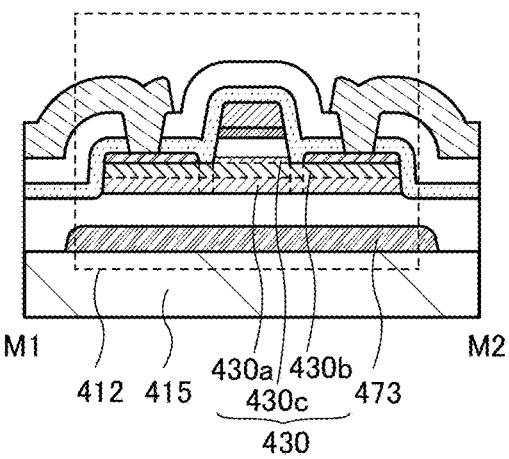

In order to increase the on-state current, for example, the conductive layers 470 and 473 are made to have the same potential, and the transistor is driven as a double-gate transistor. Furthermore, in order to control the threshold voltage, a fixed potential that is different from the potential of the conductive layer 470 is applied to the conductive layer 473. To set the conductive layers 470 and 473 at the same potential, for example, as illustrated in FIG. 39D and FIG. 43D, the conductive layers 470 and 473 may be electrically connected to each other through a contact hole.

Figure 46A:
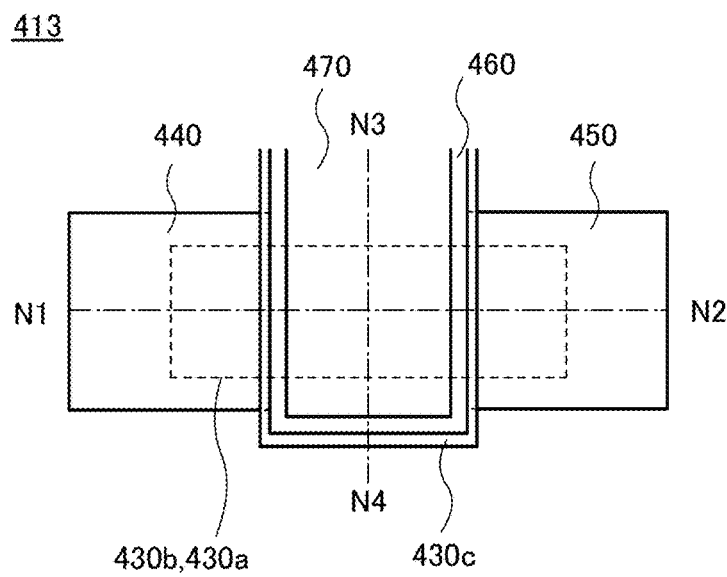
FIGS. 46A to 46C are a top view and cross-sectional views illustrating a transistor.
Figure 46B:
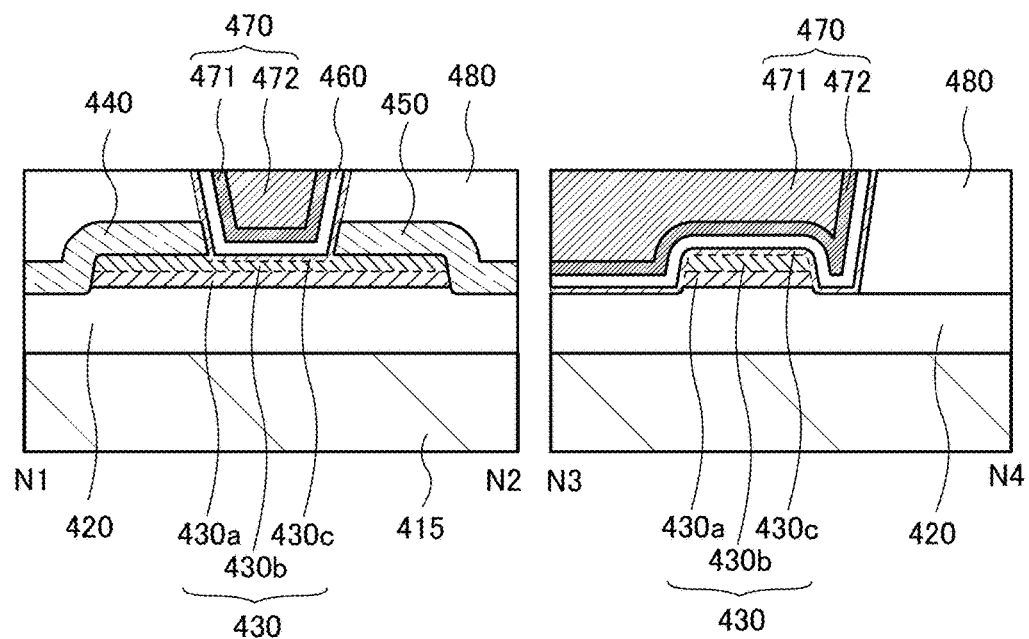
Figure 46C:
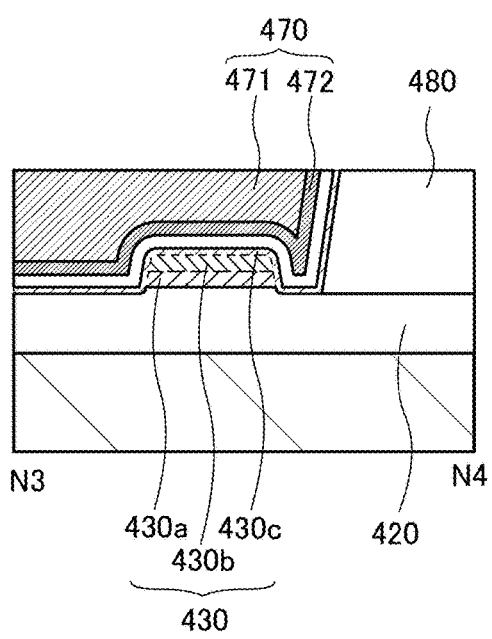

The transistor in one embodiment of the present invention may have a structure illustrated in FIGS. 46A to 46C. FIG. 46A is a top view. FIG. 46B illustrates a cross-sectional view taken along dashed-dotted line N1-N2 in FIG. 46A. FIG. 46C illustrates a cross-sectional view taken along dashed-dotted line N3-N4 in FIG. 46A. Note that for simplification of the drawing, some components are not illustrated in the top view in FIG. 46A.

In the transistor 413, the insulating layer 420 is in contact with the substrate 415; the oxide semiconductor layer 430 (the oxide semiconductor layers 430a to 430c) is in contact with the insulating layer 420; the conductive layer 440 and the conductive layer 450 are in contact with the oxide semiconductor layer 430b; the insulating layer 460 is in contact with the oxide semiconductor layer 430c; the conductive layer 470 is in contact with the insulating layer 460; and the insulating layer 480 is in contact with the insulating layer 420, the conductive layer 440, and the conductive layer 450. Note that the oxide semiconductor layer 430c, the insulating layer 460, and the conductive layer 470 are provided in an opening reaching the oxide semiconductor layer 430b in the insulating layer 480.

In the transistor 413, a region where the conductive layer 470 overlaps with the conductive layer 440 or the conductive layer 450 is smaller than that in any other transistors described above; thus, the parasitic capacitance in the transistor 413 can be reduced. Accordingly, the transistor 413 is suitable for a component of a circuit that requires high-speed operation. As illustrated in FIGS. 46B and 46C, the transistor 413 is preferably subjected to a chemical mechanical polishing (CMP) method or the like to have a flat top surface, although not necessarily.

Figure 47A:
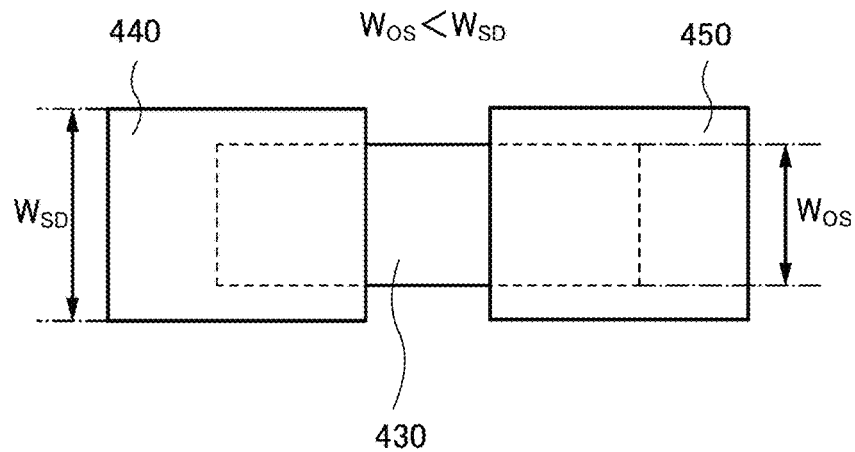
FIGS. 47A to 47C are top views each illustrating a transistor.
Figure 47B:
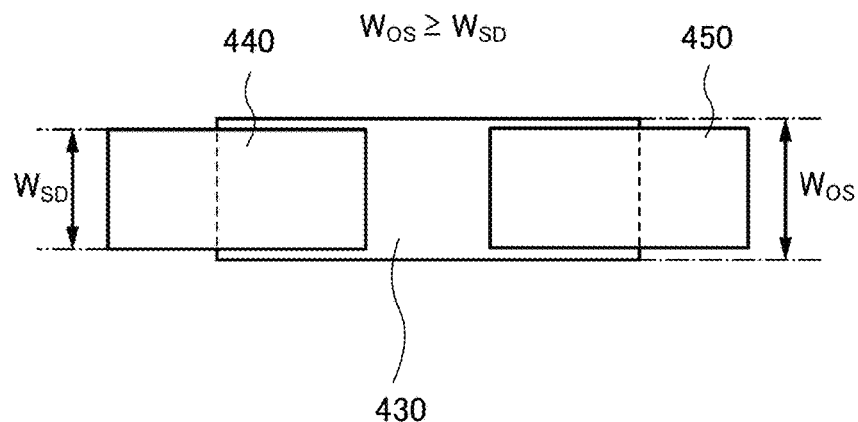
Figure 47C:
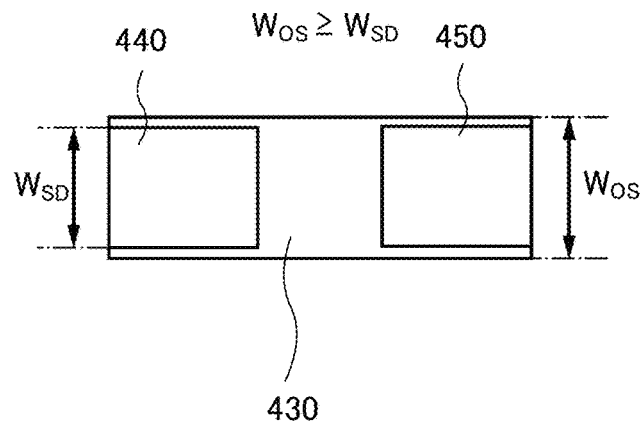

The conductive layer 440 and the conductive layer 450 in the transistor in one embodiment of the present invention may each have a width ($W_{SD}$) longer than the width ($W_{OS}$) of the oxide semiconductor layer as illustrated in the top view in FIG. 47A or shorter as illustrated in the top view in FIG. 47B. When $W_{OS} \geq W_{SD}$ ($W_{SD}$ is less than or equal to $W_{OS}$) is satisfied, a gate electric field is easily applied to the entire oxide semiconductor layer 430, so that electrical characteristics of the transistor can be particularly improved. As illustrated in FIG. 47C, the conductive layers 440 and 450 may be formed only in regions overlapping with the oxide semiconductor layer 430.

Note that FIGS. 47A to 47C only illustrate the oxide semiconductor layer 430, the conductive layer 440, and the conductive layer 450.

In the transistor including the oxide semiconductor layers 430a and 430b and the transistor including the oxide semiconductor layers 430a to 430c, selecting appropriate materials for the two or three layers forming the oxide semiconductor layer 430 makes current flow to the oxide semiconductor layer 430b. Since current flows to the oxide semiconductor layer 430b, the current is hardly influenced by interface scattering, leading to high on-state current. Thus, increasing the thickness of the oxide semiconductor layer 430b improves the on-state current in some cases.

A semiconductor device including a transistor with any of the above structures can have favorable electrical characteristics.

The structures described in this embodiment can be used in appropriate combination with any of the structures described in the other embodiments.

Embodiment 8

In this embodiment, components of the transistors described in Embodiment 6 are described in detail.

The type of the substrate 415 is not limited to a certain type. Examples of the substrate 415 include a semiconductor substrate (e.g., a single crystal substrate or a silicon substrate), an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, a base film, and the like. As an example of a glass substrate, a barium borosilicate glass substrate, an aluminoborosilicate glass substrate, soda lime glass substrate, and the like can be given. Examples of a glass substrate include a barium borosilicate glass substrate, an aluminoborosilicate glass substrate, and soda lime glass substrate. Examples of the flexible substrate, the attachment film, the base film, and the like are substrates of plastics typified by polyethylene terephthalate (PET), polyethylene naphthalate (PEN), polyether sulfone (PES), and polytetrafluoroethylene (PTFE). Another example is a synthetic resin such as acrylic. A film of polypropylene, polyester, polyvinyl fluoride, polyvinyl chloride, or the like can be used. Other examples are polyamide, polyimide, aramid, epoxy, an inorganic vapor deposition film, paper, and the like. Specifically, when a transistor is formed using a semiconductor substrate, a single crystal substrate, an SOI substrate, or the like, it is possible to form a transistor with few variations in characteristics, size, shape, or the like and with high current supply capability and a small size. By forming a circuit with the use of such a transistor, power consumption of the circuit can be reduced or the circuit can be highly integrated.

As the substrate 415, a silicon substrate provided with a transistor, or the silicon substrate over which an insulating layer, a wiring, a conductor that can function as a contact plug, and the like are provided can be used. Note that when only p-channel transistors are formed using the silicon substrate, a silicon substrate with n⁻-type conductivity is preferably used. Alternatively, an SOI substrate including an n⁻-type or i-type silicon layer may be used. A surface of the silicon substrate where the transistor is formed preferably has a (110) plane orientation. Forming a p-channel transistor with the (110) plane can increase mobility.

A flexible substrate may be used as the substrate 415, and the transistor may be formed directly over the flexible substrate. Alternatively, a separation layer may be provided between the substrate and the transistor. The separation layer can be used when part or the whole of a semiconductor device formed over the separation layer is separated from the substrate and transferred to another substrate. In such a case, the transistor can be transferred to a substrate having low heat resistance or a flexible substrate as well. For the separation layer, a stack including inorganic films, which are a tungsten film and a silicon oxide film, or an organic resin film of polyimide or the like formed over a substrate can be used, for example.

In other words, a transistor may be formed using one substrate and then transferred to another substrate. Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, a transistor with excellent properties or a transistor with low power consumption can be formed, a device with high durability can be formed, heat resistance can be provided, or reduction in weight or thickness can be achieved.

The insulating layer 420 can have a function of supplying oxygen to the oxide semiconductor layer 430 as well as a function of preventing diffusion of impurities from a component included in the substrate 415. For this reason, the insulating layer 420 is preferably an insulating layer containing oxygen and further preferably, the insulating layer 420 is an insulating layer containing oxygen in which the oxygen content is higher than that in the stoichiometric composition. The insulating layer 420 is, for example, a film in which the amount of released oxygen when converted into oxygen atoms is greater than or equal to $1.0 \times 10^{19}$ atoms/cm$^3$ in thermal desorption spectroscopy (TDS) analysis. In the TDS analysis, the film surface temperature is preferably higher than or equal to 100° C. and lower than or equal to 700° C., or higher than or equal to 100° C. and lower than or equal to 500° C. In the case where the substrate 415 is provided with another device, the insulating layer 420 also functions as an interlayer insulating layer. In that case, the insulating layer 420 is preferably subjected to planarization treatment such as chemical mechanical polishing (CMP) treatment so as to have a flat surface.

For example, the insulating layer 420 can be formed using an oxide insulating layer including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating layer including silicon nitride, silicon nitride oxide, aluminum nitride, aluminum nitride oxide, or the like; or a mixed material of any of these. The insulating layer 420 may be a stack of any of the above materials.

In this embodiment, detailed description is given mainly on the case where the oxide semiconductor layer 430 of the transistor has a three-layer structure in which the oxide semiconductor layers 430a, 430b, and 430c are sequentially stacked from the insulating layer 420 side.

Note that in the case where the oxide semiconductor layer 430 is a single layer, a layer corresponding to the oxide semiconductor layer 430b described in this embodiment is used.

In the case where the oxide semiconductor layer 430 has a two-layer structure, a stack in which layers corresponding to the oxide semiconductor layer 430a and the oxide semiconductor layer 430b described in this embodiment are sequentially stacked from the insulating layer 420 side is used. In such a case, the oxide semiconductor layers 430a and 430b can be replaced with each other.

In the case where the oxide semiconductor layer 430 has a layered structure of four or more layers, for example, a structure in which another oxide semiconductor layer is added to the three-layer stack of the oxide semiconductor layer 430 described in this embodiment can be employed.

For the oxide semiconductor layer 430b, for example, an oxide semiconductor whose electron affinity (an energy difference between a vacuum level and the conduction band minimum) is higher than those of the oxide semiconductor layers 430a and 430c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 430a and 430c each contain one or more kinds of metal elements contained in the oxide semiconductor layer 430b. For example, the oxide semiconductor layers 430a and 430c are preferably formed using an oxide semiconductor whose conduction band minimum is closer to a vacuum level than that of the oxide semiconductor layer 430b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 470, a channel is formed in the oxide semiconductor layer 430b whose conduction band minimum is the lowest in the oxide semiconductor layer 430.

Furthermore, since the oxide semiconductor layer 430a contains one or more kinds of metal elements contained in the oxide semiconductor layer 430b, an interface state is unlikely to be formed at the interface between the oxide semiconductor layers 430a and 430b, compared with the interface between the oxide semiconductor layer 430b and the insulating layer 420 on the assumption that the oxide semiconductor layer 430b is in contact with the insulating layer 420. The interface state sometimes forms a channel; therefore, the threshold voltage of the transistor is changed in some cases. Thus, with the oxide semiconductor layer 430a, variations in electrical characteristics of the transistor, such as a threshold voltage, can be reduced. Moreover, the reliability of the transistor can be improved.

Since the oxide semiconductor layer 430c contains one or more kinds of metal elements contained in the oxide semiconductor layer 430b, scattering of carriers is unlikely to occur at the interface between the oxide semiconductor layers 430b and 430c, compared with the interface between the oxide semiconductor layer 430b and the gate insulating layer (the insulating layer 460) on the assumption that the oxide semiconductor layer 430b is in contact with the gate insulating layer. Thus, with the oxide semiconductor layer 430c, the field-effect mobility of the transistor can be increased.

For the oxide semiconductor layers 430a and 430c, for example, a material containing Al, Ti, Ga, Ge, Y, Zr, Sn, La, Ce, or Hf with a higher atomic ratio than that used for the oxide semiconductor layer 430b can be used. Specifically, the atomic ratio of any of the above metal elements in the oxide semiconductor layers 430a and 430c is 1.5 times or more, preferably 2 times or more, and further preferably 3 times or more as large as that in the oxide semiconductor layer 430b. Any of the above metal elements is strongly bonded to oxygen and thus can have a function of suppressing generation of an oxygen vacancy in the oxide semiconductor layers 430a and 430c. That is, an oxygen vacancy is less likely to be generated in the oxide semiconductor layers 430a and 430c than in the oxide semiconductor layer 430b.

An oxide semiconductor that can be used for each of the oxide semiconductor layers 430a, 430b, and 430c preferably contains at least In or Zn. Both In and Zn are preferably contained. In order to reduce variations in electrical characteristics of the transistor including an oxide semiconductor, a stabilizer is preferably contained in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

Note that when each of the oxide semiconductor layers 430a, 430b, and 430c is an In-M-Zn oxide containing at least indium, zinc, and M (M is a metal such as Al, Ti, Ga, Ge, Y, Zr, Sn, La, Ce, or Hf), in the case where the oxide semiconductor layer 430a has an atomic ratio of In to M and Zn which is $x_1:y_1:z_1$, the oxide semiconductor layer 430b has an atomic ratio of In to M and Zn which is $x_2:y_2:z_2$, and the oxide semiconductor layer 430c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, and further preferably 3 times or more as large as $y_2/x_2$. At this time, when $y_2$ is greater than or equal to $x_2$ in the oxide semiconductor layer 430b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 430a and 430c are preferably less than 50 atomic % and greater than 50 atomic %, respectively, and further preferably less than 25 atomic % and greater than 75 atomic %, respectively. Furthermore, in the case where Zn and O are not taken into consideration, the proportion of In and the proportion of M in the oxide semiconductor layer 430b are preferably greater than 25 atomic % and less than 75 atomic %, respectively, and further preferably greater than 34 atomic % and less than 66 atomic %, respectively.

The indium content in the oxide semiconductor layer 430b is preferably higher than those in the oxide semiconductor layers 430a and 430c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 430b, a transistor having high field-effect mobility can be obtained.

The thickness of the oxide semiconductor layer 430a is greater than or equal to 3 nm and less than or equal to 100 nm, preferably greater than or equal to 5 nm and less than or equal to 50 nm, and further preferably greater than or equal to 5 nm and less than or equal to 25 nm. The thickness of the oxide semiconductor layer 430b is greater than or equal to 3 nm and less than or equal to 200 nm, preferably greater than or equal to 5 nm and less than or equal to 150 nm, and further preferably greater than or equal to 10 nm and less than or equal to 100 nm. The thickness of the oxide semiconductor layer 430c is greater than or equal to 1 nm and less than or equal to 50 nm, preferably greater than or equal to 2 nm and less than or equal to 30 nm, and further preferably greater than or equal to 3 nm and less than or equal to 15 nm. In addition, the oxide semiconductor layer 430b is preferably thicker than the oxide semiconductor layer 430c.

In order that a transistor in which a channel is formed in an oxide semiconductor layer have stable electrical characteristics, it is effective to make the oxide semiconductor layer intrinsic or substantially intrinsic by reducing the concentration of impurities in the oxide semiconductor layer. The term "substantially intrinsic" refers to a state where an oxide semiconductor layer has a carrier density lower than $1\times10^{15}/cm^3$, lower than $1\times10^{13}/cm^3$, lower than $8\times10^{11}/cm^3$, or lower than $1\times10^8/cm^3$, and is higher than or equal to $1\times10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 430a, 430b, and 430c and at interfaces between the oxide semiconductor layers.

In order to form an intrinsic or substantially intrinsic oxide semiconductor layer, the oxide semiconductor layer is arranged to have a region in which the concentration of silicon estimated by secondary ion mass spectrometry (SIMS) is lower than $1\times10^{19}$ atoms/cm$^3$, preferably lower than $5\times10^{18}$ atoms/cm$^3$, and further preferably lower than $1\times10^{18}$ atoms/cm$^3$. The oxide semiconductor layer is arranged to have a region in which the concentration of hydrogen is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, and still further preferably lower than or equal to $5\times10^{18}$ atoms/cm$^3$. The concentration of nitrogen at a certain depth of the oxide semiconductor layer or in a region of the oxide semiconductor layer is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

The high concentration of silicon or carbon might reduce the crystallinity of the oxide semiconductor layer. In order not to lower the crystallinity of the oxide semiconductor layer, for example, the oxide semiconductor layer is controlled to have a region in which the concentration of silicon is lower than $1\times10^{19}$ atoms/cm$^3$, preferably lower than $5\times10^{18}$ atoms/cm$^3$, and further preferably lower than $1\times10^{18}$ atoms/cm$^3$. Furthermore, the oxide semiconductor layer is controlled to have a region in which the concentration of carbon is lower than $1\times10^{19}$ atoms/cm$^3$, preferably lower than $5\times10^{18}$ atoms/cm$^3$, and further preferably lower than $1\times10^{18}$ atoms/cm$^3$.

As described above, a transistor in which a highly purified oxide semiconductor layer is used for a channel formation region exhibits an extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating layer of the transistor, an insulating layer containing silicon is used in many cases; thus, it is preferable that, as in the transistor in one embodiment of the present invention, a region of the oxide semiconductor layer that serves as a channel not be in contact with the gate insulating layer for the above reason. In the case where a channel is formed at the interface between the gate insulating layer and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating layer.

Accordingly, with the oxide semiconductor layer 430 having a layered structure including the oxide semiconductor layers 430a, 430b, and 430c, a channel can be formed in the oxide semiconductor layer 430b; thus, the transistor can have high field-effect mobility and stable electrical characteristics.

In a band structure, the conduction band minimums of the oxide semiconductor layers 430a, 430b, and 430c are continuous. This can be understood also from the fact that the compositions of the oxide semiconductor layers 430a, 430b, and 430c are close to one another and oxygen is easily diffused among the oxide semiconductor layers 430a, 430b, and 430c. Thus, the oxide semiconductor layers 430a, 430b, and 430c have a continuous physical property though they have different compositions and form a stack. In the drawings, interfaces between the oxide semiconductor layers of the stack are indicated by dotted lines.

The oxide semiconductor layer 430 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear because of a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layers 430a and 430c, and an In—Ga—Zn oxide whose atomic ratio of In to Ga and Zn is 1:1:1, 2:1:3, 5:5:6, or 3:1:2 can be used for the oxide semiconductor layer 430b. In each of the oxide semiconductor layers 430a to 430c, the proportion of each atom in the atomic ratio varies within a range of ±40% as a margin.

The oxide semiconductor layer 430b of the oxide semiconductor layer 430 serves as a well, so that a channel is formed in the oxide semiconductor layer 430b. Since the conduction band minimums are continuous, the oxide semiconductor layer 430 can also be referred to as a U-shaped well. Furthermore, a channel formed to have such a structure can also be referred to as a buried channel.

Note that trap levels due to impurities or defects might be formed in the vicinity of the interface between an insulating layer such as a silicon oxide film and each of the oxide semiconductor layers 430a and 430c. The oxide semiconductor layer 430b can be distanced away from the trap levels owing to the existence of the oxide semiconductor layers 430a and 430c.

However, when the energy differences between the conduction band minimum of the oxide semiconductor layer 430b and the conduction band minimum of each of the oxide semiconductor layers 430a and 430c are small, an electron in the oxide semiconductor layer 430b might reach the trap level by passing over the energy differences. When the electron is trapped in the trap level, negative charge is generated at the interface with the insulating layer, so that the threshold voltage of the transistor is shifted in the positive direction.

The oxide semiconductor layers 430a, 430b, and 430c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 440 functioning as one of a source and a drain and the conductive layer 450 functioning as the other of the source and the drain, for example, a single layer or a stacked layer formed using a material selected from Al, Cr, Cu, Ta, Ti, Mo, W, Ni, Mn, Nd, and Sc and alloys of any of these metal materials can be used. It is preferable to use Ti, which is particularly easily bonded to oxygen, or W, which has a high melting point and thus allows subsequent processes to be performed at relatively high temperatures, as a typical example. It is also possible to use a stack of any of the above materials and Cu or an alloy such as Cu—Mn, which has low resistance. In the transistors 405, 406, 411, and 412, for example, it is possible to use W for the conductive layers 441 and 451 and use a stack of Ti and Al for the conductive layers 442 and 452.

The above materials are capable of extracting oxygen from an oxide semiconductor layer. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 440 and 450, the conductive layers 440 and 450 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 440 and 450 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 460 functioning as a gate insulating layer can be formed using an insulating layer containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 460 may be a stack including any of the above materials. The insulating layer 460 may contain La, N, Zr, or the like as an impurity.

An example of a layered structure of the insulating layer 460 is described. The insulating layer 460 includes, for example, oxygen, nitrogen, silicon, or hafnium. Specifically, the insulating layer 460 preferably includes hafnium oxide and silicon oxide or silicon oxynitride.

Hafnium oxide and aluminum oxide have higher dielectric constants than silicon oxide and silicon oxynitride. Therefore, the insulating layer 460 using hafnium oxide or aluminum oxide can have larger thickness than the insulating layer 460 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to these examples.

For the insulating layers 420 and 460 in contact with the oxide semiconductor layer 430, a film that releases less nitrogen oxide is preferably used. In the case where the oxide semiconductor is in contact with an insulating layer that releases a large amount of nitrogen oxide, the density of states due to nitrogen oxide increases in some cases. The density of states due to nitrogen oxide can be formed in the energy gap of the oxide semiconductor. For the insulating layers 420 and 460, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typified by greater than or equal to $1 \times 10^{18}$ molecules/cm$^3$ and less than or equal to $5 \times 10^{19}$ molecules/cm$^3$. Note that the amount of released ammonia is the amount of ammonia released by heat treatment with which the surface temperature of the film becomes higher than or equal to 50° C. and lower than or equal to 650° C., and preferably higher than or equal to 50° C. and lower than or equal to 550° C.

By using the above oxide insulating layer for the insulating layers 420 and 460, a shift in the threshold voltage of the transistor can be reduced, which leads to reduced fluctuations in the electrical characteristics of the transistor.

For the conductive layer 470 functioning as a gate, for example, a conductive layer formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. As a typical example, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 471 and tungsten is used for the conductive layer 472 to form the conductive layer 470.

As the insulating layer 475, a silicon nitride film, an aluminum nitride film, or the like containing hydrogen can be used. In the transistors 403, 404, 406, 409, 410, and 412 described in Embodiment 6, the use of an insulating layer containing hydrogen is used as the insulating layer 475 allows the oxide semiconductor layer 430 to be partly changed to n-type because the oxide semiconductor layer 430 is partly in contact with the insulating layer 475. In addition, a nitride insulating layer functions as a blocking film against moisture and the like and can improve the reliability of the transistor.

An aluminum oxide film can also be used as the insulating layer 475. It is particularly preferable to use an aluminum oxide film as the insulating layer 475 in the transistors 401, 402, 405, 407, 408, and 411 described in Embodiment 6. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 430, preventing release of oxygen from the oxide semiconductor layer, and preventing unnecessary release of oxygen from the insulating layer 420. Furthermore, oxygen contained in the aluminum oxide film can be diffused into the oxide semiconductor layer.

Furthermore, the insulating layer 480 is preferably formed over the insulating layer 475. The insulating layer can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer may be a stack of any of the above materials.

Here, like the insulating layer 420, the insulating layer 480 preferably contains oxygen more than that in the stoichiometric composition. Oxygen released from the insulating layer 480 can be diffused into the channel formation region in the oxide semiconductor layer 430 through the insulating layer 460, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 407 to 412 in one embodiment of the present invention, the oxide semiconductor layer 430c is formed to cover the oxide semiconductor layer 430b where a channel is formed; thus, a channel formation layer is not in contact with the gate insulating layer. Accordingly, scattering of carriers at the interface between the channel formation layer and the gate insulating layer can be reduced and the on-state current of the transistor can be increased.

In the transistor in one embodiment of the present invention, as described above, the gate (the conductive layer 470) is formed to electrically surround the oxide semiconductor layer 430 in the channel width direction; accordingly, a gate electric field is applied to the oxide semiconductor layer 430 in the side surface direction in addition to the perpendicular direction. In other words, a gate electric field is applied to the entire channel formation layer and an effective channel width is increased, leading to a further increase in on-state current.

Furthermore, in the transistor in one embodiment of the present invention in which the oxide semiconductor layer 430 has a two-layer structure or a three-layer structure, since the oxide semiconductor layer 430b where a channel is formed is provided over the oxide semiconductor layer 430a, an interface state is less likely to be formed. In the transistor in one embodiment of the present invention in which the oxide semiconductor layer 430 has a three-layer structure, since the oxide semiconductor layer 430b is positioned at the middle of the three-layer structure, the influence of an impurity that enters from upper and lower layers on the oxide semiconductor layer 430b can also be eliminated. Therefore, the transistor can achieve not only the increase in on-state current but also stabilization of the threshold voltage and a reduction in S value (subthreshold value). Thus, current at a gate voltage VG of 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced chemical vapor deposition (CVD), such films may be formed by another method such as thermal CVD. Examples of the thermal CVD include MOCVD and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed with a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed with a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed with a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed with a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor layer, e.g., an In—Ga—Zn—O film is formed with a deposition apparatus using ALD, an $In(CH_3)_3$ gas and an $O_3$ gas are sequentially introduced plural times to form an In—O layer, a $Ga(CH_3)_3$ gas and an $O_3$ gas are sequentially introduced plural times to form a Ga—O layer, and then a $Zn(CH_3)_2$ gas and an $O_3$ gas are sequentially introduced plural times to form a Zn—O layer. Note that the order of these layers is not limited to this example. A mixed compound layer such as an In—Ga—O layer, an In—Zn—O layer, or a Ga—Zn—O layer may be formed using these gases. Although an $H_2O$ gas which is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

The structures described in this embodiment can be used in appropriate combination with any of the structures described in the other embodiments.

Embodiment 9

A structure of an oxide semiconductor layer that can be used in one embodiment of the present invention will be described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

First, a CAAC-OS is described.

A CAAC-OS is one of oxide semiconductors having a plurality of c-axis aligned crystal parts (also referred to as pellets).

Figure 48A:
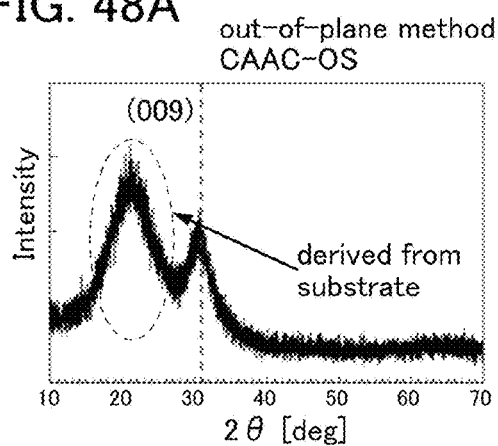
FIGS. 48A to 48E show structural analysis results of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 48A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 48B:
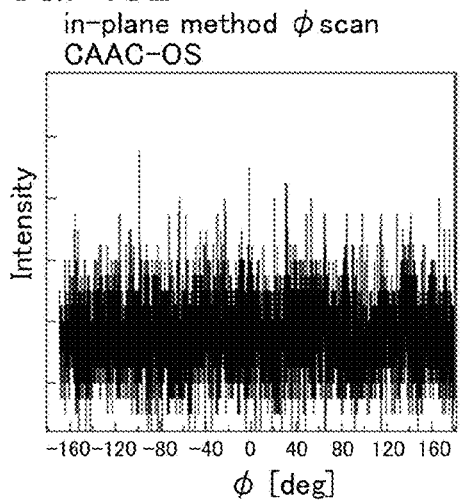
Figure 48C:
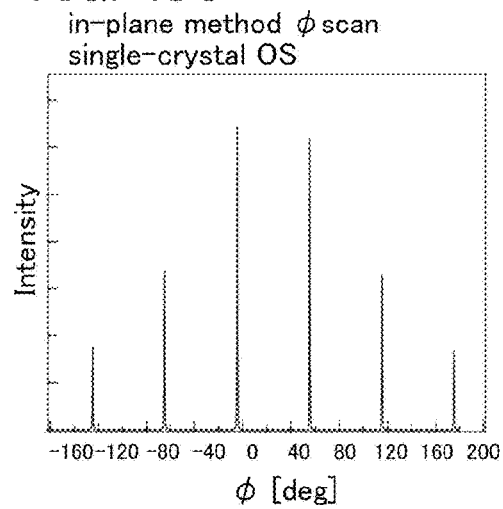

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), as shown in FIG. 48B, a peak is not clearly observed. In contrast, in the case where single crystal $InGaZnO_4$ is subjected to φ scan with 2θ fixed at around 56°, as shown in FIG. 48C, six peaks which are derived from crystal planes equivalent to the (110) plane are observed. Accordingly, the structural analysis using XRD shows that the directions of a-axes and b-axes are irregularly oriented in the CAAC-OS.

Figure 48D:
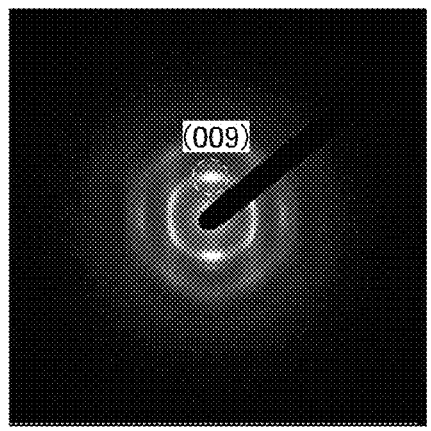
Figure 48E:
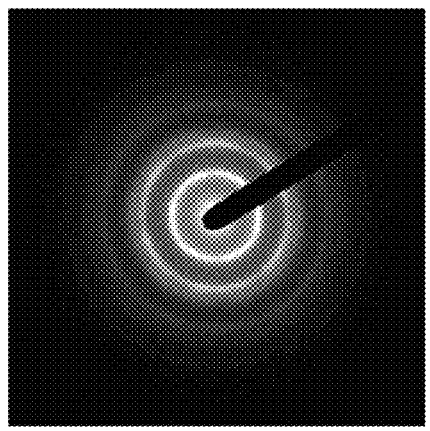

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 48D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 48E shows a diffraction pattern obtained in such a manner that an electron beam with a probe diameter of 300 nm is incident on the same sample in a direction perpendicular to the sample surface. As shown in FIG. 48E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 48E is considered to be derived from the (010) plane, the (100) plane, and the like of the $InGaZnO_4$ crystal. The second ring in FIG. 48E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 49A:
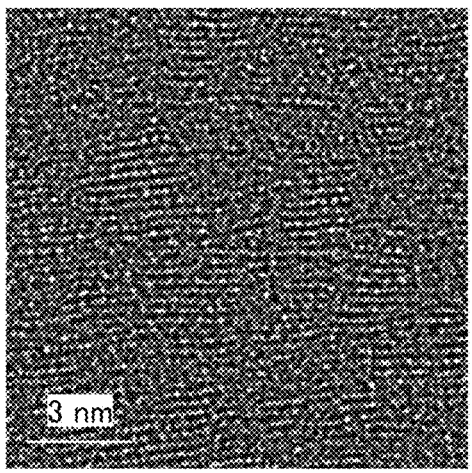
FIGS. 49A to 49E show a cross-sectional TEM image and plan-view TEM images of a CAAC-OS and images obtained through analysis thereof.

FIG. 49A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 49A shows pellets in which metal atoms are arranged in a layered manner. FIG. 49A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 49B:
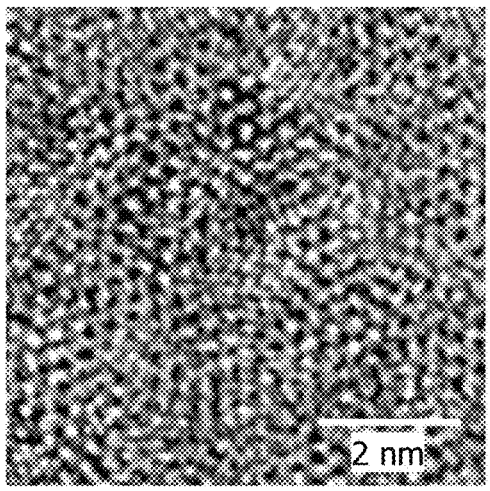
Figure 49C:
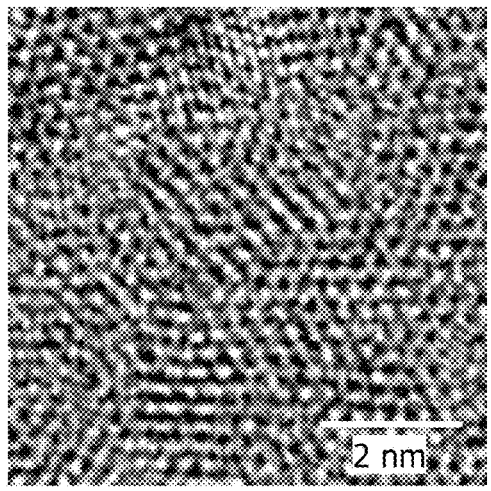
Figure 49D:
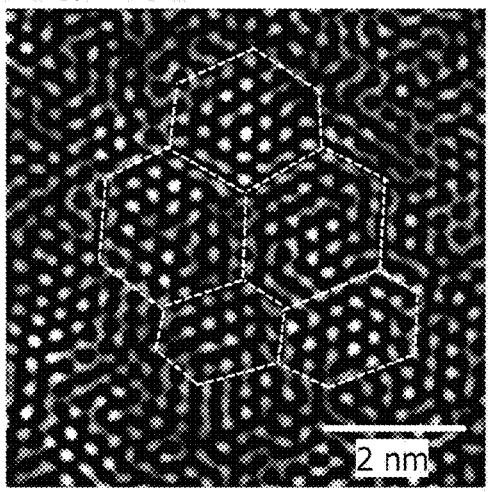
Figure 49E:
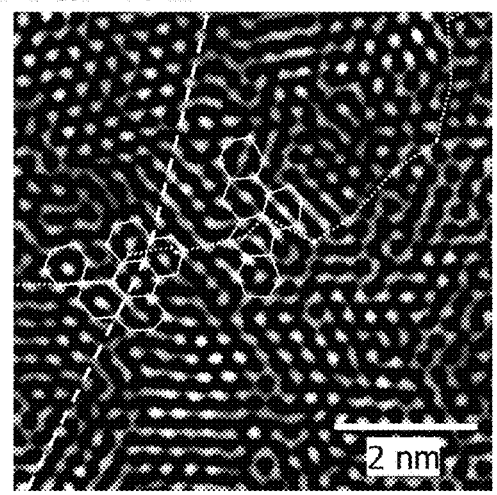

FIGS. 49B and 49C show Cs-corrected high-resolution TEM images of a plane of the CAAC-OS observed from a direction substantially perpendicular to the sample surface. FIGS. 49D and 49E are images obtained through image processing of FIGS. 49B and 49C. The method of image processing is as follows. The image in FIG. 49B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 49D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 49E, a dotted line denotes a portion where the direction of a lattice arrangement changes between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 50A:
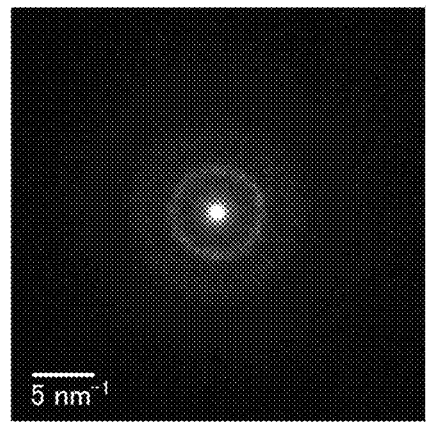
FIGS. 50A to 50D show electron diffraction patterns and a cross-sectional TEM image of an nc-OS.
Figure 50B:
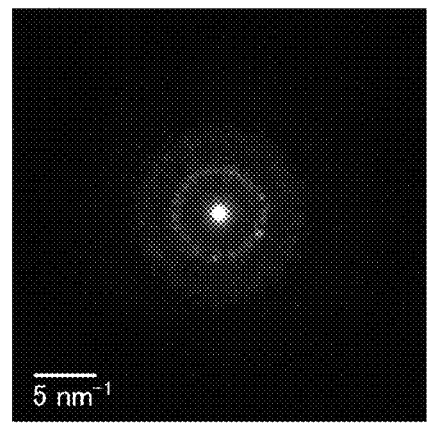

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 50A is observed. FIG. 50B shows a diffraction pattern obtained when an electron beam with a probe diameter of 1 nm is incident on the same sample. As shown in FIG. 50B, a plurality of spots are observed in a ring-like region. In other words, ordering in an nc-OS is not observed with an electron beam with a probe diameter of 50 nm but is observed with an electron beam with a probe diameter of 1 nm.

Figure 50C:
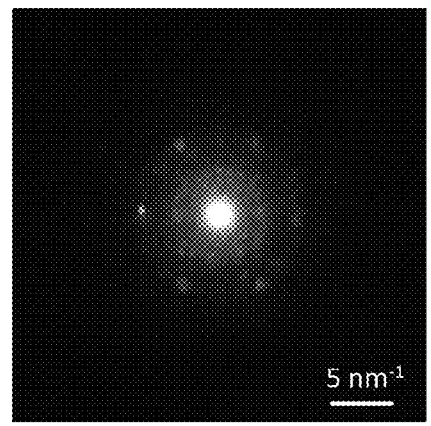

Furthermore, an electron diffraction pattern in which spots are arranged in an approximately hexagonal shape is observed in some cases as shown in FIG. 50C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 50D:
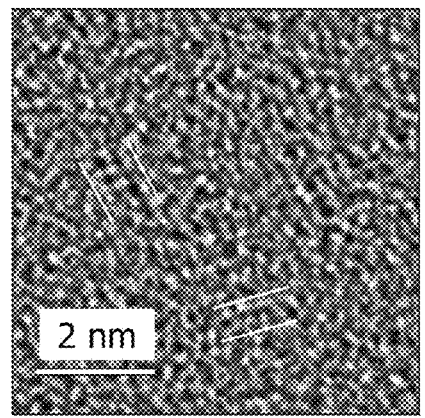

FIG. 50D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 50D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

An a-like OS has a structure intermediate between those of the nc-OS and the amorphous oxide semiconductor.

Figure 51A:
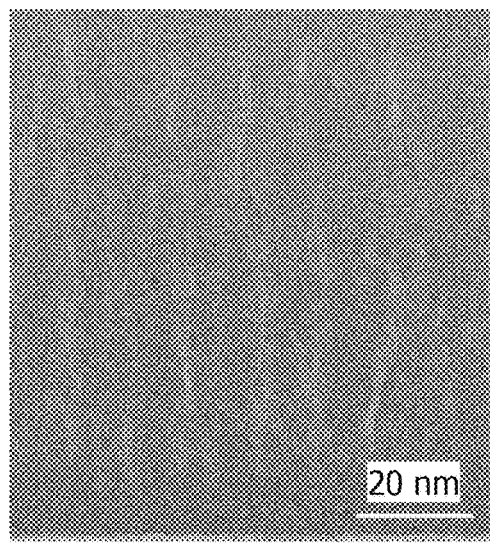
FIGS. 51A and 51B show cross-sectional TEM images of an a-like OS.
Figure 51B:
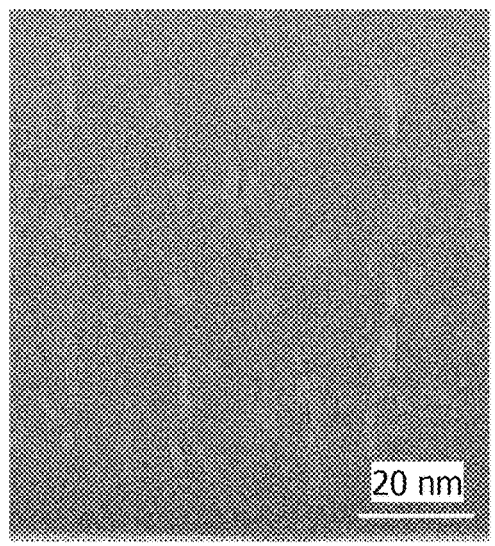

FIGS. 51A and 51B are high-resolution cross-sectional TEM images of an a-like OS. FIG. 51A is the high-resolution cross-sectional TEM image of the a-like OS at the start of the electron irradiation. FIG. 51B is the high-resolution cross-sectional TEM image of a-like OS after the electron (e) irradiation at $4.3 \times 10^8$ e$^-$/nm$^2$. FIGS. 51A and 51B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 52:
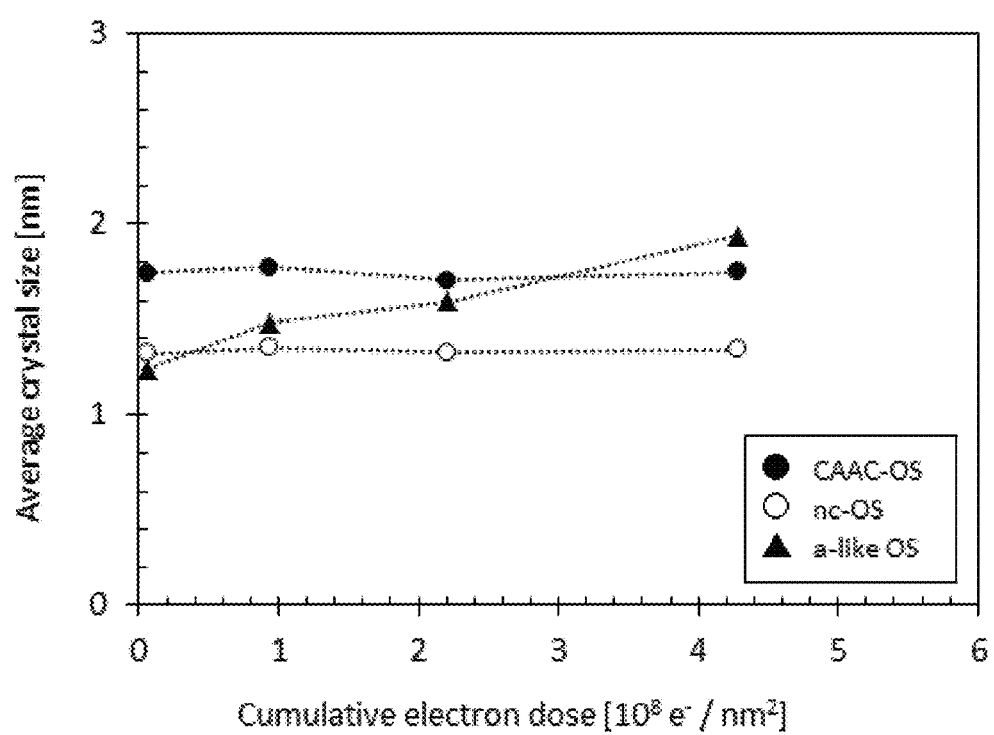
FIG. 52 shows a change of crystal parts of an In—Ga—Zn oxide due to electron irradiation.

FIG. 52 shows change in the average size of crystal parts (at 22 points to 30 points) in each sample. Note that the crystal part size corresponds to the length of a lattice fringe. FIG. 52 indicates that the crystal part size in the a-like OS increases with an increase in the cumulative electron dose in obtaining TEM images, for example. As shown in FIG. 52, a crystal part of approximately 1.2 nm (also referred to as an initial nucleus) at the start of TEM observation grows to a size of approximately 1.9 nm at a cumulative electron (e$^-$) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. As shown in FIG. 52, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e$^-$/(nm$^2$·s); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Next, the carrier density of an oxide semiconductor will be described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified oxide semiconductor is lower than $8 \times 10^{15}$ cm$^{-3}$, preferably lower than $1 \times 10^{11}$ cm$^{-3}$, and further preferably lower than $1 \times 10^{10}$ cm$^{-3}$ and is higher than or equal to $1 \times 10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

The structures described in this embodiment can be used in appropriate combination with any of the structures described in the other embodiments.

Embodiment 10

<CAC Composition>

Described below is the composition of a cloud aligned complementary oxide semiconductor (CAC-OS) applicable to one embodiment of the present invention.

The CAC refers to, for example, a composition of a material in which elements included in an oxide semiconductor are unevenly distributed. The material including unevenly distributed elements has a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

For example, of an In—Ga—Zn oxide (hereinafter also referred to as IGZO), CAC-IGZO has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0), gallium zinc oxide (Ga$_{X4}$Zn$_{Y4}$O$_{Z4}$, where X4, Y4, and Z4 are real numbers greater than 0), or the like, and a mosaic pattern is formed. Then, InO$_{X1}$ and In$_{X2}$Zn$_{Y2}$O$_{Z2}$ forming the mosaic pattern are evenly distributed in the film. This composition is also referred to as a cloud-like composition.

That is, the CAC-IGZO is a composite oxide semiconductor with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ ($-1\leq x0\leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC relates to the material composition. In a CAC material including In, Ga, Zn, and O, regions where nanoparticles including Ga as a main component are partly observed and regions where nanoparticles including In as a main component are partly observed are randomly dispersed to form a mosaic pattern. Therefore, the crystal structure is a secondary element for the CAC composition.

Note that in the CAC composition, a stacked-layer structure including two or more films with different atomic ratios is not included. For example, a two-layer structure of a film including In as a main component and a film including Ga as a main component is not included.

A boundary between the region including GaO$_{X3}$ as a main component and the region including In$_{X2}$Zn$_{Y2}$O$_{Z2}$ or InO$_{X1}$ as a main component is not clearly observed in some cases.

<Analysis of CAC-IGZO>

Next, measurement results of an oxide semiconductor over a substrate by a variety of methods are described.

<<Structure of Samples and Formation Method Thereof>>

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

<<Analysis by X-Ray Diffraction>>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 58:
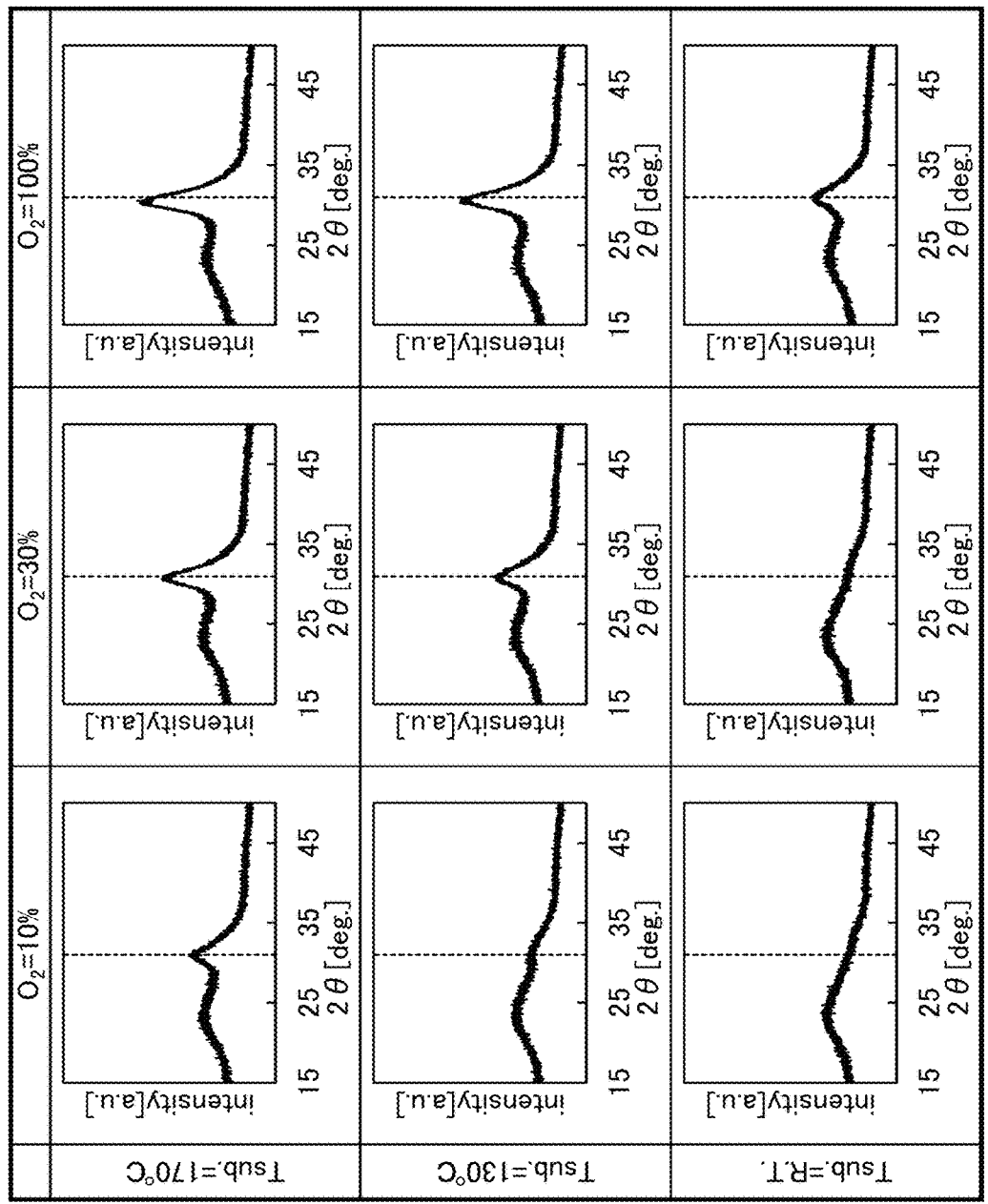
FIG. 58 shows measured XRD spectra of samples.

FIG. 58 shows XRD spectra measured by an out-of-plane method. In FIG. 58, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 58, the higher the substrate temperature at the time of formation is or the higher the oxygen gas flow rate ratio at the time of formation is, the higher the intensity of the peak at around $2\theta=31°$ is. Note that it is found that the peak at around $2\theta=31°$ is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 58, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<<Analysis with Electron Microscope>>

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 59A is a plan-view TEM image of the sample formed at a substrate temperature of R.T. and with an oxygen gas flow rate ratio of 10%. FIG. 59B is a cross-sectional TEM image of the sample formed at a substrate temperature of R.T. and with an oxygen gas flow rate ratio of 10%.

<<Analysis of Electron Diffraction Patterns>>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 59A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 59C, 59D, 59E, 59F, and 59G show the results of the points indicated by the black dots a1, a2, a3, a4, and a5, respectively.

In FIGS. 59C, 59D, 59E, 59F, and 59G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 59B of the sample formed at a substrate temperature of R.T. and an oxygen gas flow rate ratio of 10% are observed. FIGS. 59H, 59I, 59J, 59K, and 59L show the results of the points indicated by the black dots b1, b2, b3, b4, and b5, respectively.

In FIGS. 59H, 59I, 59J, 59K, and 59L, regions with high luminance in a ring pattern can be shown. Furthermore, a plurality of spots can be shown in a ring-like shape.

For example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 60A:
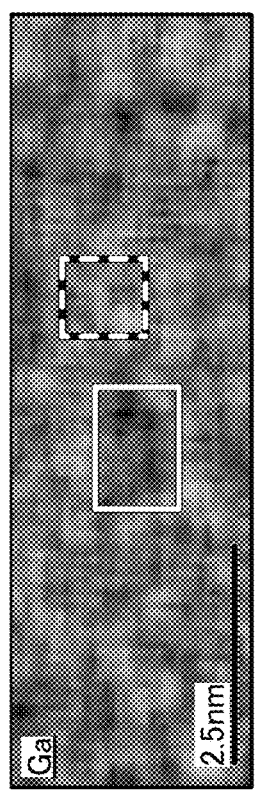
FIGS. 60A to 60C show EDX mapping images of a sample.
Figure 60B:
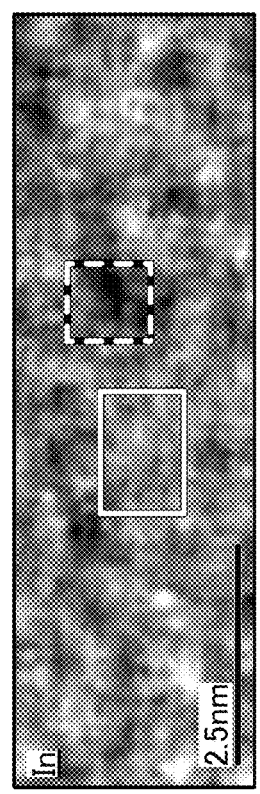
Figure 60C:
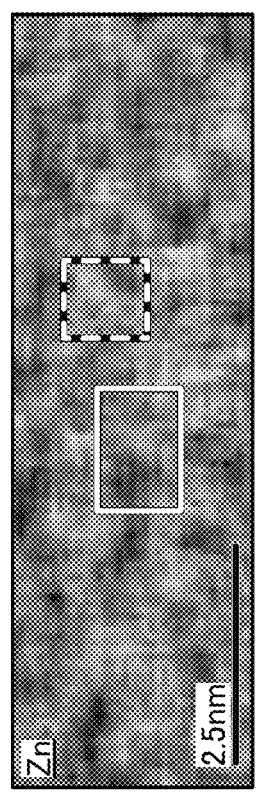

FIGS. 60A to 60C show EDX mapping images in a cross section of the sample formed at a substrate temperature of R.T. and with an oxygen gas flow rate ratio of 10%. FIG. 60A shows an EDX mapping image of Ga atoms. The proportion of the Ga atoms in all the atoms is 1.18 atomic % to 18.64 atomic %. FIG. 60B shows an EDX mapping image of In atoms. The proportion of the In atoms in all the atoms is 9.28 atomic % to 33.74 atomic %. FIG. 60C shows an EDX mapping image of Zn atoms. The proportion of the Zn atoms in all the atoms is 6.69 atomic % to 24.99 atomic %. FIGS. 60A to 60C show the same region in the cross section of the sample formed at a substrate temperature of R.T. and with an oxygen flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 60A to 60C is 7200000 times.

The EDX mapping images in FIGS. 60A to 60C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 60A to 60C are examined.

In FIG. 60A, a relatively dark region occupies a large area in the area surrounded by the solid line, while a relatively bight region occupies a large area in the area surrounded by the dashed line. In FIG. 60B, a relatively bight region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 60C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, and the like as main components.

The area surrounded by the solid line is a region including a relatively small number of Ga atoms and the area surrounded by the dashed line is a region including a relatively large number of Ga atoms. In FIG. 60C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, and the like as main components.

Furthermore, as shown in FIGS. 60A to 60C, the In atoms are relatively more uniformly distributed than the Ga atoms, and regions including $InO_{X1}$ as a main component is seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ as a main component and the regions including $In_{X2}Zn_{Y2}O_{Z2}$ or $InO_{X1}$ as a main component are unevenly distributed and mixed can be referred to as CAC-IGZO.

The crystal structure of CAC-IGZO includes an nc structure. In an electron diffraction pattern of the CAC-IGZO with the nc structure, several or more bright spots appear in addition to bright sports derived from IGZO including a single crystal, a polycrystal, or a CAAC. Alternatively, in addition to the several or more bright spots, the crystal structure is defined as having high luminance regions appearing in a ring pattern.

As shown in FIGS. 60A to 60C, each of the regions including $GaO_{X3}$ as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, CAC-IGZO has a structure different from that of an IGZO compound in which metal elements are evenly distributed, and has characteristics different from those of the IGZO compound. That is, in CAC-IGZO, regions including $GaO_{X3}$ or the like as a main component and regions including $In_{X2}Zn_{Y2}O_{Z2}$ or $InO_{X1}$ as a main component are separated to form a mosaic pattern. Accordingly, when CAC-IGZO is used for a semiconductor element, the property derived from $GaO_{X3}$ or the like and the property derived from $In_{X2}Zn_{Y2}O_{Z2}$ or $InO_{X1}$ complement each other, whereby high on-state current (Ion) and high field-effect mobility ($\mu$) can be achieved.

A semiconductor element including CAC-IGZO has high reliability. Thus, CAC-IGZO is suitably used in a variety of semiconductor devices typified by a display.

At least part of this embodiment can be implemented in combination with any of the other embodiments and the other examples described in this specification as appropriate.

Embodiment 11

In this embodiment, examples of a package and a module each including an image sensor chip will be described. The image sensor chip can employ the configuration of the imaging device of one embodiment of the present invention.

Figure 53A:
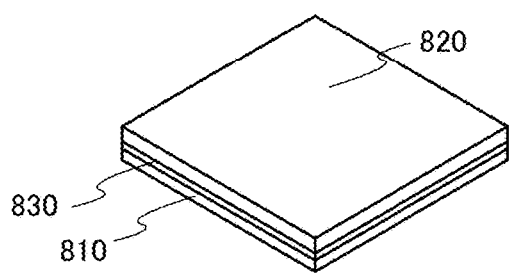
FIGS. 53A to 53D are perspective views and a cross-sectional view illustrating a package including an imaging device.

FIG. 53A is an external perspective view showing the top surface side of a package including an image sensor chip. The package includes a package substrate 810 to which an image sensor chip 850 is fixed, a cover glass 820, an adhesive 830 for bonding the package substrate 810 and the cover glass 820 to each other, and the like.

Figure 53B:
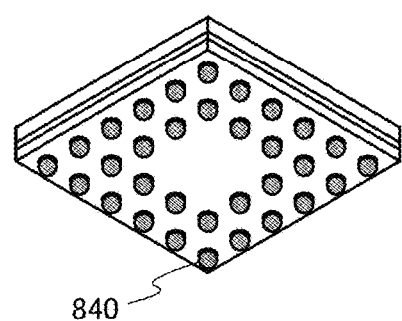

FIG. 53B is an external perspective view showing the bottom surface side of the package. The package has a ball grid array (BGA) structure including solder balls as bumps 840 on the bottom surface. Instead of the BGA, a land grid array (LGA), a pin grid array (PGA), or the like may be employed.

Figure 53C:
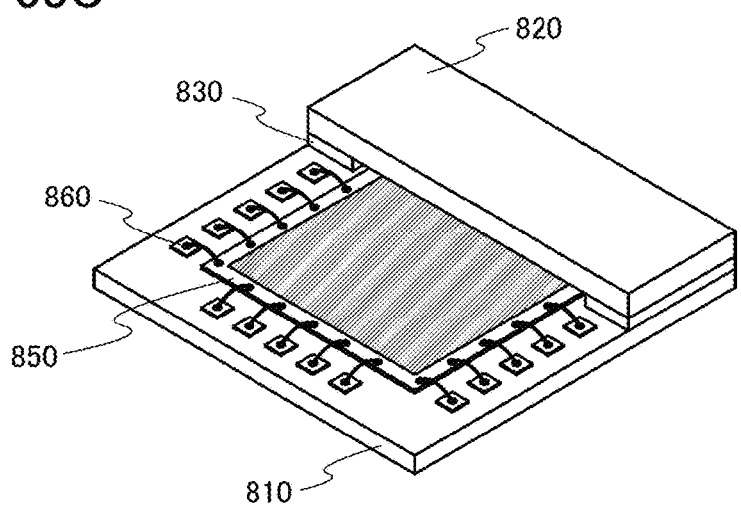
Figure 53D:
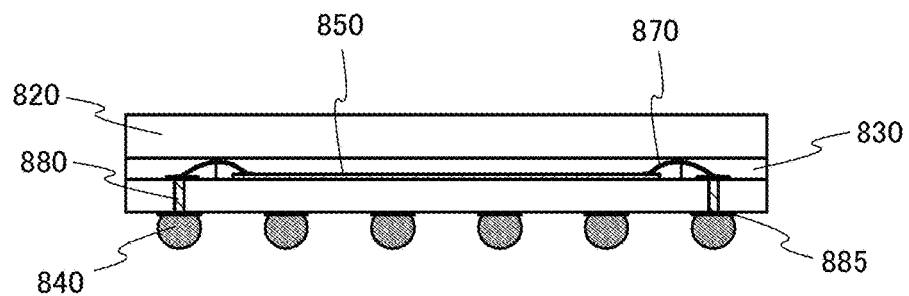

FIG. 53C is a perspective view of the package in which the cover glass 820 and the adhesive 830 are partly illustrated. FIG. 53D is a cross sectional view of the package. Electrode pads 860 are formed over the package substrate 810, and the electrode pads 860 and the bumps 840 are electrically connected via through holes 880 and lands 885. The electrode pads 860 are electrically connected to electrodes of the image sensor chip 850 through wires 870.

Figure 54A:
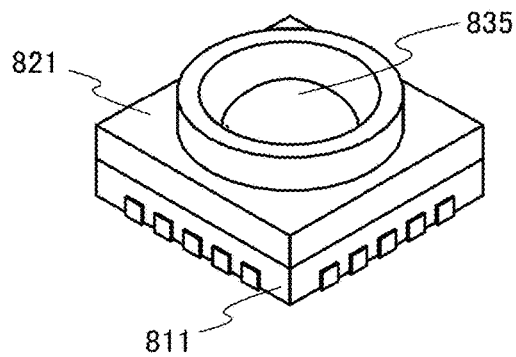
FIGS. 54A to 54D are perspective views and a cross-sectional view illustrating a package including an imaging device.

FIG. 54A is an external perspective view showing the top surface side of a camera module in which an image sensor chip and a lens integrated with each other in a package. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851. Thus, a system in package (SiP) is formed.

Figure 54B:
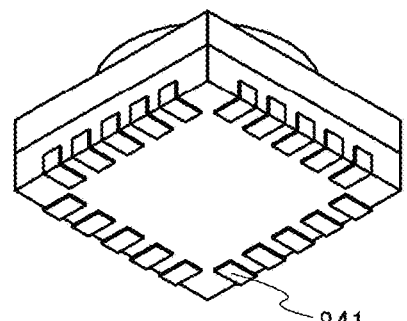

FIG. 54B is an external perspective view showing the bottom surface side of the camera module. Here, a quad flat no-lead package (QFN) is employed in which mounting lands 841 are provided on the bottom surface and four side surfaces of the package substrate 811. This structure is only an example; a quad flat package (QFP), the above-described BGA, or the like may be alternatively employed.

Figure 54C:
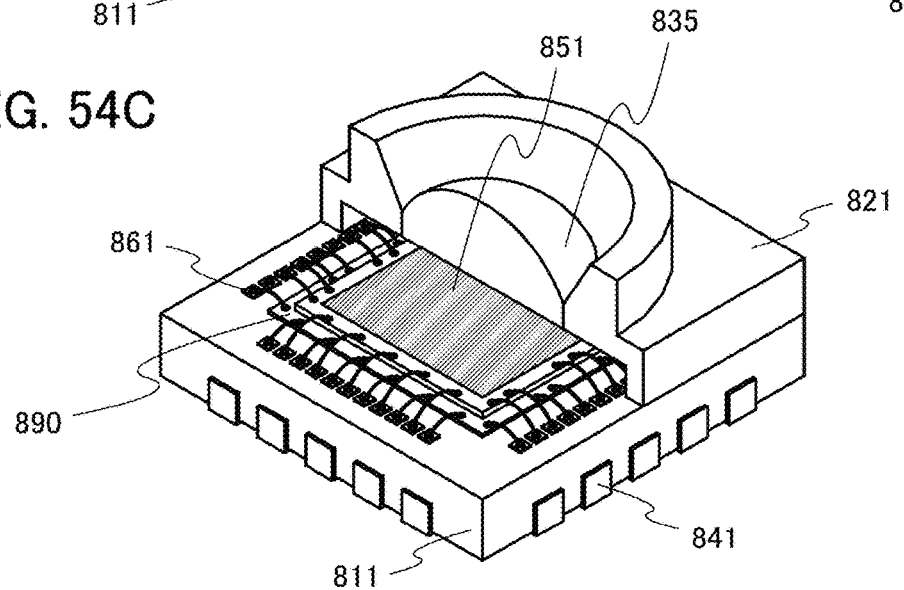
Figure 54D:
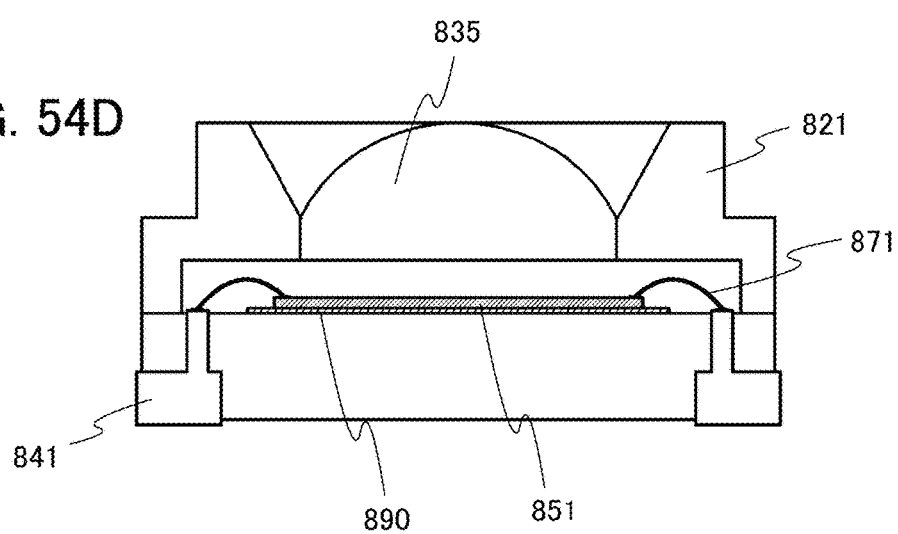

FIG. 54C is a perspective view of the module in which the lens cover 821 and the lens 835 are partly illustrated. FIG. 54D is a cross-sectional view of the camera module. Some of the lands 841 are used as the electrode pads 861. The electrode pads 861 are electrically connected to electrodes of the image sensor chip 851 and the IC chip 890 through wires 871.

The image sensor chip can be easily mounted on the package having the above structure, and can be incorporated into a variety of semiconductor devices and electronic devices.

The structures described in this embodiment can be used in appropriate combination with any of the structures described in the other embodiments.

Embodiment 12

In this embodiment, the imaging device 10 which has been described in Embodiment 1 is used as a monitor device.

Figure 55:
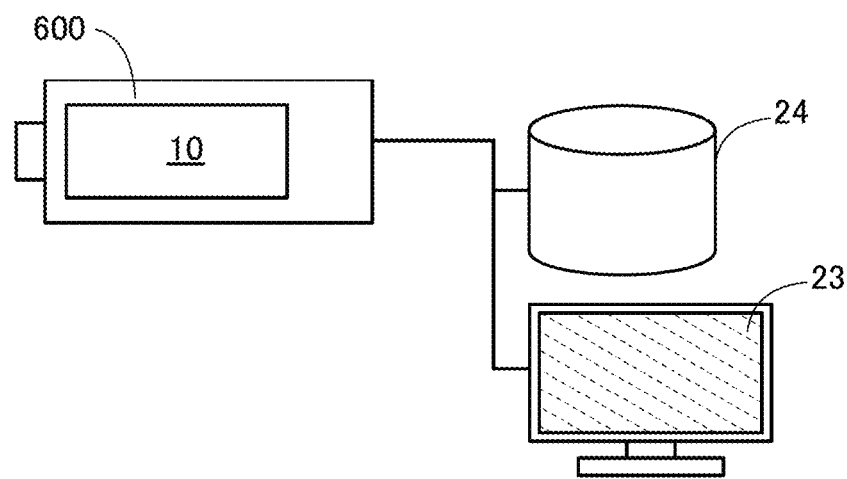
FIG. 55 illustrates the structure of a monitor device.

FIG. 55 is a block diagram illustrating the structure example of the monitor device of this embodiment. The monitor device includes a camera 600, a memory device 24, and a display device 23. The camera 600 includes the imaging device 10 of one embodiment of the present invention. The camera 600, the memory device 24, and the display device 23 are functionally connected to one another. An image taken by the camera 600 is stored in the memory device 24 and displayed on the display device 23.

The camera 600 outputs the imaging data captured by the imaging device 10 to the memory device 24 and the display device 23 only when a difference is detected between the reference frame and the difference detection frame. Thus, the frequency of outputting imaging data to the memory device 24 and the display device 23 can be smaller than that when no difference detection is performed, which leads to a reduction in power consumption of the memory device 24 and the display device 23. In addition, the storage capacitance of the memory device 24 can be saved. Time for taking images can be longer, and not only that, searching required data from stored data becomes easier.

A processing that consumes enormous amounts of power in the imaging device 10, such as A/D conversion, is performed only when imaging data which is output to the memory device 24 and the display device 23 is obtained. This makes power consumption lower than that when difference detection is not performed or when difference detection is performed using data after A/D conversion.

Figure 56:
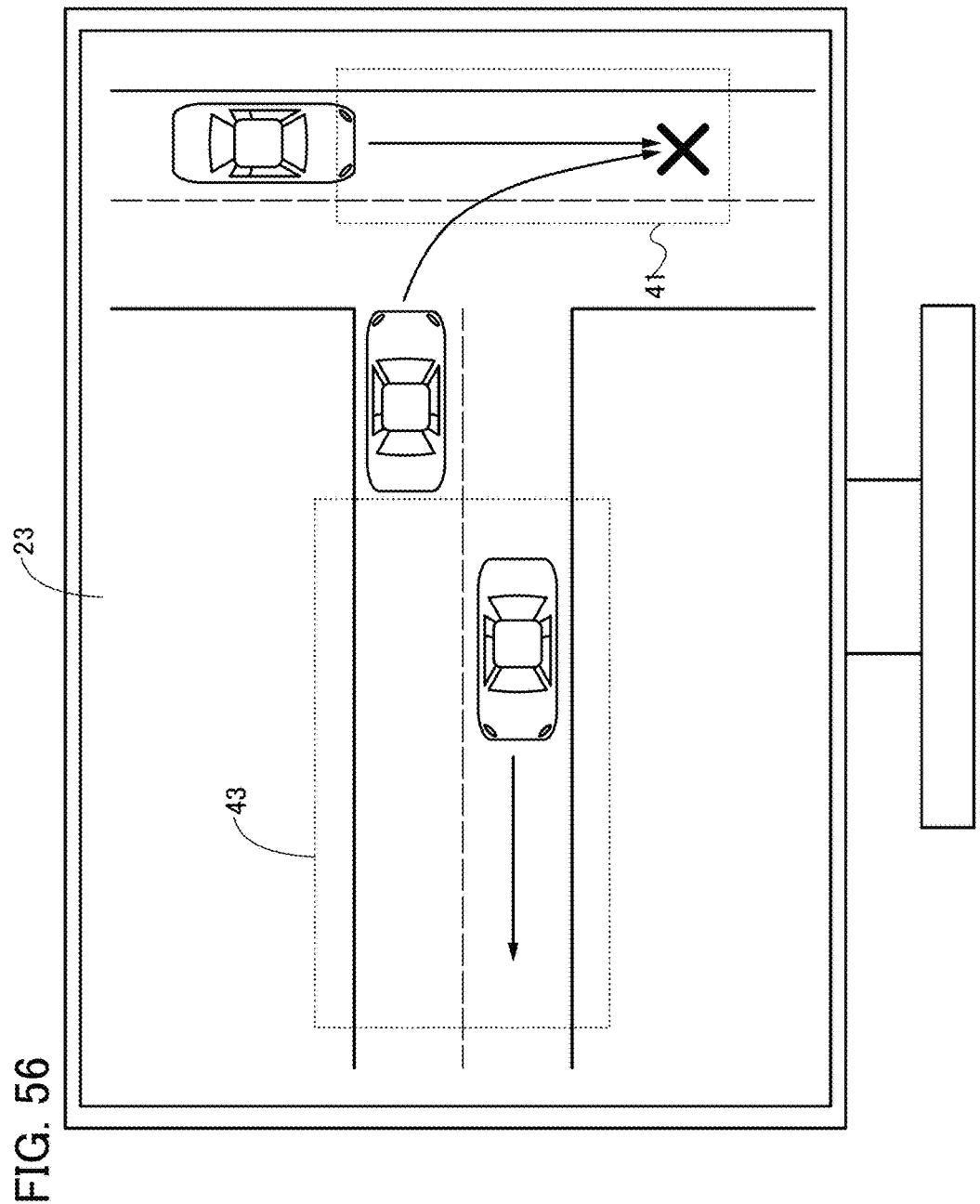
FIG. 56 illustrates the usage of a monitor device.

The monitor device in this embodiment can output imaging data to the memory device 24 and the display device 23 only when detecting the possibility of a traffic accident. FIG. 56 shows an image displayed on the display device 23 when taken from above by the camera 600 mounted at a T-junction. The accident frequency of right-turning cars is higher than that of straight-going cars at the T-junction. The T-junction and its neighborhood where the accident rate is high is regarded as the region 41, which is described in Embodiment 1, where new imaging data is obtained and output to the external devices when a difference is detected between the reference frame and the difference detection frame. When a car passes the T-junction and its neighborhood, the imaging data can be output to the memory device 24 and the display device 23. However, when a car passes a straight lane where the accident rate is low, such as the region 43, the imaging data is not output to the memory device 24 and the display device 23. That is, only when a car passes a region where the accident rate is high, the imaging data is stored in the memory device 24 and an image displayed on the display device 23 can be updated. This leads to a reduction in power consumption and storage capacitance of the memory device 24. In addition, if an accident occurs in the region 41, an image taken when the accident occurs can be found easily.

Note that when updating of the reference frame is not performed, imaging data is output to the memory device 24 and the display device 23 even when no car passes through the region 41. This is because a change in brightness over time is detected as a difference, for example. When the reference frame is taken at midnight, for example, when the brightness is increased when morning comes, it is decided that a difference is detected in each frame regardless whether a car passes through the region 41. When the traffic in the middle of the night is small, for example, the reference frame is not updated until morning comes and the brightness is increased, in some cases. Thus, the reference frame is updated periodically, and imaging data can be output to the memory device 24 and the display device 23 only when a car passes through the region 41. This leads to a reduction in power consumption and storage capacitance of the memory device 24. In addition, if an accident occurs in the region 41, an image taken when the accident occurs can be found easily.

Note that the monitor device in this embodiment can be applied to a variety of uses, such as a security camera for capturing an image of an illegal intruder.

The structure described in this embodiment can be used in appropriate combination with the structure described in any of the other embodiments.

Embodiment 13

This embodiment will show examples of electronic devices to which an imaging device of one embodiment of the present invention can be applied.

Examples of electronic devices to which the imaging device of one embodiment of the present invention can be applied are display devices such as televisions and monitors, lighting devices, desktop personal computers and laptop personal computers, word processors, image reproduction devices that reproduce still images and moving images stored in recording media such as digital versatile discs (DVD), portable CD players, radios, tape recorders, headphone stereos, stereos, navigation systems, table clocks, wall clocks, cordless phone handsets, transceivers, mobile phones, car phones, portable game consoles, tablet terminals, large game machines such as pinball machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electric power tools such as chain saws, smoke detectors, medical equipment such as dialyzers, facsimiles, printers, multifunction printers, automated teller machines (ATM), and vending machines. Furthermore, industrial equipment such as guide lights, traffic lights, belt conveyors, elevators, escalators, industrial robots, power storage systems, and power storage devices for leveling the amount of power supply and smart grid can be given. In addition, moving objects driven by an electric motor using electric power from a power storage device are also included in the category of electronic devices. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 57A:
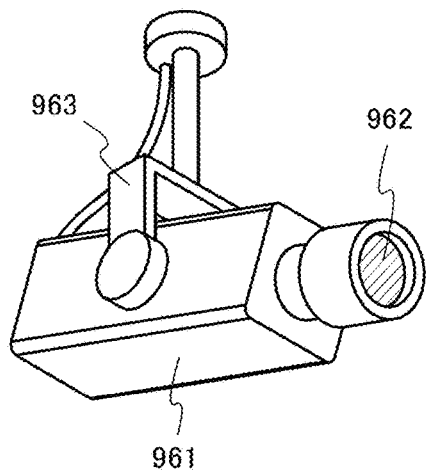
FIGS. 57A to 57F each illustrate an electronic device.

FIG. 57A illustrates a monitoring camera, which includes a housing 961, a lens 962, a support portion 963, and the like. The imaging device of one embodiment of the present invention can be provided in a focus position of the lens 962. The monitoring device described in Embodiment 12 can be used.

Figure 57B:
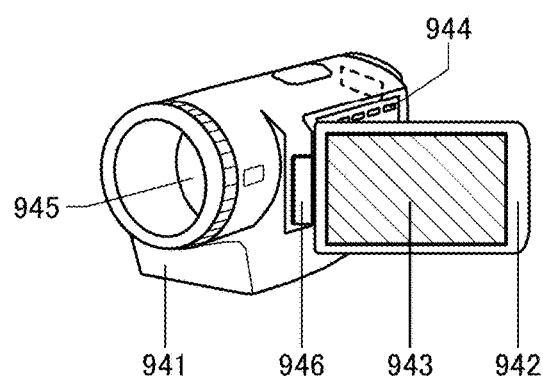

FIG. 57B illustrates a video camera, which includes a housing 941, a housing 942, a display portion 943, operation keys 944, a lens 945, a joint 946, and the like. The operation keys 944 and the lens 945 are provided in the housing 941, and the display portion 943 is provided in the housing 942. The housing 941 and the housing 942 are connected to each other with the joint 946, and the angle between the housing 941 and the housing 942 can be changed with the joint 946. Images displayed on the display portion 943 may be switched in accordance with the angle at the joint 946 between the housing 941 and the housing 942. The imaging device of one embodiment of the present invention can be provided in a focus position of the lens 945.

Figure 57C:
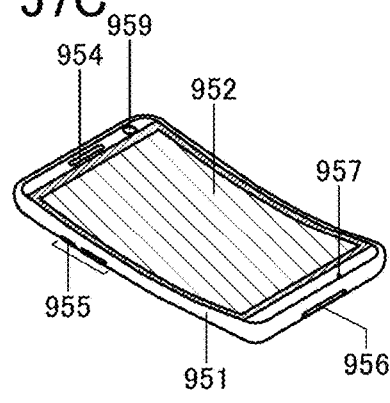

FIG. 57C illustrates a cellular phone, which includes a display portion 952, a microphone 957, a speaker 954, a camera 959, an input/output terminal 956, an operation button 955, and the like in a housing 951. The imaging device of one embodiment of the present invention can be used for the camera 959.

Figure 57D:
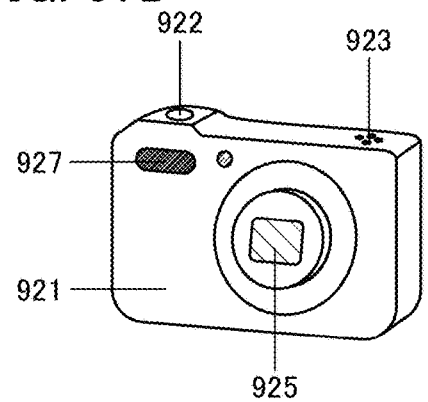

FIG. 57D illustrates a digital camera, which includes a housing 921, a shutter button 922, a microphone 923, a light-emitting portion 927, a lens 925, and the like. The imaging device of one embodiment of the present invention can be provided in a focus position of the lens 925.

Figure 57E:
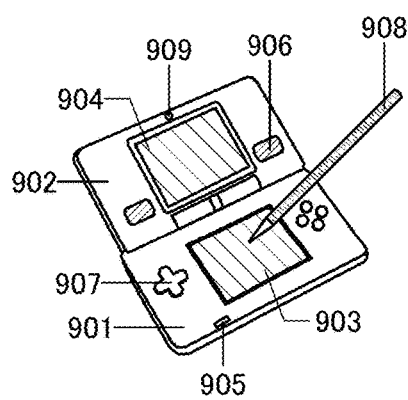

FIG. 57E illustrates a portable game console which includes a housing 901, a housing 902, a display portion 903, a display portion 904, a microphone 905, a speaker 906, an operation key 907, a stylus 908, a camera 909, and the like. Although the portable game machine in FIG. 57A has the two display portions 903 and 904, the number of display portions included in a portable game machine is not limited to this. The imaging device of one embodiment of the present invention can be used for the camera 909.

Figure 57F:
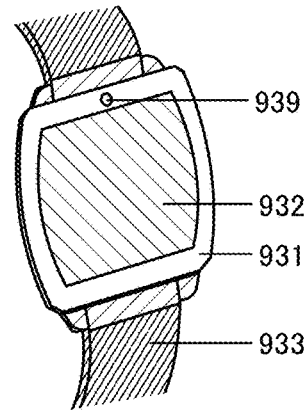

FIG. 57F illustrates a wrist-watch-type information terminal which includes a housing 931, a display portion 932, a wristband 933, a camera 939, and the like. The display portion 932 may be a touch panel. The imaging device of one embodiment of the present invention can be used for the camera 939.

Needless to say, the examples are not limited to the above-described electronic devices as long as the imaging device of one embodiment of the present invention is included.

This embodiment can be combined with any of the other embodiments in this specification as appropriate.

This application is based on Japanese Patent Application serial No. 2015-115604 filed with Japan Patent Office on Jun. 8, 2015 and Japanese Patent Application serial No. 2016-101666 filed with Japan Patent Office on May 20, 2016, the entire contents of which are hereby incorporated by reference.

What is claimed is:

1. An imaging device comprising:
a pixel array comprising pixels arranged in matrix;
a first circuit configured to select a row of the pixel array;
a second circuit configured to select a column of the pixel array;
a third circuit configured to perform difference calculation between an imaging data of a first frame and an imaging data of a second frame in the pixels selected by the first circuit and the second circuit;
a fourth circuit configured to output a row address of the pixels subjected to the difference calculation;
a fifth circuit configured to output a column address of the pixels subjected to the difference calculation;
a sixth circuit configured to store a row address and a column address to determine a region in the pixel array; and
a seventh circuit configured to compare first coordinates included in the region determined by the row address and the column address stored in the sixth circuit with second coordinates of the pixels determined by the row address from the fourth circuit and the column address from the fifth circuit.

2. The imaging device according to claim 1, wherein the imaging device is configured to obtain an imaging data of a third frame and output the imaging data to an external device, when the second coordinates are included in the region determined by the row address and the column address which are stored in the sixth circuit.

3. The imaging device according to claim 2,
wherein the sixth circuit is configured to store two row addresses and two column addresses of the pixel array for determining four coordinates, and
wherein the imaging data of the third frame is obtained and is output to the external device, when the second coordinates are included within the four coordinates stored in the sixth circuit.

4. The imaging device according to claim 1,
wherein the pixels each comprise a transistor and a photoelectric conversion element,
wherein the transistor comprises an active layer comprising an oxide semiconductor,
wherein the oxide semiconductor comprises In, Zn, and M, and wherein M is any one of Al, Ti, Ga, Sn, Y, Zr, La, Ce, Nd, and Hf.

5. The imaging device according to claim 4, wherein the photoelectric conversion element comprises a photoelectric conversion layer comprising selenium or a compound comprising selenium.

6. An electronic device comprising:
the imaging device according to claim 1; and
a display device operationally connected to the imaging device.

7. An operation method of an imaging device, comprising the steps of:
a first step for obtaining an imaging data of a first frame;
a second step for outputting the imaging data of the first frame to an external device;
a third step for determining whether to return to the first step, wherein, if it is determined not to return to the first step, an imaging data of a second frame is obtained and then the operation method goes to a fourth step;
the fourth step for obtaining an imaging data of a third frame and for performing difference calculation between the imaging data of the second frame and the imaging data of the third frame in each pixel, thereby obtaining a row address and a column address of each pixel subjected to the difference calculation;
a fifth step for determining whether to output the imaging data to the external device;
a sixth step for obtaining an imaging data of a fourth frame; and
a seventh step for outputting the imaging data of the fourth frame to the external device;
wherein in the fourth step, if no difference is detected, the fourth step is performed again, whereas if a difference is detected, the operation method goes to the fifth step,
wherein in the fifth step, if it is determined to output the imaging data to the external device, the operation method goes to the sixth step, and
wherein after the seventh step, the operation returns to the fourth step.

8. The operation method of an imaging device, according to claim 7, wherein if no difference is detected in the difference calculation in the fourth step and/or if it is determined not to output the imaging data to the external device in the fifth step, the imaging data of the second frame is obtained and the operation returns to the fourth step.

9. The operation method of an imaging device, according to claim 7,
wherein a region of a pixel array where a plurality of pixels are arranged is determined, and
wherein if coordinates consisting of a row address and a column address of each pixel where a difference is detected are included in the region of the pixel array, the imaging data of the fourth frame is obtained in the sixth step and is output to the external device in the seventh step.

10. The operation method of an imaging device, according to claim 9,
wherein two row addresses and two column addresses of the pixel array are selected to determine four coordinates, and
wherein the inside of a quadrangle formed by linking the four coordinates serves as the region of the pixel array.

11. The operation method of an imaging device according to claim 7, wherein the external device is a display device or a storage device.

* * * * *